(12) United States Patent
Kim et al.

(10) Patent No.: US 9,344,119 B2
(45) Date of Patent: May 17, 2016

(54) METHOD AND APPARATUS FOR TRANSMITTING AND RECEIVING R-PDCCH

(75) Inventors: Hakseong Kim, Anyang-si (KR); Hanbyul Seo, Anyang-si (KR); Kijun Kim, Anyang-si (KR)

(73) Assignee: LG Electronics Inc., Seoul (KR)

( * ) Notice: Subject to any disclaimer, the term of this patent is extended or adjusted under 35 U.S.C. 154(b) by 103 days.

(21) Appl. No.: 13/636,288

(22) PCT Filed: Jun. 17, 2011

(86) PCT No.: PCT/KR2011/004448
§ 371 (c)(1),
(2), (4) Date: Sep. 20, 2012

(87) PCT Pub. No.: WO2011/159132
PCT Pub. Date: Dec. 22, 2011

(65) Prior Publication Data
US 2013/0010685 A1    Jan. 10, 2013

(30) Foreign Application Priority Data

Jun. 16, 2011  (KR) .................. 10-2011-0058458

(51) Int. Cl.
*H04B 7/14* (2006.01)
*H03M 13/37* (2006.01)
*H03M 13/27* (2006.01)
(Continued)

(52) U.S. Cl.
CPC ........ *H03M 13/3723* (2013.01); *H03M 13/271* (2013.01); *H03M 13/6508* (2013.01); *H03M 13/6525* (2013.01); *H04L 1/0046* (2013.01); *H04L 1/0071* (2013.01); *H04L 5/0007* (2013.01); *H04L 5/0053* (2013.01); *H04J 11/0073* (2013.01); *H04W 72/04* (2013.01); *H04W 84/047* (2013.01)

(58) Field of Classification Search
None
See application file for complete search history.

(56) References Cited

U.S. PATENT DOCUMENTS

2007/0298758 A1* 12/2007 Verma .................. G08B 27/006
455/404.1
2008/0034114 A1*  2/2008 Ducey ................... H04H 20/24
709/238

(Continued)

FOREIGN PATENT DOCUMENTS

CN    101155194 A    4/2008
WO    2008115004 A2    9/2008

OTHER PUBLICATIONS

Panasonic, "R-PDCCH placement", 3GPP TSG RAN WG1 Meeting #59bis, Valencia, Spain, Jan. 18-22, 2010, R1-100382.

(Continued)

*Primary Examiner* — Dang Ton
*Assistant Examiner* — Ronald H Davis
(74) *Attorney, Agent, or Firm* — Dentons US LLP

(57) ABSTRACT

A method and apparatus for transmitting and receiving a Relay Physical Downlink Control Channel (R-PDCCH) being a control channel for a relay node (RN) in a wireless communication system are disclosed. To transmit an R-PDCCH to a RN, a BS includes a processor for interleaving a predetermined number of Control Channel Elements (CCEs), mapping the interleaved CCEs to at least one Virtual Resource Block (VRB) configured for R-PDCCH transmission, mapping the at least one VRB to at least one Physical Resource Block (PRB), and a transmitter for transmitting the R-PDCCH to the RN through the at least one PRB.

14 Claims, 44 Drawing Sheets

(51) Int. Cl.
*H03M 13/00* (2006.01)
*H04L 1/00* (2006.01)
*H04L 5/00* (2006.01)
*H04J 11/00* (2006.01)
*H04W 72/04* (2009.01)
*H04W 84/04* (2009.01)

(56) References Cited

U.S. PATENT DOCUMENTS

| | | | |
|---|---|---|---|
| 2009/0047923 A1* | 2/2009 | Jain | G06F 19/323 455/404.1 |
| 2009/0290538 A1* | 11/2009 | Kim et al. | 370/328 |
| 2010/0254301 A1* | 10/2010 | Blankenship et al. | 370/315 |
| 2010/0309867 A1* | 12/2010 | Palanki et al. | 370/329 |
| 2011/0080896 A1* | 4/2011 | Krishnamurthy et al. | 370/336 |
| 2011/0182227 A1* | 7/2011 | Rune | H04W 8/082 370/312 |
| 2011/0317653 A1* | 12/2011 | Kwon et al. | 370/329 |
| 2012/0015661 A1* | 1/2012 | Awad | 455/445 |
| 2012/0063384 A1* | 3/2012 | Bi et al. | 370/315 |
| 2012/0207124 A1* | 8/2012 | Liu et al. | 370/329 |
| 2012/0300616 A1* | 11/2012 | Zeng et al. | 370/216 |
| 2013/0265934 A1* | 10/2013 | Zeng et al. | 370/315 |

OTHER PUBLICATIONS

Zte et al., "WF on R-PDCCH Interleaving with CRS", 3GPP TSG RAN WG1 Meeting #61, Montreal, Canada, May 10-14, 2010, R1-103426.

Nokia et al. "On the need of interleaving of R-PDCCH", 3GPP TSG RAN WG1 Meeting #59bis, Valencia, Spain, Jan. 18-22, 2010, R1-100344.

Samsung, "R-PDCCH multiplexing and search space", 3GPP TSG RAN WG1 Meeting #59bis, Valencia, Spain, Jan. 18-22, 2010, R1-100135.

* cited by examiner

FIG. 26

Case 1

RA for RN1=0

| No data for RN 1 | No data for RN 1 | No data for RN 1 | Protected SS for UL grant |
|---|---|---|---|
| No data for RN 1 | No data for RN 1 | No data for RN 1 | DL_grant for RN 1 or RN 2 |

RA for RN1=1

| Data for RN 1 | Data for RN 1 | Data for RN 1 | Protected SS for UL grant |
|---|---|---|---|
| Data for RN 1 | Data for RN 1 | Data for RN 1 | DL_grant for RN 1 or RN 2 |

Case 2

| No data for RN 1 | No data for RN 1 | No data for RN 1 | No data for RN 1 |
|---|---|---|---|
| No data for RN 1 | No data for RN 1 | No data for RN 1 | DL_grant for RN 1 or RN 2 |

| Data for RN 1 | Data for RN 1 | Data for RN 1 | Data for RN 1 |
|---|---|---|---|
| Data for RN 1 | Data for RN 1 | Data for RN 1 | DL_grant for RN 1 or RN 2 |

FIG. 29

| subset# | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | |
|---|---|---|---|---|---|---|---|---|---|---|---|---|---|---|---|---|---|---|---|---|---|---|---|---|---|---|---|---|---|---|
| 1st slot | 0 | 0 | 0 | 0 | 0 | 0 | 0 | 0 | 2 | 2 | 2 | 2 | 3 | 3 | 3 | 3 | 0 | 0 | 0 | 0 | 0 | 0 | 0 | 0 | 2 | 2 | 2 | 2 | 3 | PRB index |
| 1st slot | 0 | 4 | 8 | 12 | 16 | 20 | 24 | 28 | 32 | 36 | 40 | 44 | 48 | 52 | 56 | 60 | 64 | 68 | 72 | 76 | 80 | 84 | 86 | 92 | 1 | 5 | 9 | 13 | 17 | VRB index |
| 2nd slot | 2 | 6 | 10 | 14 | 18 | 22 | 26 | 30 | 34 | 38 | 42 | 46 | 50 | 54 | 58 | 62 | 66 | 70 | 74 | 78 | 82 | 86 | 90 | 94 | 3 | 7 | 11 | 15 | 19 | |

FIG. 30

| subset# | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | PRB index |
|---|---|---|---|---|---|---|---|---|---|---|---|---|---|---|---|---|---|---|---|---|---|---|---|---|---|---|---|---|---|---|---|---|
| | 0 | 0 | 0 | 0 | 0 | ▽ | ▽ | ▽ | 0 | 1 | 0 | 0 | 0 | ▫ | ▫ | ▽ | ▽ | ▽ | 0 | 0 | 0 | 0 | ▫ | ▫ | ▽ | ▽ | 0 | 0 | 0 | 0 | | |
| 1st slot | ✕ | 4 | 8 | 12 | 16 | 20 | 24 | 28 | 32 | ✕ | 5 | 9 | 13 | 17 | $2^k$-1 | $2^k$-1 | $2^k$ | 6 | 10 | 14 | 18 | 21 | 23 | 25 | 27 | ✕ | 3 | 7 | 11 | 15 | |
| 2nd slot | ✕ | 6 | 10 | 14 | 18 | 21 | 23 | 25 | 27 | ✕ | 3 | 7 | 11 | 15 | $2^k$-1 | $2^k$-1 | $2^k$ | 4 | 8 | 12 | 16 | 20 | 22 | 24 | 26 | ✕ | 5 | 9 | 13 | | VRB index |

METHOD AND APPARATUS FOR TRANSMITTING AND RECEIVING R-PDCCH

This application is a 35 U.S.C. §National Stage Entry of International Application No. PCT/KR2011/004448, filed Jun. 17, 2011 and claims the benefit of U.S. Provisional Application No. 61/356,024, filed Jun. 17, 2010, U.S. Provisional Application No. 61/363,621, filed Jul. 12, 2010 and Korean Application No. 10-2011-0058458, filed Jun. 16, 2011, all of which are incorporated by reference in their entirety herein.

TECHNICAL FIELD

The present invention relates to a wireless communication system, and more particularly, to a method and apparatus for transmitting and receiving a Relay-Physical Downlink Control Channel (R-PDCCH).

BACKGROUND ART

Wireless communication systems have been widely deployed to provide various types of communication services such as voice service or data service. In general, a wireless communication system is a multiple access system that supports communication with multiple users by sharing available system resources (e.g. a bandwidth, transmission power, etc.) among the multiple users. The multiple access system may adopt a multiple access scheme such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), or Multi Carrier Frequency Division Multiple Access (MC-FDMA).

DISCLOSURE

Technical Problem

An object of the present invention devised to solve the problem lies on a method for transmitting a Relay-Physical Downlink Control Channel (R-PDCCH).

Another object of the present invention devised to solve the problem lies on a method for receiving an R-PDCCH.

Another object of the present invention devised to solve the problem lies on an apparatus for transmitting an R-PDCCH.

A further object of the present invention devised to solve the problem lies on an apparatus for receiving an R-PDCCH.

It will be appreciated by persons skilled in the art that the objects that could be achieved with the present invention are not limited to what has been particularly described hereinabove and the above and other objects that the present invention could achieve will be more clearly understood from the following detailed description taken in conjunction with the accompanying drawings.

Technical Solution

The object of the present invention can be achieved by providing a method for transmitting an R-PDCCH being a control channel for a relay node (RN) in a wireless communication system, including interleaving a predetermined number of Control Channel Elements (CCEs), mapping the interleaved CCEs to at least one Virtual Resource Block (VRB) configured for R-PDCCH transmission, mapping the at least one VRB to at least one Physical Resource Block (PRB), and transmitting the R-PDCCH to the RN through the at least one PRB.

The interleaving may further include permutation and the permutation may be performed according to a column permutation pattern.

During the interleaving, the predetermined number of CCEs may be divided and interleaved.

The VRB may be mapped to the PRB in a frequency-first manner. The VRB may also be mapped to the PRB in a time-first manner. The size of the VRB may be equal to the size of a CCE.

The size of the VRB may be 8 Resource Element Groups (REGs). An index of the VRB may be mapped to a PRB index numbered at 1:1 according to a predetermined index order.

In another aspect of the present invention, provided herein is a Base Station (BS) for transmitting an R-PDCCH being a control channel for a relay node (RN) in a wireless communication system, including a processor for interleaving a predetermined number of CCEs, mapping the interleaved CCEs to at least one VRB configured for R-PDCCH transmission, mapping the at least one VRB to at least one PRB, and mapping the PRB to a pre-allocated R-PDCCH area, and a transmitter for transmitting the R-PDCCH to the RN through the at least one PRB.

The processor may further perform permutation according to a column permutation pattern during the interleaving. The processor may map the VRB to the PRB in a frequency-first manner. The processor may map the VRB to the PRB in a time-first manner. The processor may divide the predetermined number of CCEs and interleave the divided CCEs. The processor may map an index of the VRB to a PRB index at 1:1 according to a predetermined index order.

Advantageous Effects

In accordance with embodiments of the present invention, a Base Station (BS) can efficiently transmit an R-PDCCH to a Relay Node (RN) and the RN can significantly improve communication performance using the efficiently allocated R-PDCCH.

It will be appreciated by persons skilled in the art that that the effects that could be achieved with the present invention are not limited to what has been particularly described hereinabove and other advantages of the present invention will be more clearly understood from the following detailed description taken in conjunction with the accompanying drawings.

DESCRIPTION OF DRAWINGS

The accompanying drawings, which are included to provide a further understanding of the invention, illustrate embodiments of the invention and together with the description serve to explain the principle of the invention.

In the drawings:

FIG. 26 illustrates an example of R-PDCCH and R-PDSCH resource allocation;

FIGS. 29 to 32 illustrate an example of configuring R-PDCCH SSs according to RA types;

BEST MODE

The configuration, operation, and other features of the present invention will readily be understood with embodiments of the present invention described with reference to the attached drawings. Embodiments of the present invention are applicable to a variety of wireless access technologies such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), and Multi Carrier Frequency Division Multiple Access (MC-FDMA). CDMA can be implemented into a radio technology such as Universal Terrestrial Radio Access (UTRA) or CDMA2000. TDMA can be implemented into a radio technology such as Global System for Mobile communications (GSM)/General Packet Radio Service (GPRS)/Enhanced Data Rates for GSM Evolution (EDGE). OFDMA can be implemented into a radio technology such as Institute of Electrical and Electronics Engineers (IEEE) 802.11 (Wireless Fidelity (Wi-Fi)), IEEE 802.16 (Worldwide interoperability for Microwave Access (WiMAX)), IEEE 802.20, and Evolved UTRA (E-UTRA). UTRA is part of Universal Mobile Telecommunications System (UMTS). $3^{rd}$ Generation Partnership Project (3GPP) Long Term Evolution (LTE) is part of Evolved UMTS (E-UMTS) using E-UTRA. LTE-Advanced (LTE-A) is an evolution of 3GPP LTE.

While the following description is given of embodiments of the present invention with the appreciation that the technical features of the present invention are applied to a 3GPP system, this is purely exemplary and thus should not be construed as limiting the present invention.

Figure 1:
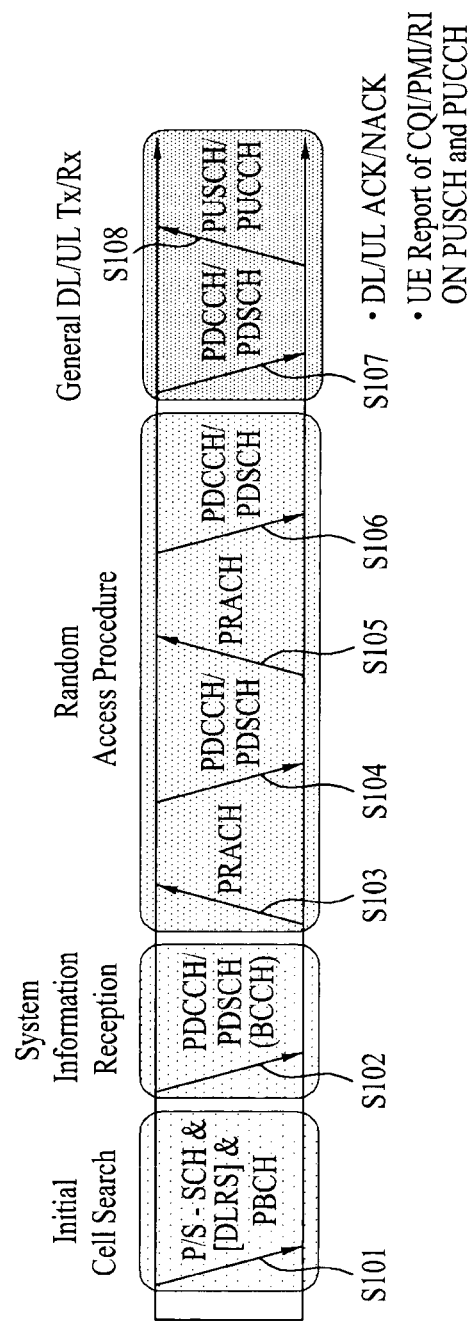
FIG. 1 illustrates physical channels and signal transmission on the physical channels in a 3$^{rd}$ Generation Partnership Project (3GPP) system.

FIG. 1 illustrates physical channels and signal transmission on the physical channels in a 3GPP LTE system.

Referring to FIG. 1, when a User Equipment (UE) is powered on or enters a new cell, the UE performs an initial cell search involving acquisition of synchronization with a Base Station (BS) (S101). For the initial cell search, the UE receives a Primary Synchronization CHannel (P-SCH) and a Secondary Synchronization CHannel (S-SCH), and acquires synchronization with the BS and information such as a cell Identity (ID) from the P-SCH and the S-SCH. Then the UE may receive a Physical Broadcast CHannel (PBCH) from the BS and acquire broadcast information within a cell from the PBCH.

Upon completion of the initial cell search, the UE may acquire more specific system information by receiving a Physical Downlink Control CHannel (PDCCH) and receiving a Physical Downlink Shared CHannel (PDSCH) according to information carried on the PDCCH (S102).

Meanwhile, if the UE initially accesses the BS or has no radio resources for signal transmission, the UE may perform a Random Access (RA) procedure (S103 to S106). For the RA procedure, the UE may transmit a predefined sequence as a preamble on a Physical Random Access CHannel (PRACH) (S103 and S105) and receive a response message to the preamble on a PDSCH (S104 and S106). If the RA procedure is contention-based, the UE may additionally perform a contention resolution procedure.

After the above RA procedure, the UE may receive a PDCCH/PDSCH (S107) and transmit a Physical Uplink Shared CHannel (PUSCH)/Physical Uplink Control CHannel (PUCCH) (S108) in a general uplink/downlink signal transmission procedure. Control information that the UE receives from the BS on a downlink or transmits to the BS on an uplink includes a downlink/uplink ACKnowledgment/Negative ACKnowledgment (ACK/NACK) signal, a Channel Quality Indicator (CQI), a Scheduling Request (SR), a Precoding Matrix Index (PMI), and a Rank Indicator (RI). In the 3GPP LTE system, the UE may transmit control information such as a CQI, a PMI and an RI on a PUSCH and/or a PUCCH.

Figure 2:
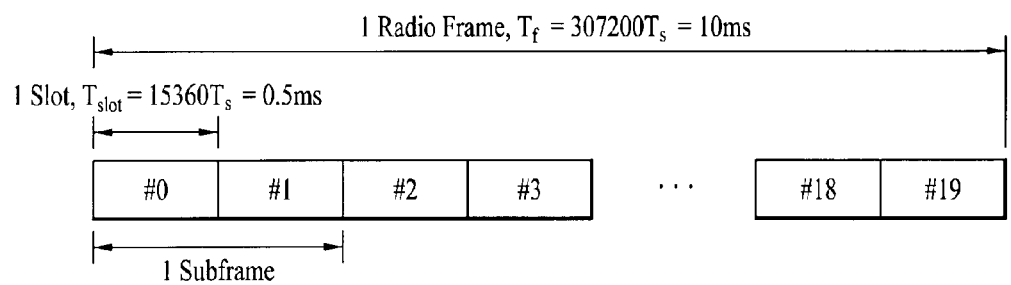
FIG. 2 illustrates a radio frame structure in the 3GPP system.

FIG. 2 illustrates a radio frame structure in the 3GPP system.

Referring to FIG. 2, a radio frame is 10 ms (307,200 $T_s$) in duration. The radio subframe is divided into 10 subframes, each subframe being 1 ms long. Each subframe is further divided into two slots, each of 0.5 ms (15,360 $T_s$) duration.

$T_s$ represents a sampling time and is given as $T_s=1/(15\text{ kHz}\times 2048)=3.2552\times 10^{-8}$ (about 33 ns). A slot is defined by a plurality of Orthogonal Frequency Division Multiplexing (OFDM) symbols in time by a plurality of Resource Blocks (RBs) in frequency. One RB has 12 subcarriers by 7 (6) OFDM symbols in the 3GPP LTE system. A unit time in which data is transmitted, known as Transmission Time Interval (TTI) may be defined as one or more subframes. This radio frame structure is purely exemplary and thus the number of subframes, the number of slots, or the number of OFDM symbols in a radio frame may vary.

Figure 3:
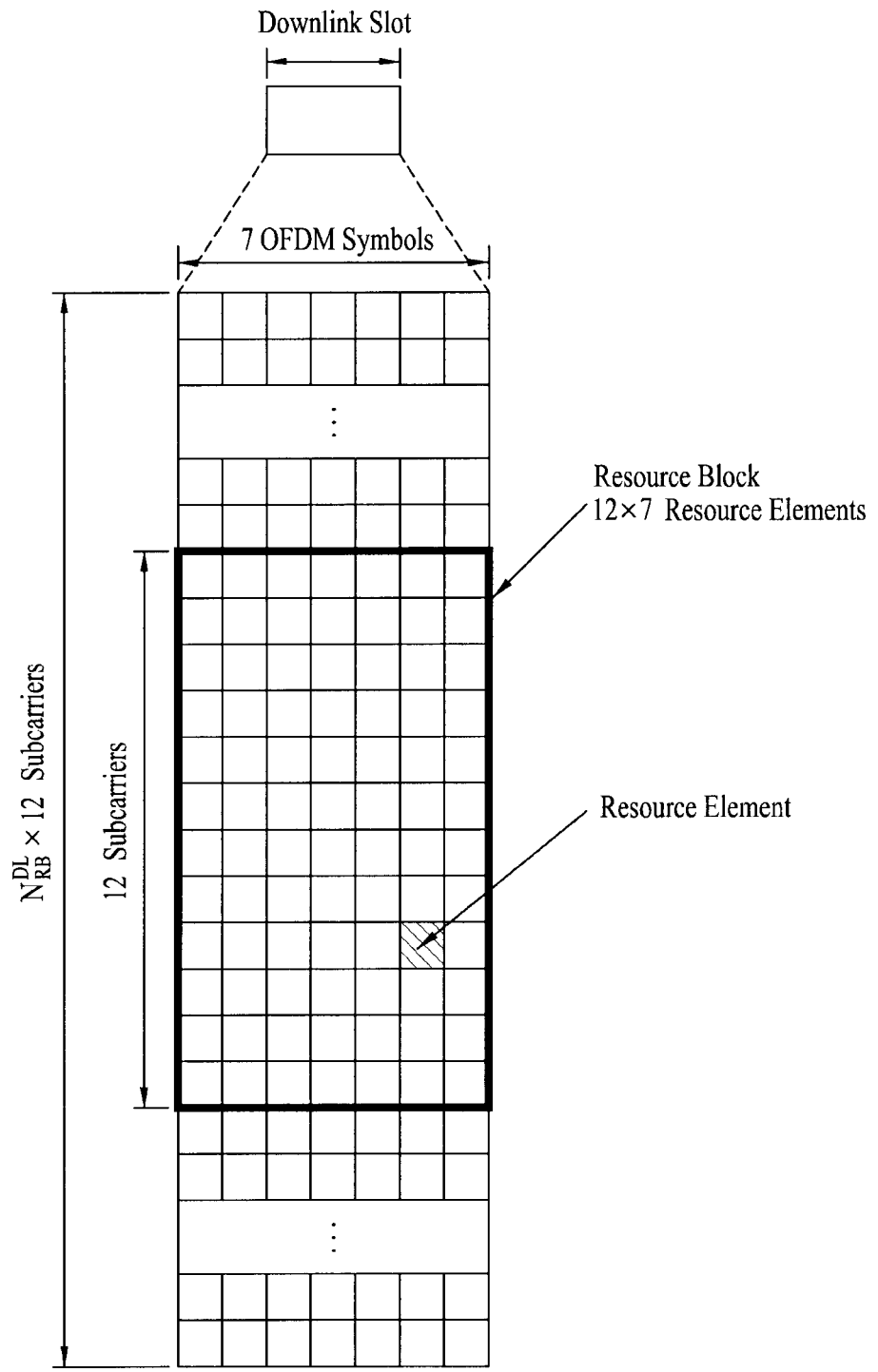
FIG. 3 illustrates the structure of a downlink resource grid for the duration of one downlink slot.

FIG. 3 illustrates the structure of a downlink resource grid for the duration of one downlink slot.

Referring to FIG. 3, a downlink slot includes 7 (or 6) OFDM symbols in time by $N^{DL}_{RB}$ RBs in frequency. Because each RB has 12 subcarriers, the downlink slot includes $N^{DL}_{RB}\times 12$ subcarriers in frequency. In the illustrated case of FIG. 3, the downlink slot has 7 OFDM symbols and each RB includes 12 subcarriers, which does not limit the scope and spirit of the present invention. For example, the number of OFDM symbols per downlink slot depends on the length of a Cyclic Prefix (CP). Each element in the resource grid is referred to as a Resource Element (RE). An RE is a minimum time/frequency resource defined for a physical channel, indicated by one OFDM symbol index and one subcarrier index. Each RB includes $N_{symb}^{DL}\times N_{sc}^{RB}$ REs where $N_{symb}^{DL}$ represents the number of OFDM symbols per downlink slot and $N_{sc}^{RB}$ represents the number of subcarriers per RB. The number of RBs per downlink slot, $N^{DL}_{RB}$ depends on a downlink transmission bandwidth set by a cell.

Figure 4:
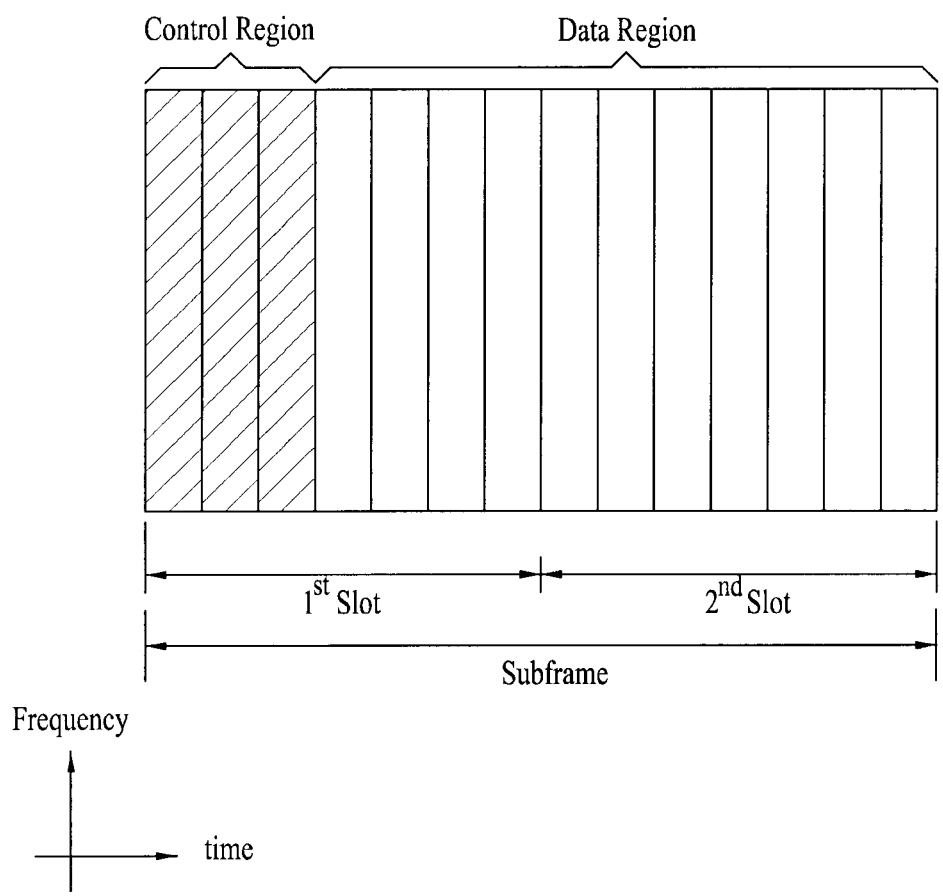
FIG. 4 illustrates a downlink subframe structure in the 3GPP system.

FIG. 4 illustrates a downlink subframe structure in the 3GPP system.

Referring to FIG. 4, a downlink subframe includes a plurality of (e.g. 12 or 14) OFDM symbols. A plurality of OFDM symbols at the start of the downlink subframe are used for a control region and the other OFDM symbols of the downlink subframe are used for a data region. The size of the control region may be determined independently for each subframe. The control region carries scheduling information and other Layer 1/Layer 2 (L1/L2) control information, whereas the data region carries data. Control channels include a Physical Control Format Indicator CHannel (PCFICH), a Physical Hybrid automatic repeat request (ARQ) Indicator CHannel (PHICH), and a Physical Downlink Control CHannel (PDCCH). Traffic channels include a Physical Downlink Shared CHannel (PDSCH).

The PDCCH delivers information related to resource allocation for transport channels, a Paging CHannel (PCH) and a Downlink Shared CHannel (DL-SCH), an uplink scheduling grant, and HARQ information to each UE or each UE group. The PCH and the DL-SCH are delivered on the PDSCH. Therefore, a BS and a UE transmit and receive data on the PDSCH except for predetermined control information or predetermined service data. Control information carried on the PDCCH is called Downlink Control Information (DCI). The DCI transports uplink resource allocation information, downlink resource allocation information, or uplink transmission power control commands for UE groups. Table 1 below illustrates DCI formats according to the contents of DCI.

TABLE 1

| DCI Format | Description |
| --- | --- |
| DCI format 0 | used for the scheduling of PUSCH |
| DCI format 1 | used for the scheduling of one PDSCH codeword |

TABLE 1-continued

| DCI Format | Description |
| --- | --- |
| DCI format 1A | used for the compact scheduling of one PDSCH codeword and random access procedure initiated by a PDCCH order |
| DCI format 1B | used for the compact scheduling of one PDSCH codeword with precoding information |
| DCI format 1C | used for very compact scheduling of one PDSCH codeword |
| DCI format 1D | used for the compact scheduling of one PDSCH codeword with precoding and power offset information |
| DCI format 2 | used for scheduling PDSCH to UEs configured in closed-loop spatial multiplexing mode |
| DCI format 2A | used for scheduling PDSCH to UEs configured in open-loop spatial multiplexing mode |
| DCI format 3 | used for the transmission of TPC commands for PUCCH and PUSCH with 2-bit power adjustments |
| DCI format 3A | used for the transmission of TPC commands for PUCCH and PUSCH with single bit power adjustments |

DCI format 0 conveys uplink resource allocation information, DCI format 1 to DCI format 2A are used to indicate downlink resource allocation information, and DCI format 3 and DCI format 3A indicate Transmit Power Control (TPC) commands for UE groups. The BS determines a PDCCH format according to DCI for a UE and adds a Cyclic Redundancy Check (CRC) to control information. The CRC is masked by a unique ID such as a Radio Network Temporary Identifier (RNTI) according to the owner or purpose of the PDCCH.

Figure 5:
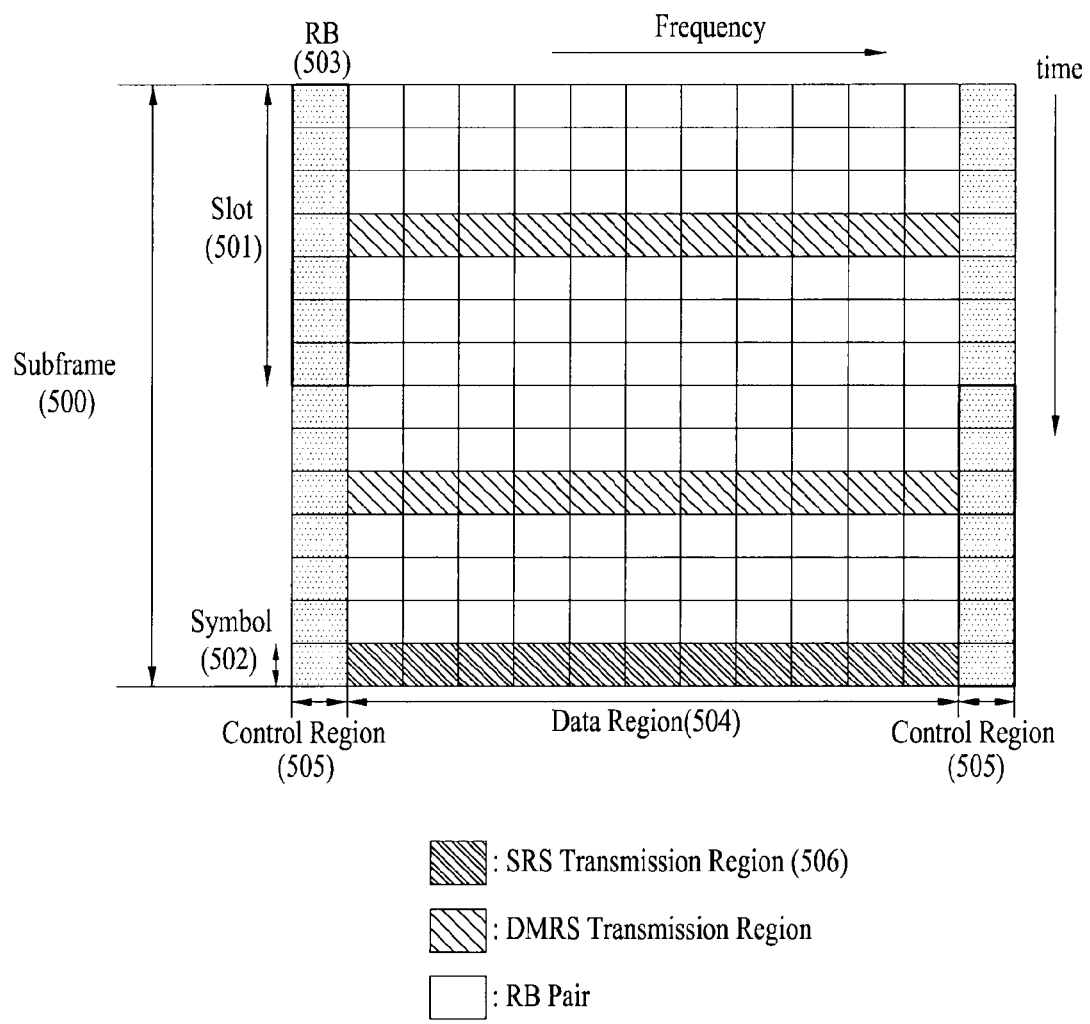
FIG. 5 illustrates an uplink subframe structure in the 3GPP system.

FIG. 5 illustrates an uplink subframe structure in the 3GPP system.

Referring to FIG. 5, a basic unit for LTE uplink transmission, a 1-ms subframe 500 includes two 0.5-ms slots 501. On the assumption of a normal CP, each slot has 7 symbols 502, each symbol being an SC-FDMA symbol. An RB 503 is a resource allocation unit defined by 12 subcarriers in frequency by one slot in time. The LTE uplink subframe is largely divided into a data region 504 and a control region 505. The data region 504 refers to communication resources used to transmit data such as voice data and packets, including a Physical Uplink Shared CHannel (PUSCH). The control region 505 refers to communication resources used for each UE to transmit a downlink channel quality report, an ACK/NACK for a received downlink signal, and an uplink scheduling request, including a Physical Uplink Control CHannel (PUCCH). A Sounding Reference Signal (SRS) is transmitted in the last SC-FDMA symbol of a subframe in the time domain and in a data transmission band in the frequency domain. SRSs transmitted in the last SC-FDMA symbol of the same subframe from a plurality of UEs can be distinguished by their frequency positions/sequences.

Now a description will be given of RB mapping. Physical Resource Blocks (PRBs) and Virtual Resource Block (VRBs) are defined. PRBs are configured as illustrated in FIG. 3. Specifically, a PRB is a set of $N_{symb}^{DL}$ contiguous OFDM symbols by $N_{sc}^{RB}$ contiguous subcarriers. PRBs are numbered from 0 to $N_{RB}^{DL}-1$ in the frequency domain. The relationship between a PRB number $n_{PRB}$ and REs (k,l) in a slot is given by $$n_{PRB} = \left\lfloor \frac{k}{N_{sc}^{RB}} \right\rfloor \quad\quad\quad [\text{Equation 1}]$$

where k denotes a subcarrier index and $N_{sc}^{RB}$ denotes the number of subcarriers in an RB.

A VRB is equal in size to a PRB. Two types of VRBs are defined, Localized VRBs (LVRBs) and Distributed VRBs (DVRBs). Irrespective of a VRB type, a pair of VRBs with the same VRB number $n_{VRB}$ are mapped to two RBs in the two slots of a subframe.

Figure 6:
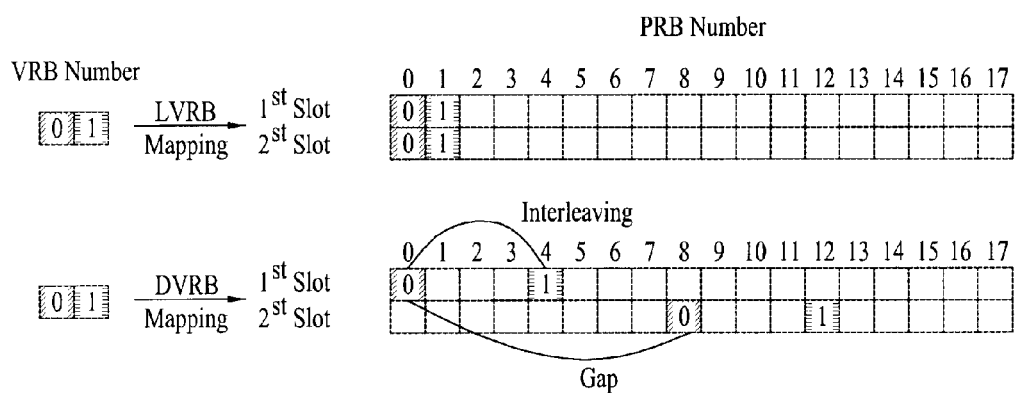
FIG. 6 illustrates a method for mapping Virtual Resource Blocks (VRBs) to Physical Resource Blocks (PRBs).

FIG. 6 illustrates a method for mapping VRBs to PRBs.

Referring to FIG. 6, LVRBs are mapped directly to PRBs such that the numbers of the LVRBs, $n_{VRB}$ is identical to the numbers of the PRBs, $n_{PRB}$ ($n_{VRB}=n_{PRB}$). VRBs are numbered from 0 to $N_{VRB}^{DL}-1$ and $N_{VRB}^{DL}=N_{RB}^{DL}$. In contrast, DVRBs are mapped to PRBs after interleaving. More specifically, a DVRB may be mapped to a PRB as illustrated in Table 2. Table 2 lists RB gaps.

TABLE 2

| System BW ($N_{RB}^{DL}$) | Gap ($N_{gap}$) | |
|---|---|---|
| | 1$^{st}$ Gap ($N_{gap,1}$) | 2$^{nd}$ Gap ($N_{gap,2}$) |
| 6-10 | $\lceil N_{RB}^{DL}/2 \rceil$ | N/A |
| 11 | 4 | N/A |
| 12-19 | 8 | N/A |
| 20-26 | 12 | N/A |
| 27-44 | 18 | N/A |
| 45-49 | 27 | N/A |
| 50-63 | 27 | 9 |
| 64-79 | 32 | 16 |
| 80-110 | 48 | 16 |

$N_{gap}$ denotes the frequency spacing between PRBs in the first and second slots of a subframe, to which VRBs with the same VRB number are mapped. The frequency spacing may be expressed as the number of PRBs. If $6 \leq N_{RB}^{DL} \leq 49$, only one gap is defined ($N_{gap}=N_{gap,1}$). If $50 \leq N_{RB}^{DL} \leq 110$, two gaps $N_{gap,1}$ and $N_{gap,2}$ are defined. $N_{gap}=N_{gap,1}$ or $N_{gap}=N_{gap,2}$ or is signaled through downlink scheduling. DVRBs are numbered from 0 to $N_{VRB}^{DL}-1$. If $N_{gap}=N_{gap,1}$, $N_{VRB}^{DL}=N_{VRB,gap,1}^{DL}=2 \cdot \min(N_{gap}, N_{RB}^{DL}-N_{gap})$. If $N_{gap}=N_{gap,2}$, $\tilde{N}_{VRB}^{DL}=N_{VRB,gap2}^{DL}=\lfloor N_{RB}^{DL}/2N_{gap} \rfloor \cdot 2N_{gap}$. $\min(A, B)$ represents the smaller value between A and B.

$\tilde{N}_{VRB}^{DL}$ consecutive VRB numbers form a VRB number interleaving unit. If $N_{gap}=N_{gap,1}$, $\tilde{N}_{VRB}^{DL}=N_{VRB}^{DL}$. If $N_{gap}=N_{gap,2}$, $\tilde{N}_{VRB}^{DL}=2N_{gap}$. VRB number interleaving may be performed using four columns and $N_{row}$ rows in each interleaving unit. Thus, $N_{row}=\lceil \tilde{N}_{VRB}^{DL}/(4P) \rceil \cdot P$ where P denotes the size of a Resource Block Group (RBG). An RBG is defined as P consecutive RBs. VRB numbers are written in a matrix row by row and read from the matrix column by column. $N_{null}$ nulls are inserted into the last $N_{null}/2$ rows of the second and fourth columns, $N_{null}=4N_{row}-\tilde{N}_{VRB}^{DL}$. The nulls are neglected during reading.

Figure 7:
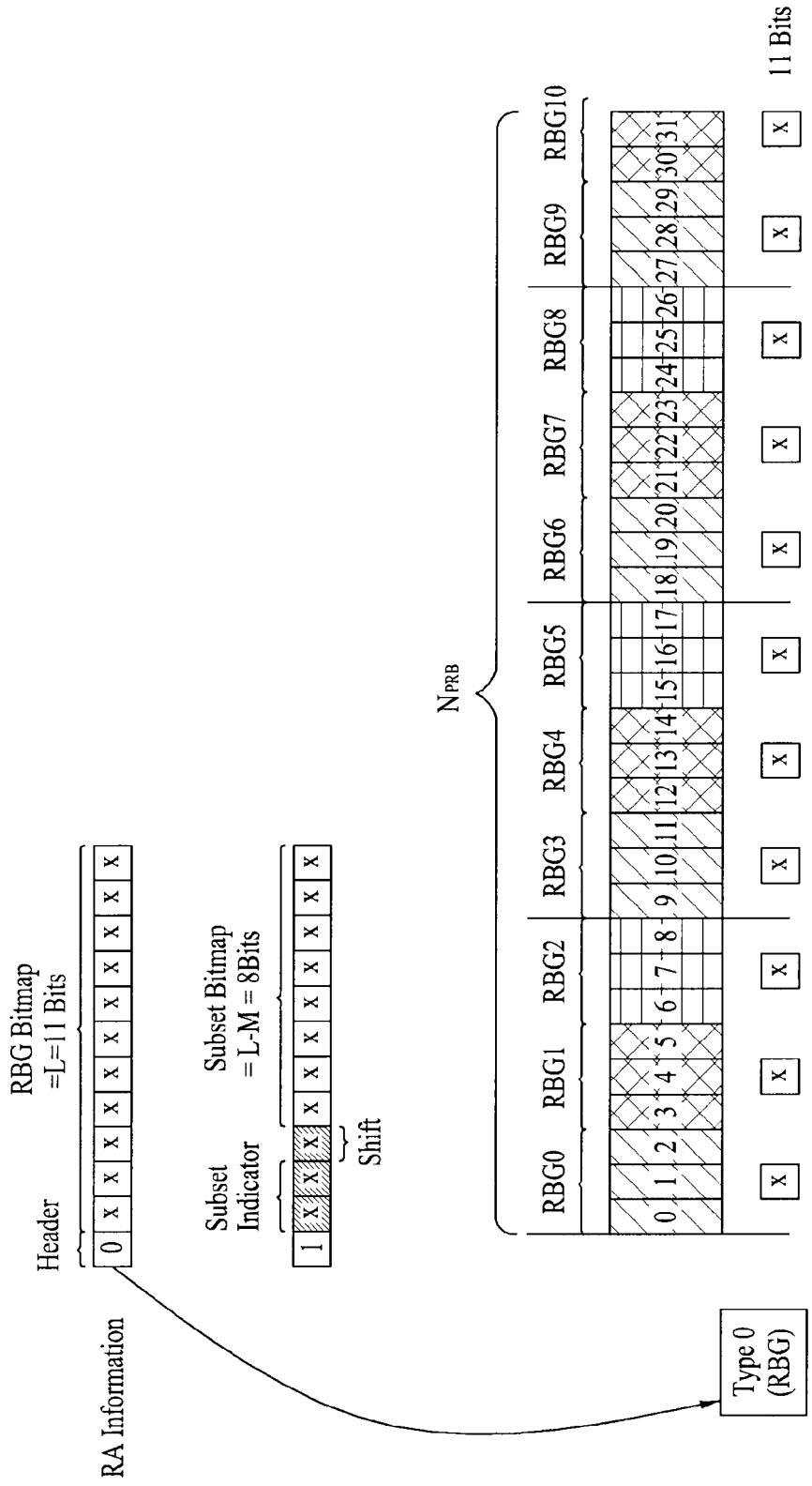
FIGS. 7, 8 and 9 illustrate Resource Allocation (RA) of type 0, RA of type 1 and RA of type 2, respectively.
Figure 8:
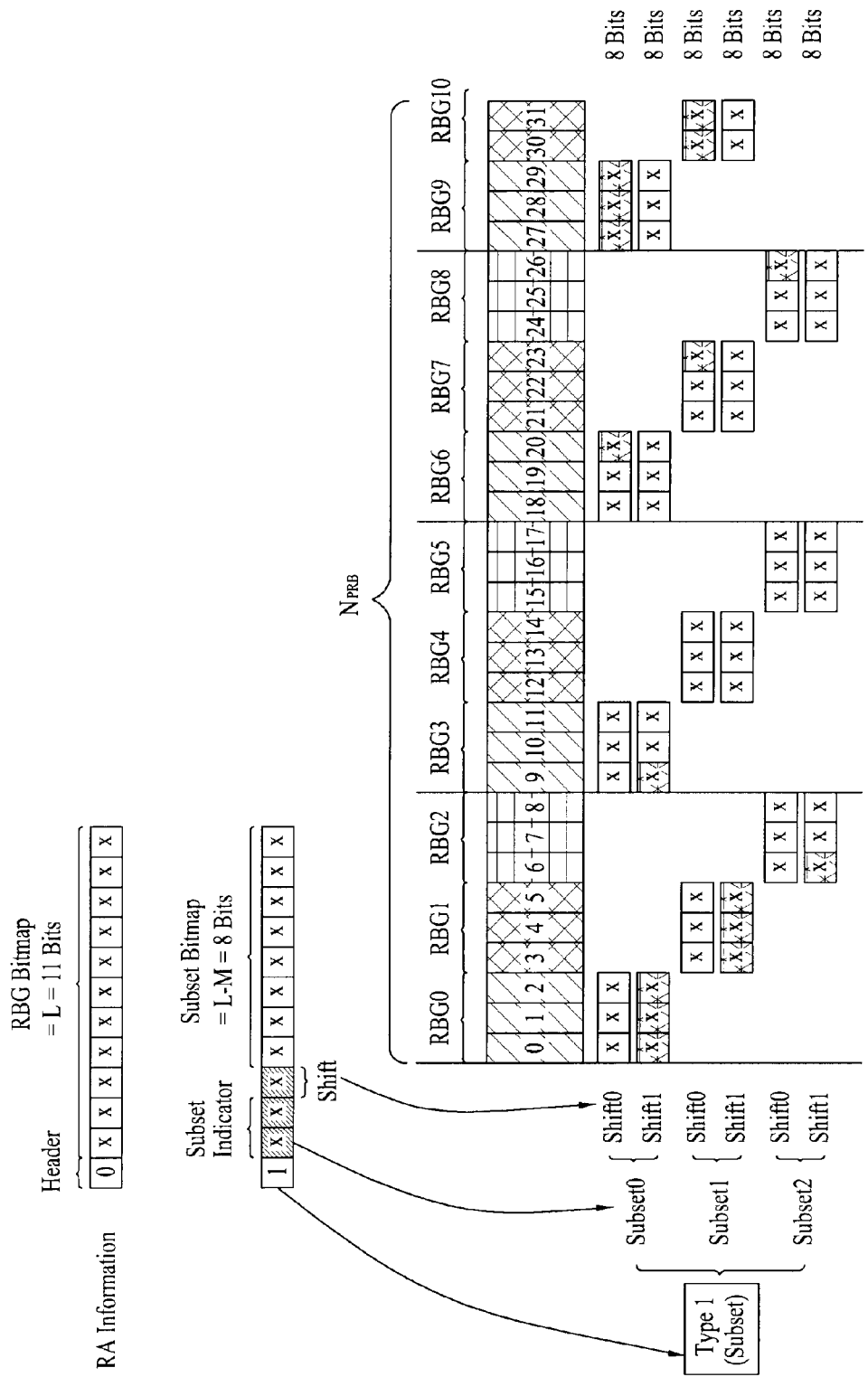
Figure 9:
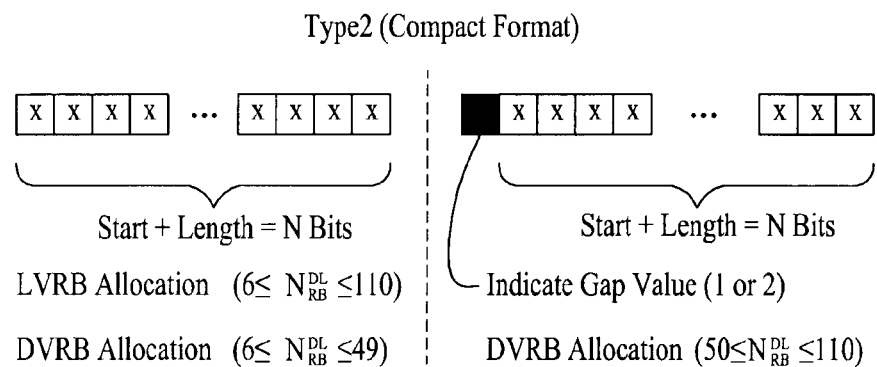

Conventional LTE resource allocations will be described below. FIGS. 7, 8 and 9 illustrate control information formats for Resource Allocation (RA) of type 0, RA of type 1 and RA of type 2 and examples of resource allocation according to the control information formats.

A UE interprets an RA field according to a detected PDCCH DCI format. The RA field of each PDCCH includes two parts, an RA header field and actual RB allocation information. PDCCH DCI format 1, PDCCH DCI format 2, and PDCCH DCI format 2A are the same in format for RA of type 0 and type 1, and distinguished from one another by their 1-bit RA header fields according to a downlink system band. Specifically, type-0 RA and type-1 RA are indicated by 0 and 1, respectively. While PDCCH DCI format 1, PDCCH DCI format 2, and PDCCH DCI format 2A are used for type-0 RA or type-1 RA, PDCCH DCI format 1A, PDCCH DCI format 1B, PDCCH DCI format 1C, and PDCCH DCI format 1D are used for type-2 RA. A PDCCH DCI format for type-2 RA does not have an RA header field. Resource allocation field indicates a PRB set of 1st slot. As will be explained below, in case of resource allocation type 0, 1, 2-LVRB, since there is no slot hopping between 1st slot and 2nd slot, the same PRB set is allocated in 2nd slot as allocated in 1$^{st}$ slot (i.e., PRB index (1st slot)=PRB index (2nd slot). Meanwhile, in case of resource allocation type 2-DVRB, if a PRB set of 1st slot is given, a PRB set of 2nd slot is determined using a slot hopping rule.

Referring to FIG. 7, in RA of type 0, RB allocation information includes a bitmap indicating RBGs allocated to a scheduled UE. An RBG is a set of consecutive PRBs. The size of an RBG, P depends on a system bandwidth as illustrated in Table 3 below.

TABLE 3

| System Bandwidth $N_{RB}^{DL}$ | RBG Size (P) |
|---|---|
| ≤10 | 1 |
| 11-26 | 2 |
| 27-63 | 3 |
| 64-110 | 4 |

The total number of RBGs, $N_{RBG}$ for a downlink system bandwidth of $N_{RB}^{DL}$ PRBs is given by $N_{RBG}=\lceil N_{RB}^{DL}/P \rceil$. Each of the $\lfloor N_{RB}^{DL}/P \rfloor$ RBGs is of size P and if $N_{RB}^{DL}$ mod P>0, one of the RBGs has a size of $N_{RB}^{DL}-P \cdot \lfloor N_{RB}^{DL}/P \rfloor$. Herein, mod represents a modulo operation, $\lceil \ \rceil$ represents a ceiling function, and $\lfloor \ \rfloor$ represents a flooring function. The size of the bitmap is $N_{RBG}$ and each bit of the bitmap corresponds to one RBG. The RBGs are indexed from 0 to $N_{RBG}-1$ in an ascending order of frequency. RBG 0 to RBG $N_{RBG}-1$ are sequentially mapped to the Most Significant Bit (MSB) to the Least Significant Bit (LSB) of the bitmap.

Referring to FIG. 8, in RA of type 1, RB allocation information of size $N_{RBG}$ indicates resources of an RBG subset on a PRB basis to a scheduled UE. An RBG subset p ($0 \leq p < P$) includes every P$^{th}$ RBG, starting from RBG p. The RB allocation information has three fields. The first field with $\lceil \log_2(P) \rceil$ indicates an RBG subset selected from among P RBG subsets. The second field with one bit indicates a shift of a resource allocation span within the RGB subset. If the bit value is 1, this means that the shift is triggered and if the bit is 0, this means that the shift is not triggered. The third field includes a bitmap in which each bit addresses a single PRB in the selected RBG subset. The part of the bitmap used to address PRBs in the selected RBG subset has size $N_{RB}^{TYPE1}$ and is defined as $$N_{RB}^{TYPE1}=\lceil N_{RB}^{DL}/P \rceil-\lceil \log_2(P) \rceil-1 \qquad \text{[Equation 2]}$$

The addressable PRB numbers of the selected RBG subset start from an offset, $\Delta_{shift}(p)$ to the smallest PRB number within the selected RBG subset, which is mapped to the MSB of the bitmap. The offset is expressed as the number of PRBs and applied within the selected RBG subset. If the bit value of the second field for shift of a resource allocation span is set to 0, the offset for the RGB subset p is given by $\Delta_{shift}(p)=0$. Otherwise, the offset for the RGB subset p is given by $\Delta_{shift}(p)=N_{RB}^{RBGsubset}(p)-N_{RB}^{TYPE1}$. $N_{RB}^{RBGsubset}(o)$ is the number of PRBs in the RGB subset p and is computed by $$N_{RB}^{RBG\ subset}(p) = \begin{cases} \left\lfloor \frac{N_{RB}^{DL}-1}{P^2} \right\rfloor \cdot P + P, & p < \left\lfloor \frac{N_{RB}^{DL}-1}{P} \right\rfloor \bmod P \\ \left\lfloor \frac{N_{RB}^{DL}-1}{P^2} \right\rfloor \cdot P + (N_{RB}^{DL}-1) \bmod P + 1, & p = \left\lfloor \frac{N_{RB}^{DL}-1}{P} \right\rfloor \bmod P \\ \left\lfloor \frac{N_{RB}^{DL}-1}{P^2} \right\rfloor \cdot P, & p > \left\lfloor \frac{N_{RB}^{DL}-1}{P} \right\rfloor \bmod P \end{cases}$$

[Equation 3]

Referring to FIG. 9, in RA of type 2, RB allocation information indicates a set of contiguously allocated LVRBs or DVRBs to a scheduled UE. In case of RA signaled in PDCCH DCI format 1A, 1B or 1D, a 1-bit flag indicates whether LVRBs or DVRBs are allocated. For instance, if the flag is set to 0, this indicates LVRB allocation and if the flag is set to 1, this indicates DVRB allocation. On the other hand, if RA is signaled in PDCCH DCI format 1C, DVRBs are always allocated. A type-2 RA field includes a Resource Indication Value (RIV), wherein the RIV is corresponding to a start resource block $RB_{start}$ and a length. The length represents the number of virtually contiguously allocated RBs.

Figure 10:
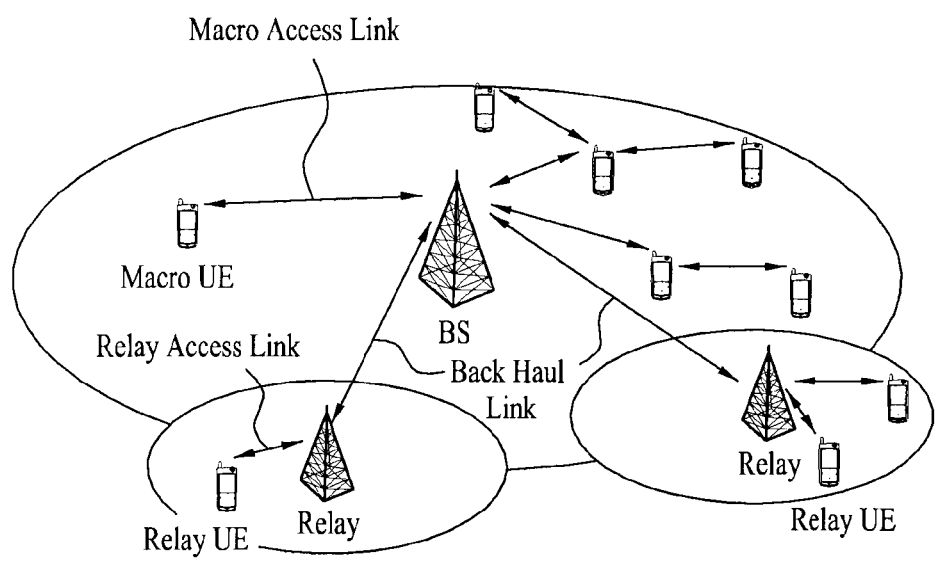
FIG. 10 illustrates a wireless communication system having relays.

FIG. 10 illustrates a wireless communication system having relays. A relay or Relay Node (RN) extends the service area of a BS or is installed in a shadowing area to thereby provide a reliable service. Referring to FIG. 10, the wireless communication system includes a BS, relays, and UEs. The UEs communicate with the BS or the relays. For the sake of convenience, a UE communicating with a BS is referred to as a macro UE and a UE communicating with a relay is referred to as a relay UE. A communication link between a BS and a macro UE and a communication link between a relay and a relay UE are referred to as a macro access link and a relay access link, respectively. A communication link between a BS and a relay is referred to as a backhaul link.

Relays are classified into L1 relays, L2 relays, and L3 relays according to their functionalities in multi-hop transmission. An L1 relay usually functions as a repeater. Thus, the L1 relay simply amplifies a signal received from a BS or a UE and transmits the amplified signal to the UE or the BS. Because the L1 relay does not decode a received signal, the transmission delay of the signal is short. Despite this benefit, noise is also amplified because the L1 relay does not separate the signal from the noise. To avert this problem, an advanced repeater or smart repeater capable of UL power control or self-interference cancellation may be used. The operation of an L2 relay may be depicted as decode-and-forward. The L2 relay can transmit user-plane traffic to L2. While the L2 relay does not amplify noise, decoding increases transmission delay. An L3 relay whose operation is depicted as self-backhauling can transmit an Internet Protocol (IP) packet to L3. As it is equipped with a Radio Resource Control (RRC) function, the L3 layer serves as a small-size BS.

L1 and L2 relays may be regarded as part of a donor cell covered by a BS. In the case where a relay is part of a donor cell, the relay does not have a cell ID of its own cell ID because it cannot control its cell and UEs of the cell. Nonetheless, the relay may still have a relay ID. At least part of Radio Resource Management (RRM) is controlled by the BS to which the donor cell belongs, while parts of the RRM may be located in the relay. An L3 relay can control cells of its own. Then the L3 relay may manage one or more cells and each of the cells may have a unique physical-layer cell ID. The L3 relay may have the same RRM mechanism as a BS.

From the perspective of a UE, there is no difference between accessing a cell controlled by the L3 relay and accessing a cell controlled by a normal BS.

Relays may be classified as follows according to mobility.

Fixed RN: as is implied from its appellation, this type RN is permanently fixed for use in a shadowing area or for coverage extension. It may function as a simple repeater.

Nomadic RN: this type RN is temporarily installed when users are rapidly increasing in number, or is movable within a building.

Mobile RN: this type RN can be installed in a public transportation vehicle such as a bus or the subway. The mobility of the RN should be supported.

The following classifications can also be considered according to the links between relays and networks.

In-based connection: a network-to-relay link shares the same frequency band with a network-to-UE link in a donor cell.

Out-band connection: a network-to-relay link and a network-to-UE link use different frequency bands in a donor cell.

With respect to the knowledge of the existence of a relay in a UE, relays are classified into the followings.

Transparent relay: a UE is not aware of whether or not it is communicating with a network via the relay.

Non-transparent relay: a UE is aware of whether or not it is communicating with a network via the relay.

Figure 11:
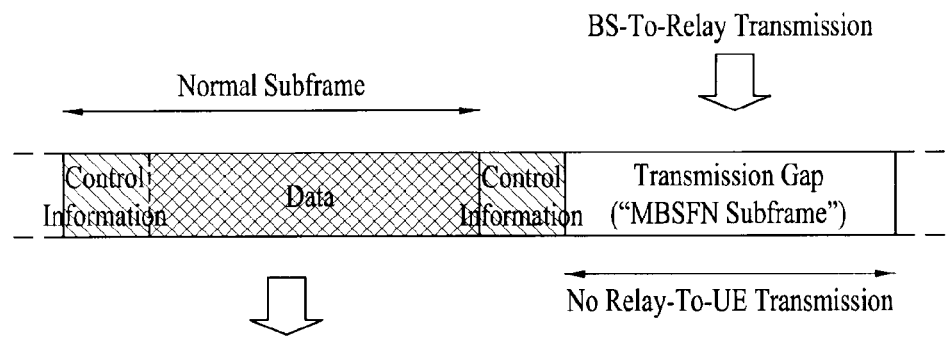
FIG. 11 illustrates backhaul transmission in a Multicast Broadcast Single Frequency Network (MBSFN) subframe.

FIG. 11 illustrates backhaul transmission in a Multicast Broadcast Single Frequency Network (MBSFN) subframe. For in-band relaying, a BS-to-relay link (i.e. a backhaul link) operates in the same frequency band as a relay-to-UE link (i.e. a relay access link). In the case where a relay transmits a signal to a UE while it is receiving a signal from a BS or vice versa, the transmitter and receiver of the relay interfere mutually. Accordingly, simultaneous BS-to-relay and relay-to-UE transmissions on the same frequency resources may be limited. For this purpose, the backhaul link and the relay access link are partitioned in Time Division Multiplexing (TDM). In an LTE-A system, a backhaul link is established in a subframe signaled as an MBSFN subframe to support measurements of legacy LTE UEs located in a relay zone (fake MBSFN). If a subframe is signaled as an MBSFN subframe, a UE receives only the control region of the subframe and thus the relay may configure a backhaul link using the data region of the subframe. Specifically, the MBSFN subframe is used for BS-to-relay transmission (e.g. a Relay PDCCH (R-PDCCH) and a Relay PDSCH (R-PDSCH), starting from the third OFDM symbol of the MBSFN subframe.

Now, a description will be given of a method for allocating and managing resources for an R-PDCCH and an R-PDSCH according to embodiments of the present invention.

An R-PDCCH delivers DCI to a relay. For details of DCI, refer to Table 1. For example, the R-PDCCH may carry downlink scheduling information and uplink scheduling information to the relay. Downlink data for a relay (e.g. backhaul data) is received on an R-PDSCH. A communication procedure on the R-PDCCH and R-PDSCH is performed in the same manner as or in a similar manner to step S102 of FIG. 1. That is, the relay receives an R-PDCCH and receives data/control information on an R-PDSCH indicated by the R-PDCCH. R-PDCCH transmission processing (e.g. channel coding, interleaving, multiplexing, etc.) may be carried out in the same manner as defined by LTE or in a simplified manner of that defined by LTE, when needed. For instance, the R-PDCCH transmission processing may be simplified in view of the nature of relays so that an unnecessary process as used in LTE is omitted.

The relay demodulates the R-PDSCH based on control information acquired from the R-PDCCH. Therefore, it is very important to acquire information about the R-PDCCH accurately. In the legacy LTE system, a PDCCH candidate region (i.e. a PDCCH search space) is reserved in a control region and a PDCCH is transmitted to a specific UE in a part of the PDCCH candidate region. Accordingly, the UE acquires its PDCCH from the PDCCH search space through blind decoding. Similarly, an R-PDCCH may be transmitted to a relay in the whole or part of reserved resources.

Figure 12:
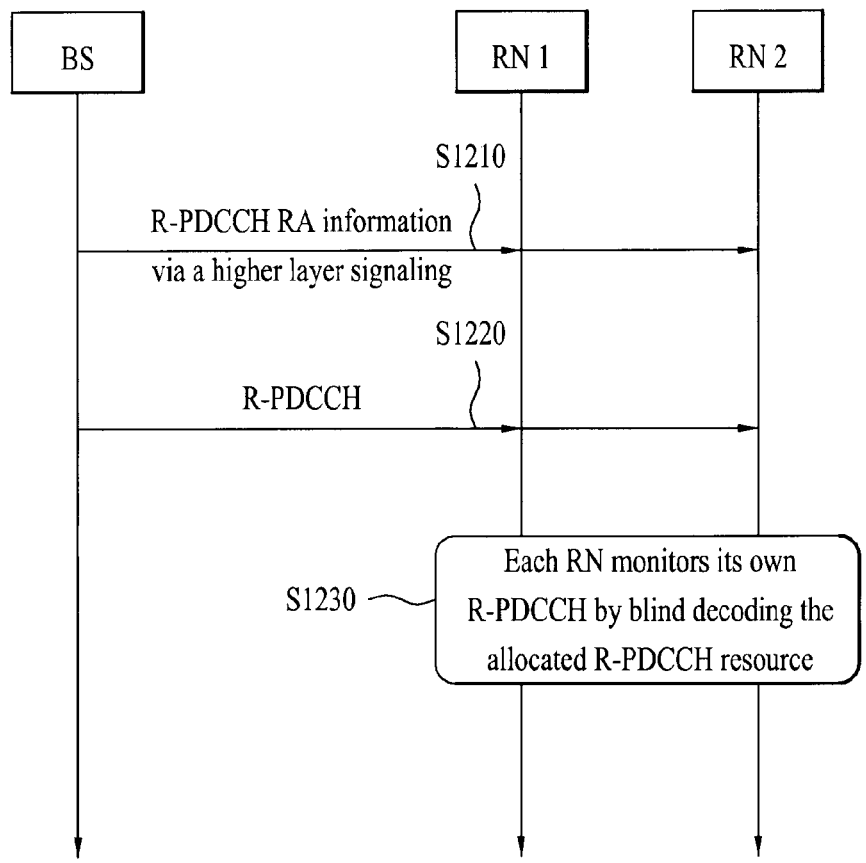
FIG. 12 is a diagram illustrating a signal flow for allocating resources for a Relay Physical Downlink Control CHannel (R-PDCCH) and receiving the R-PDCCH using the allocated resources according to an embodiment of the present invention.

FIG. 12 is a diagram illustrating a signal flow for allocating resources for an R-PDCCH and receiving the R-PDCCH using the allocated resources according to an embodiment of the present invention.

Referring to FIG. 12, a BS transmits R-PDCCH RA information to RNs (S1210). The R-PDCCH RA information is used to reserve an R-PDCCH resource area. Specifically, the R-RPDCCH RA information indicates the positions of resources in which an R-PDCCH is likely to be transmitted to the RNs (a R-PDCCH search space configuration) in advance. For the sake of convenience, the signaling for reserving R-PDCCH resources in step S1210 will be referred to Signal #1. Signal #1 may be transmitted through higher layer signaling such as RRC signaling, MAC signaling, etc., preferably RRC signaling. In addition, Signal #1 may be transmitted in a semi-static manner. Signal #1 may be cell-specific, relay group-specific, or relay-specific.

The R-PDCCH search space refers to R-PDCCH resources (or an R-PDCCH resource area) that an RN is supposed to monitor to receive its own R-PDCCH. The R-PDCCH search space includes a relay-common (RN-common) search space and/or a relay-specific (RN-specific) search space. A basic unit of the R-PDCCH resources may be an RB (e.g. 12 consecutive subcarriers×7(6) consecutive OFDM symbols), a Resource Element Group (REG) (e.g. 4 available subcarriers×1 OFDM symbol), or a Control Channel Element (CCE) (e.g. a plurality of (for example, 9) REGs).

The R-PDCCH resources (i.e. the R-PDCCH search space) reserved by Signal #1 are wholly or partially used for a later actual transmission of an R-PDCCH. In most cases, only a part of the reserved R-PDCCH resources is used for R-PDCCH transmission. Meanwhile, an RN should share resources with a macro UE in the data region of a backhaul subframe (e.g. an MBSFN subframe). Therefore, it is preferred that the conventional LVRB/DVRB mapping rules are still applied to an RN like a macro UE, thereby maximizing the multiplexing efficiency of a frame. In this context, Signal #1 is configured based on the same signaling information as an LTE RA signaling configuration in order to reserve R-PDCCH resources (e.g. R-PDCCH RBs). Specifically, Signal #1 may provide VRB mapping scheme/allocation information. For example, Signal #1 may provide various VRB mapping scheme/allocation information illustrated in FIGS. 6 to 9. Preferably, Signal #1 may include information about contiguous VRBs (e.g. the start and length of the VRBs), as is done in DVRB allocation (refer to FIG. 9). Bit configuration in Signal #1 can use a format of resource allocation types 0, 1 and 2 used in the conventional LTE without modification, or use N bits bitmap when N VRBs are reserved for R-PDCCH in advance. VRB to PRB mapping can be carried out in accordance with resource allocation types 0, 1 and 2 of the conventional LTE. In particular, with the resource allocation types 0, 1 and 2-LVRB, VRB indexes are mapped to PRB indexes of same value, and with resource allocation type 2-DVRB, VRB indexes are distributed mapped to PRB indexes. The number of R-PDCCH RBs reserved by Signal #1 is not limited to but is preferably a multiple of 4. Benefits that can be achieved from the number of R-PDCCH RBs being a multiple of will be described later. A granularity for R-PDCCH resource allocation may be one RB, one RBG, or a group of X RBs (e.g. a group of 4 RBs), when needed. Preferably, the R-PDCCH resource allocation granularity is 4 RBs or a multiple of 4 RBs, which will be detailed later.

In the legacy LTE system, VRB allocation information (e.g. DVRB RA mapping signaling information) is transmitted only to one LTE UE. However, RA information (Signal #1) having the same configuration as or a similar configuration to the conventional VRB allocation information (e.g. the conventional DVRB RA mapping signaling information) may be transmitted to a plurality of (e.g. all) RNs and the RNs may determine the positions of R-PDCCH resources according to a conventional LTE RA rule (e.g. a DVRB interleaving rule) in an embodiment of the present invention (RN (group) common signaling). While not shown, Signal #1 may be transmitted only to one RN, as is conventionally done in the legacy LTE system (RN dedicated signaling).

When Signal #1 is transmitted through higher layer signaling on an R-PDSCH, there is no way for an RN to know a reserved resource area for an R-PDCCH during an initial access. Accordingly, the RN may assume the existence of an R-PDCCH in an RB with a specific RB index and decode the R-PDCCH during the initial access (a UE mode). Then, the RN may determine a resource area reserved for an R-PDCCH from Signal #1 received through higher layer signaling (e.g. RRC signaling) in a semi-static manner (an RN mode). However, if the reserved R-PDCCH area has been changed, the RN may not know the exact time when the reserved R-PDCCH has been changed. As a result, R-PDCCH decoding may be defective. Even though there is no problem with R-PDCCH decoding, the RN may have to attempt decoding to detect an R-PDCCH in many cases. To minimize this problem, the size of the reserved R-PDCCH area may be increased or decreased by one basic unit each time it is changed. Obviously, this information should be considered in determining the positions and number of R-PDCCH RBs included in semi-static RRC signaling. For instance, the reserved R-PDCCH area may be increased or decreased in size by a multiple of 4 RBs. In this case, the RN has to detect an R-PDCCH in an extra R-PDCCH area as well as an existing R-PDCCH area or in a decreased R-PDCCH area as well as the existing R-PDCCH area in the vicinity of a subframe having a changed R-PDCCH area (i.e. before or after the subframe), for example, after receiving RRC signaling. In this manner, decoding complexity caused by an arbitrary R-PDCCH RB configuration can be reduced.

Meanwhile, if the RN is capable of directly receiving an R-PDCCH, Signal #1 may be transmitted in DCI of an R-PDCCH (for example, in the case where a subframe boundary is a few symbols misaligned between the BS and the RN and thus the RN can receive an R-PDCCH directly). In this case, the RN can determine a resource area reserved for an R-PDCCH on a subframe basis.

Referring to FIG. 12 again, the BS transmits R-PDCCHs in a backhaul subframe (S1220). The R-PDCCHs may be transmitted in the whole or part of the R-PDCCH resources reserved by Signal #1 in step S1210. In most cases, only a part of M R-PDCCH RBs are used for R-PDCCH transmission. DCI mapped to R-PDCCH resources (e.g. R-PDCCH RBs), such as a DL grant (downlink scheduling information) and a UL grant (uplink scheduling information), may not be cross-interleaved. In this case, only a single R-PDCCH is transmitted in one or more RBs. The DCI mapped to the R-PDCCH resources may also be intra-RB interleaved. The DCI mapped to the R-PDCCH resources may also be inter-RB interleaved (cross-interleaved). In this case, a plurality of R-PDCCHs may be transmitted together in one or more RBs. Subsequently, each RN monitors the R-PDCCH resources (the R-PDCCH resource area) reserved by Signal #1 received in step S1210 to determine whether there is any R-PDCCH destined for the RN. Monitoring the R-PDCCH resources involves blind decoding of R-PDCCH candidates. Upon detection of its own R-PDCCH, an RN performs an operation according to the DCI of the R-PDCCH (e.g. downlink reception, uplink transmission, etc.).

It is regulated that an R-PDCCH carrying a DL grant (referred to as a DL grant R-PDCCH) is transmitted in the first slot of a subframe and an R-PDCCH carrying a UL grant (referred to as a UL grant R-PDCCH) is transmitted in the second slot of the subframe. Thus, if a DL grant R-PDCCH exists only in the first slot, the second slot may be wasted. Accordingly, an R-PDCCH is preferably transmitted in the second slot. In this regard, an R-PDSCH resource area allocated to a specific RN may be overlapped with an R-PDCCH resource area reserved for R-PDCCHs, for example, by RRC signaling. In this case, an RN (or a procedure) may be configured so as to acquire an R-PDSCH only from the second slot, for an overlapped RB. To increase resource utilization, an RN (or a procedure) may be configured such that an R-PDSCH is demodulated in the second slot, only for an RB carrying an R-PDCCH, and also in the first slot for an RB that does not carry an R-PDCCH. In this manner, the RN can determine the existence of a first R-PDCCH area and acquire an R-PDSCH from the remaining area, while still using conventional LTE RA, which will be described again.

The present invention provides a method for allocating resources for a Relay-Physical Downlink Control Channel (R-PDCCH) transmitted from a BS to an RN and managing the allocated resources (e.g. RA Type 2). Every RN can demodulate an R-PDSCH based on control information acquired from its R-PDCCH. Accordingly, it is very important to acquire accurate R-PDCCH information. In the legacy LTE system, a resource area for transmitting a PDCCH is reserved in advance and a PDCCH is transmitted to a specific UE in a part of the reserved PDCCH resource area. The reserved PDCCH area is referred to as a Search Space (SS) and a UE acquires its PDCCH by blind decoding in the SS.

According to the present invention, an R-PDCCH is transmitted to a specific RN in all or a part of M R-PDCCH RBs reserved for transmitting control information needed for R-PDSCH demodulation. Information about the reserved M R-PDCCH RBs may be indicated by RRC signaling or broadcast on a PBCH. An R-PDCCH SS may be configured cell-specifically or RN-specifically. After the R-PDCCH SS is configured, it may be changed semi-statically by RRC signaling.

The whole area in which R-PDCCHs are likely to be located may be preset or indicated by RRC signaling. An area carrying an actual R-PDCCH or a certain area including this R-PDCCH area (e.g. RN-specific SS≤the whole area) may also be indicated by higher-layer signaling (e.g. RRC signaling). Information about the limited SS transmitted to an RN may be used in determining an interleaver parameter, for example, an interleaver size for an R-PDCCH. This implies that the information transmitted to the RN may determine the characteristics of an interleaver for the R-PDCCH. Especially, the same information may be transmitted to a plurality of RNs (e.g. RNs within the same interleaving group) and R-PDCCH RBs allocated to these RNs may be jointly interleaved. The number of R-PDCCH RBs allocated to the RNs may also determine the characteristics of an interleaver used for R-PDCCHs. In addition, information about a limited SS may limit the number of RNs that are subject to joint interleaving (i.e. the number of RNs in the same interleaving group). The information about the limited SS may be used in limiting the number of RBs to which interleaved R-PDCCHs are mapped. That is, as only R-PDCCHs for a predetermined number of RNs are interleaved to limited or predetermined RBs, an interleaver of a predetermined size can be used. For example, if two RNs are allocated to 4 RBs, only an interleaver having an interleaver size of 4 RBs may be designed. While an interleaver size of 8 RBs or 2 RBs may also be supported to increase interleaving freedom, an interleaver with a limited interleaver size in RBs is preferable due to the resulting increased complexity in interleaver design. For example, for 4 or 8 RBs, 2 or 4 RBs may be interleaved. In this case, only two interleaver sizes are sufficient, which obviates the need for supporting all interleaver types and interleaver sizes and thus simplifies interleaver implementation.

Figure 13:
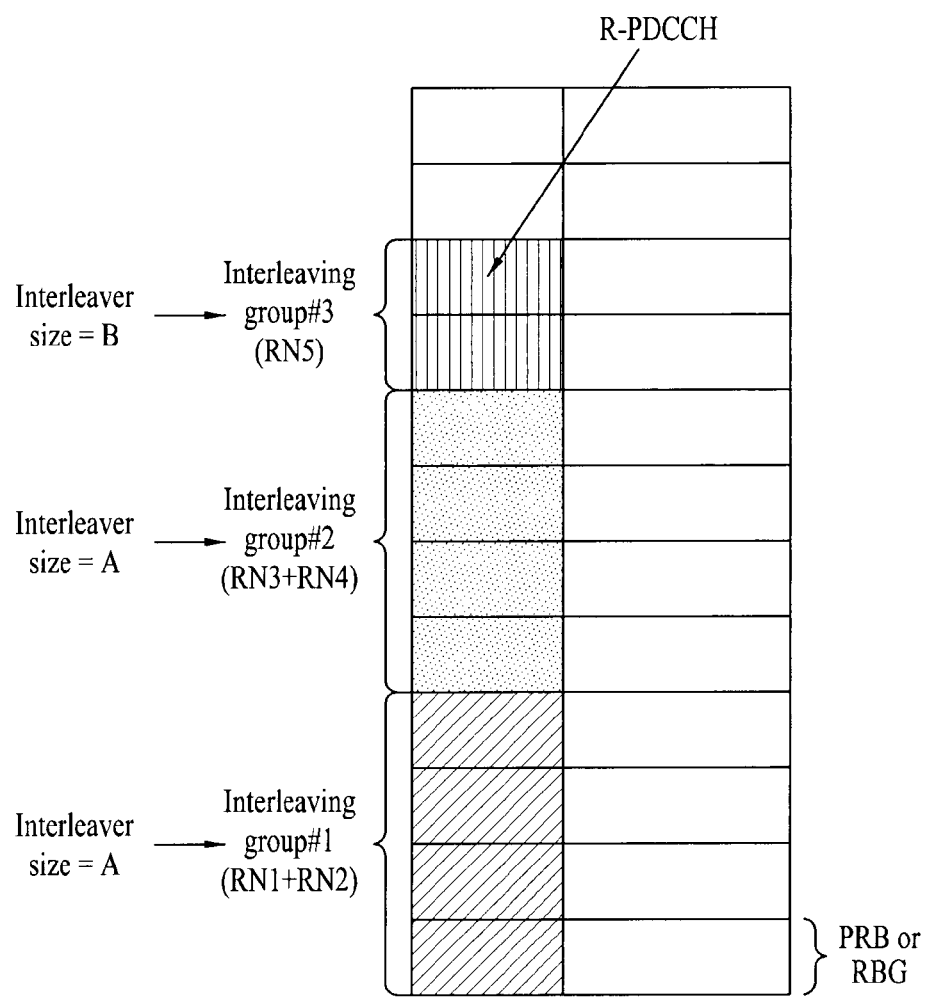
FIG. 13 illustrates exemplary R-PDCCH interleaving.

FIG. 13 illustrates an example of R-PDCCH interleaving using only two types of interleavers.

In the illustrated case of FIG. 13, R-PDCCHs are interleaved in two interleavers of different sizes. A BS may group R-PDCCHs for RN 1 and RN 2 into interleaving group #1 and interleave interleaving group #1 according to interleaver size A. The BS may also group R-PDCCHs for RN 3 and RN 4 into interleaving group #2 and interleave interleaving group #2 according to interleaver size A. Meanwhile, the BS may interleave an R-PDCCH for RN5 as a single interleaving group according to interleaver size B. While the BS interleaves R-PDCCHs and maps them to consecutive RBs in FIG. 13, by way of example, the interleaved R-PDCCHs may be mapped to distributed RBs in actual implementation.

With reference to FIGS. 14 to 18, methods for multiplexing R-PDCCHs with R-PDSCHs in resources allocated according to a DVRB scheme. For the sake of convenience, the R-PDCCHs and the R-PDSCHs are shown as transmitted in the first slot and in the first/second slot, respectively. However, the R-PDCCH and R-PDSCH transmission is exemplary. For instance, the R-PDCCHs may be transmitted on a slot basis in the first and/or second slot. In LTE-A, a DL grant R-PDCCH and a UL grant R-PDCCH are transmitted in the first and second slots, respectively. Unless otherwise specified, an RB may refer to a VRB or a PRB under circumstances.

Figure 14:
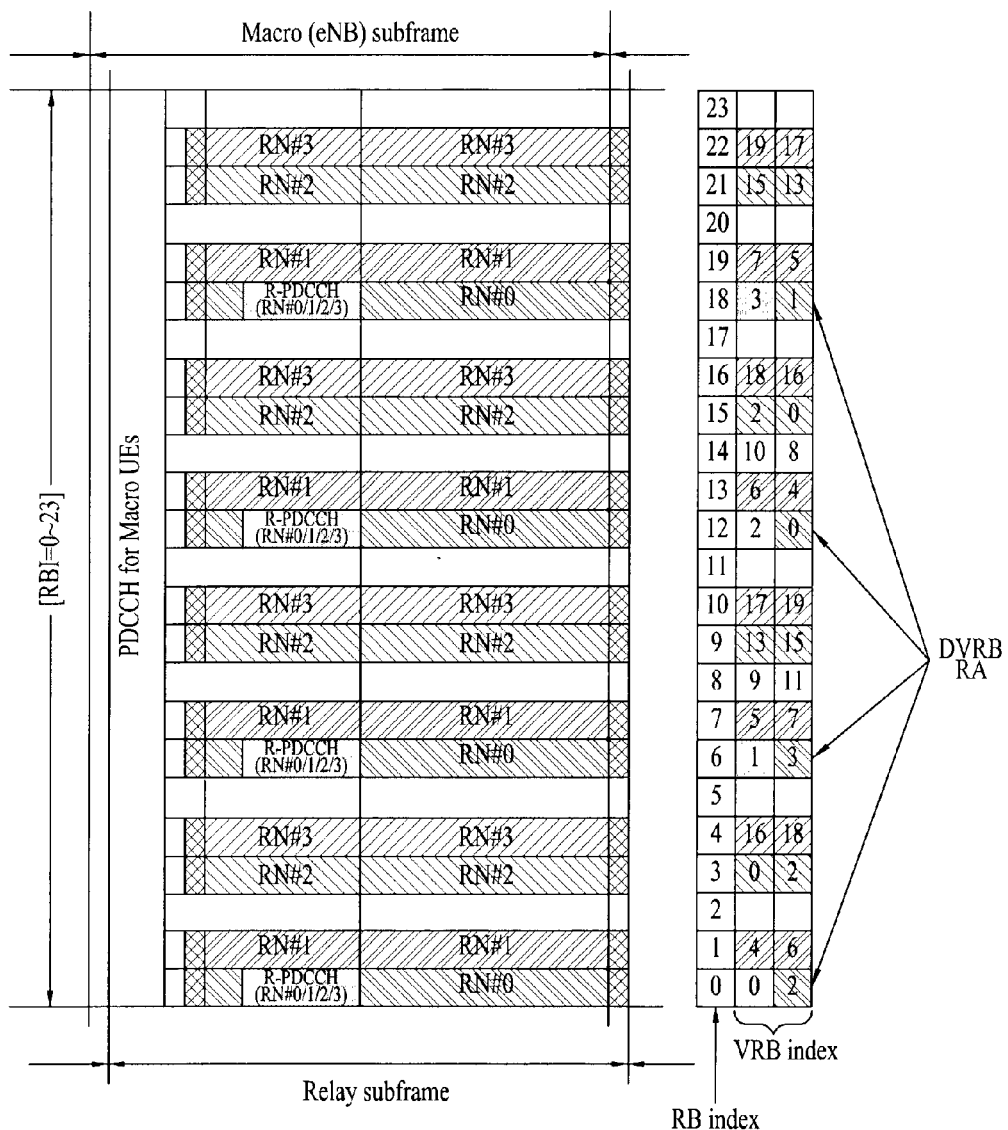
FIGS. 14 to 18 illustrate methods for multiplexing R-PDCCHs with Relay-Physical Downlink Shared CHannels (R-PDSCHs) in resources allocated according to a Distributed VRB (DVRB) scheme according to embodiments of the present invention.

FIG. 14 illustrates a method for multiplexing R-PDCCHs with R-PDSCHs in 24 DVRBs, for four RNs. The four RNs may be a preset RN group scheduled to use the 24 allocated R-PDCCH RBs. That is, the illustrated R-PDCCH RBs may be dedicated to the RNs (or the RN group). Because slot-based cyclic shift (DVRB slot hopping) is adopted in the DVRB scheme, one RN is not allowed to use two slots of the same PRB. That is, an R-PDCCH (and an R-PDSCH) is not transmitted to an RN in the two slots of the same PRB. If the R-PDCCH/R-PDSCH is demodulated using a DeModulation-Reference Signal (DM-RS), the resulting degraded channel estimation performance leads to the degradation of demodulation performance. Considering that an R-PDCCH is transmitted in a good channel environment in most cases, it is preferred to allocate the two slots of the same PRB to the same RN (i.e. an R-PDCCH (and an R-PDSCH)). For this purpose, DVRB slot hopping may not be applied in DVRB-based R-PDCCH RA. Resources for an RN are allocated to the same VRB set in the first and second slots. The slot hopping-off may apply to all DVRB resources allocated by Signal #1 or to actual resources carrying R-PDCCHs.

As illustrated in FIG. 14, a basic VRB grouping unit for allocating DVRBs to an RN is a multiple of 4, VRB #0 to #3, VRB #4 to #7, VRB #12 to #15, or VRB #16 to #19 in an embodiment of the present invention. Resources for an RN are allocated to the same VRB set in the first and second slots. In spite of DVRB slot hopping, the same PRBs in two slots may be allocated to the same RN. That is, the same PRBs of two slots are available to transmission of an R-PDCCH (and an R-PDSCH) to the same RN through DVRB allocation.

Therefore, a basic resource allocation unit for an RN may be 4. For instance, 4 RBs may be a resource allocation unit for an RN in a situation where backhaul resources are allocated in both a distributed manner and a localized manner. Hence, a multiple of 4 RBs can be allocated to an RN. In this case, the number of bits required for an RA field may be reduced using an RB step (e.g. step=4). In addition, even though four RBs (e.g. VRB #0 to #3) are cyclically shifted in the second slot, each of the cyclically shifted RBs is adjacent to one of the four RBs in the first slot. Therefore, even though slot hopping is off only for M RBs (e.g. an R-PDCCH search space) reserved for R-PDCCH transmission, the M RBs do not interfere with other RBs to which slot hopping is applied. For the last VRB index, two VRBs may be paired, not four VRBs. Similarly to the above manner, resources for transmission of an R-PDCCH can be allocated to RN #1, RN #2 and RN #3.

Figure 15:
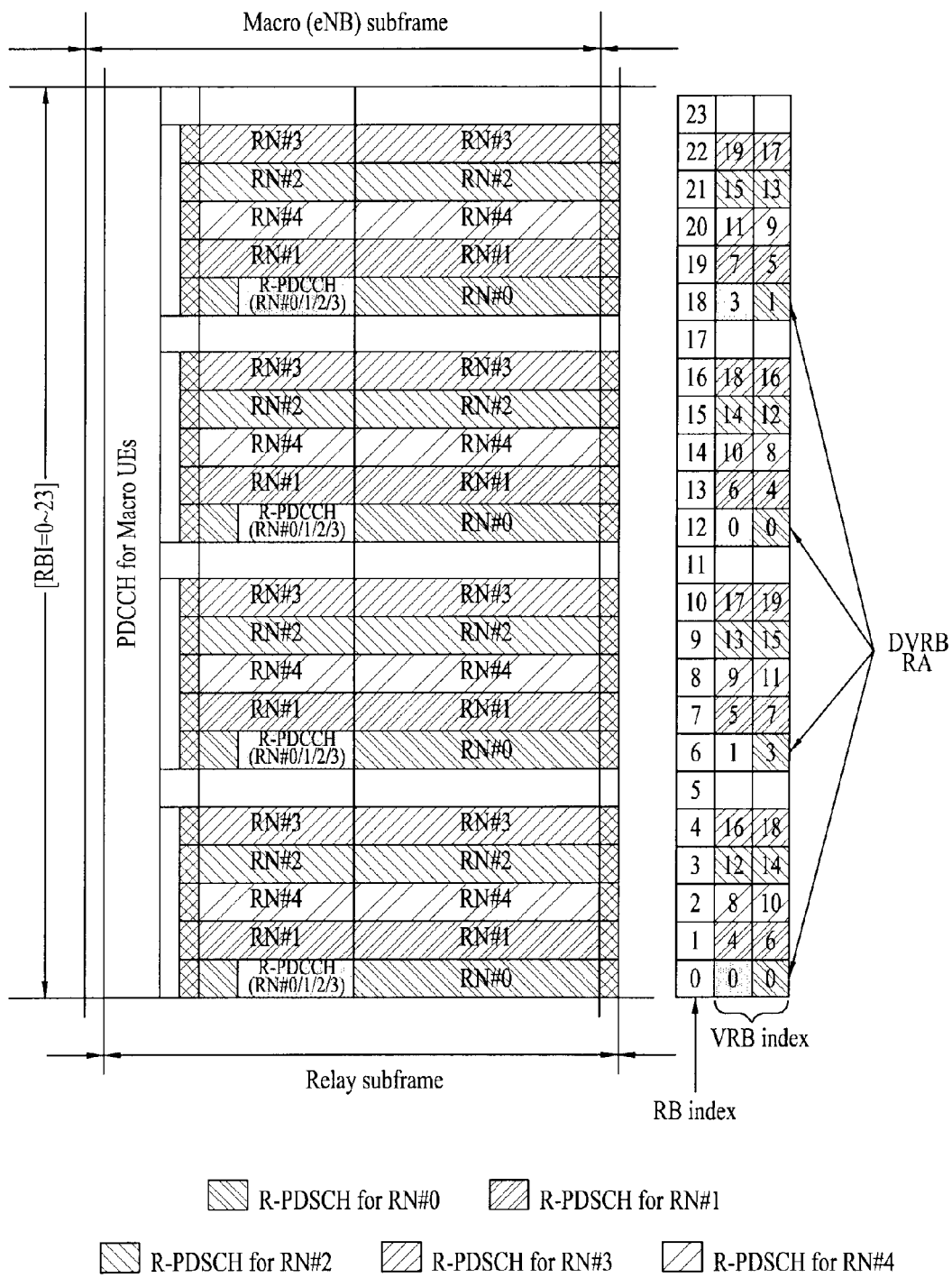

FIG. 15 illustrates another method for multiplexing R-PDCCHs with R-PDSCHs in resources allocated according to the DVRB scheme. Resources of a DVRB resource area assumed in FIG. 13 are allocated to an RN that does not belong to the RN group of FIG. 13. In this manner, resources allocated to the RN group can be efficiently utilized.

Referring to FIG. 14 again, an R-PDCCH for RN #4 is not interleaved in the R-PDCCH area (for RN #0 to RN#3) and thus RN #4 is from another RN group. Let RN #0 to RN#3 form RN Group #1. Then the resources (or resource area) of FIG. 13 are intended for RN Group #1. In this example, even though RN #4 is from another RN group, resources may be allocated to RN #4 for an R-PDCCH and/or an R-PDSCH in the resources of RN Group #1, thereby increasing resource use efficiency, as illustrated in FIG. 15. In this case, information indicating that the resources (area) are allocated to another RN (RN group) should be transmitted together with or separately from RA signaling information. In an embodiment of the present invention, a signal indicating an RN or an RN group (a Group Indication Signal (GIS)) may be transmitted. That is, the GIS and a DVRB signal may be used in allocating resources. The GIS may be inserted in an RA field or carried in a separate field. If the GIS does not change often, the GIS may be indicated by higher layer signaling (e.g. RRC signaling or MAC signaling).

Figure 16:
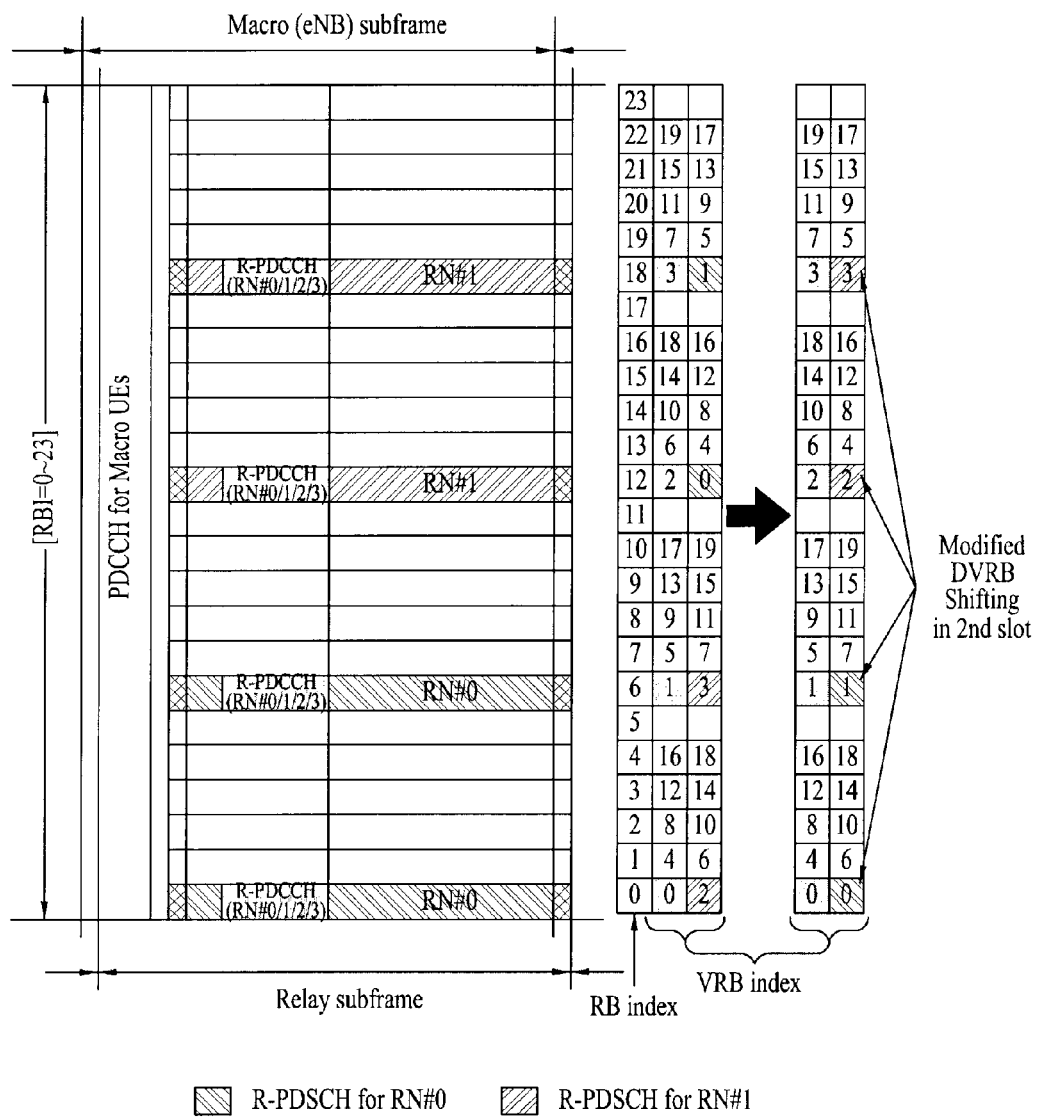

FIG. 16 illustrates a third method for multiplexing R-PDCCHs with R-PDSCHs in resources allocated according to the DVRB scheme. This method maximizes resource use efficiency by modifying a conventional RA.

Referring to FIG. 16, if RN #0 is paired with RN #1 and 4 RBs are configured for them, a common DVRB signal (PRB #0/6=VRB#0/1/2/3) may be transmitted to RN #0 and RN #1 to notify them of the allocated resource area and to instruct them not to follow LTE PDSCH DVRB mapping in the second slot. That is, the DVRB signal may be reconfigured so that the first and second slots of the same RB index are used without slot-based shifting. According to the conventional DVRB mapping rule, RB #0 in the first slot is cyclically shifted to RB #12 in the second slot according to a gap value. However, the cyclic shift may degrade channel estimation performance and thus demodulation performance, when an R-PDCCH/R-PDSCH is demodulated using a DM-RS.

Therefore, an RN may use the same RBs in the first and second slot without RB shifting in the second slot. For this operation, additional signaling may not be needed. A conventional operation mode and a proposed operation mode may be configured together. For example, shifting-off (i.e. slot hopping-off) is applicable only to RBs to which R-PDCCHs are actually allocated. Alternatively, shifting-off may be applied to all RBs of an R-PDCCH search space. For an R-PDSCH, shifting-off is applicable only when resources carrying an R-PDCCH are overlapped with resources indicated by the R-PDCCH. In addition, shifting-off is applicable only to RBs to which R-PDSCHs are actually allocated. Shifting-off may also be applicable to all RBs available to an RN in a backhaul subframe.

Figure 17:
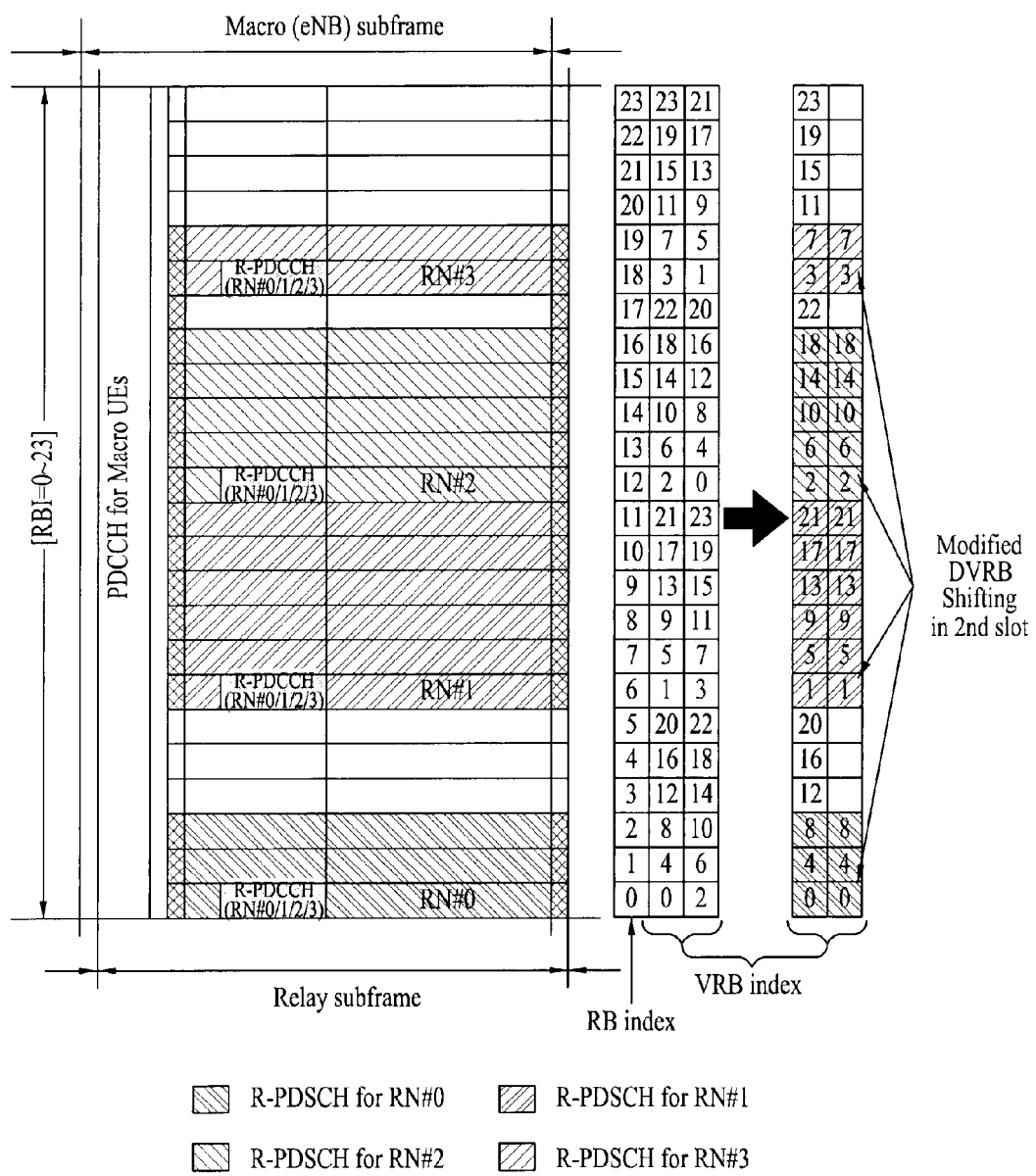

FIG. 17 illustrates a fourth method for multiplexing R-PDCCHs with R-PDSCHs in resources allocated according to the DVRB scheme.

Referring to FIG. 17, an R-PDCCH resource area is known to RNs and each RN monitors an R-PDCCH candidate area (i.e. an R-PDCCH search space) to detect its own R-PDCCH. In this method, an RN to use the second slot is determined according to the index of a Relay CCE (R-CCE) to which an R-PDCCH is allocated for RN #k (k=0, 1, 2, 3). For example, this method may be carried out based on an R-CCE-index to RB-index mapping rule which is not restricted to a specific one. For example, the second slot of an RB carrying an R-PDCCH may be mapped to an RN corresponding to the R-PDCCH. To be more specific, if an R-CCE for an R-PDCCH of RN #0 is mapped to RB #0, an R-CCE for an R-PDCCH of RN #1 is mapped to RB #6, an R-CCE for an R-PDCCH of RN #2 is mapped to RB #12, and an R-CCE for an R-PDCCH of RN #3 is mapped to RB #18, the second slots of RB #0, 6, 12 and 18 may be mapped to RN #0, 1, 2, and 3, respectively. Thus, R-PDSCHs and R-PDCCHs are allocated as illustrated in FIG. 17.

According to the above description, it is possible to allocate the resources of the second slot of an RB carrying an R-PDCCH for an RN to the RN (e.g. for an R-PDSCH) without additional signaling (implicit signaling). The remaining RBs carrying R-PDSCHs may be allocated to RNs by RA included in R-PDCCHs. In this case, an RN may be configured so as to demodulate an R-PDSCH by distinguishing RBs carrying R-PDCCHs from RBs that does not carry R-PDCCHs. For this purpose, the first slot of all RBs (an R-PDCCH search space) reserved for R-PDCCHs may be excluded from R-PDSCH transmission (or R-PDSCH demodulation). In another method, an RN may exclude only the first slot of an RB from which its own R-PDCCH (it may be restricted to a DL grant R-PDCCH) is detected from R-PDSCH transmission (or R-PDSCH demodulation). Specifically, when the RN detects at least part of a DL grant R-PDCCH in the first slot of a PRB, the RN may exclude the first slot of the PRB in R-PDSCH demodulation. In a further method, an RB carrying an R-PDCCH may be indicated explicitly.

Figure 18:
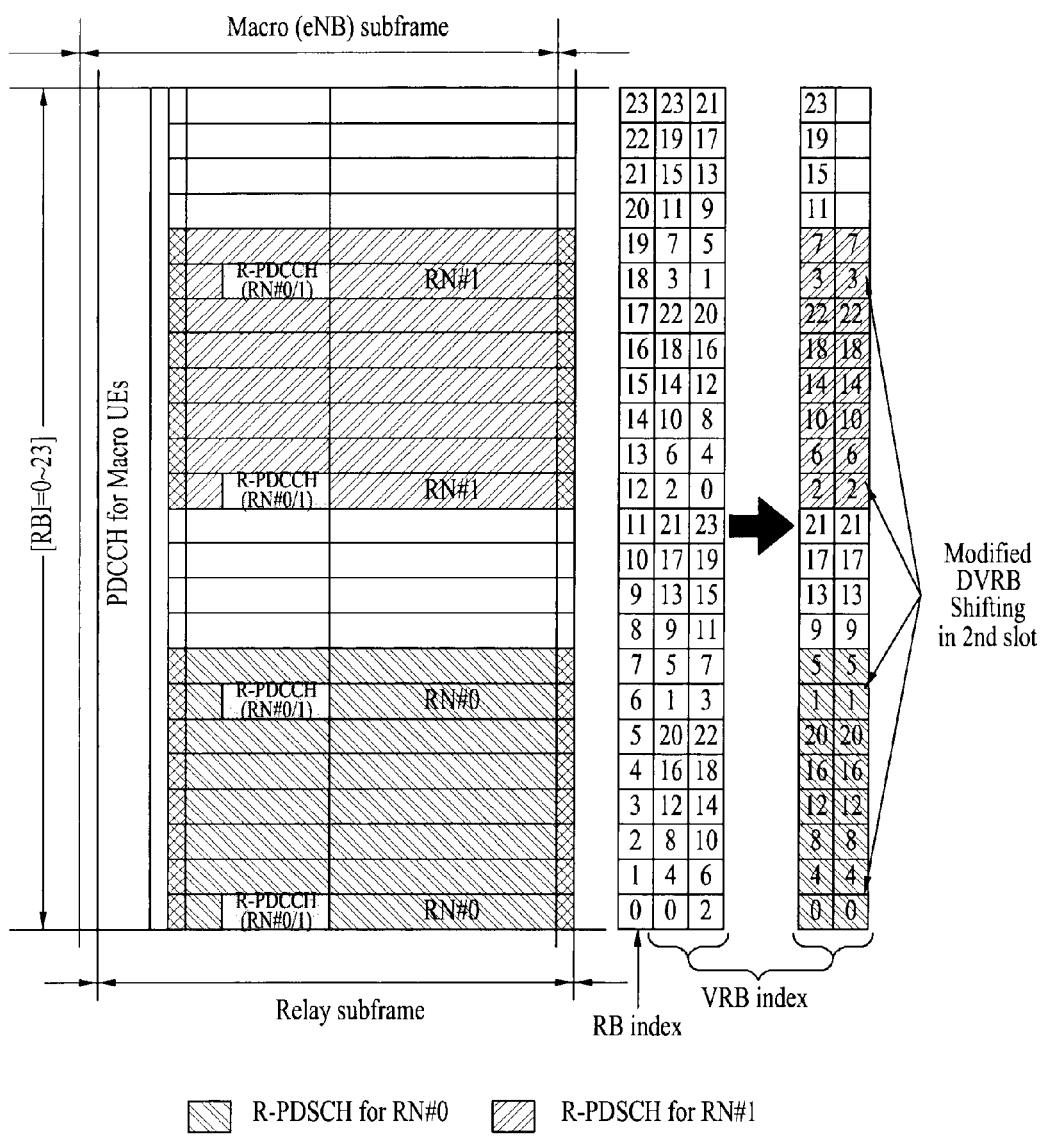

FIG. 18 illustrates an extension of FIG. 17. Therefore, it is assumed that the second slot of an RB carrying an R-PDCCH is implicitly mapped to an RN corresponding to the R-PDCCH as in FIG. 17. In this case, if there are a small number of RBs carrying R-PDCCHs due to a small number of RNs, some RBs may not be allocated in the second slot, thus wasting resources. This resource waste may be prevented by increasing a CCE aggregation level. Referring to FIG. 18, if there are only R-PDCCHs for two RNs in an R-PDCCH resource area (e.g. 4 RBs), the R-PDCCHs of the two RNs may be transmitted over the four RBs by increasing an R-PDCCH R-CCE aggregation level. For this purpose, a CCE-to-RB mapping rule may be used. The CCE-to-RB mapping rule is not limited to a specific one. For instance, R-CCE #0 may be mapped to RB #0, R-CCE #1 may be mapped to RB #6, R-CCE #2 may be mapped to RB #12, and R-CCE #3 may be mapped to RB #18. On the assumption of four R-CCEs for four RBs (i.e. one R-CCE per RB), R-CCE #0 and #1 may be mapped to RN #0 and R-CCE #2 and #3 may be mapped to RN #1 (a CCE aggregation level=2). Thus an R-PDSCH for an RN may be allocated implicitly so as to include one or more R-PDCCH transmission areas. In the illustrated case of FIG. 18, the second slots of RB#0 and RB#6 are implicitly allocated to RN #0 (for an R-PDSCH), and the second slots of RB#12 and RB#18 are implicitly allocated to RN #1 (for an R-PDSCH).

Figure 19:
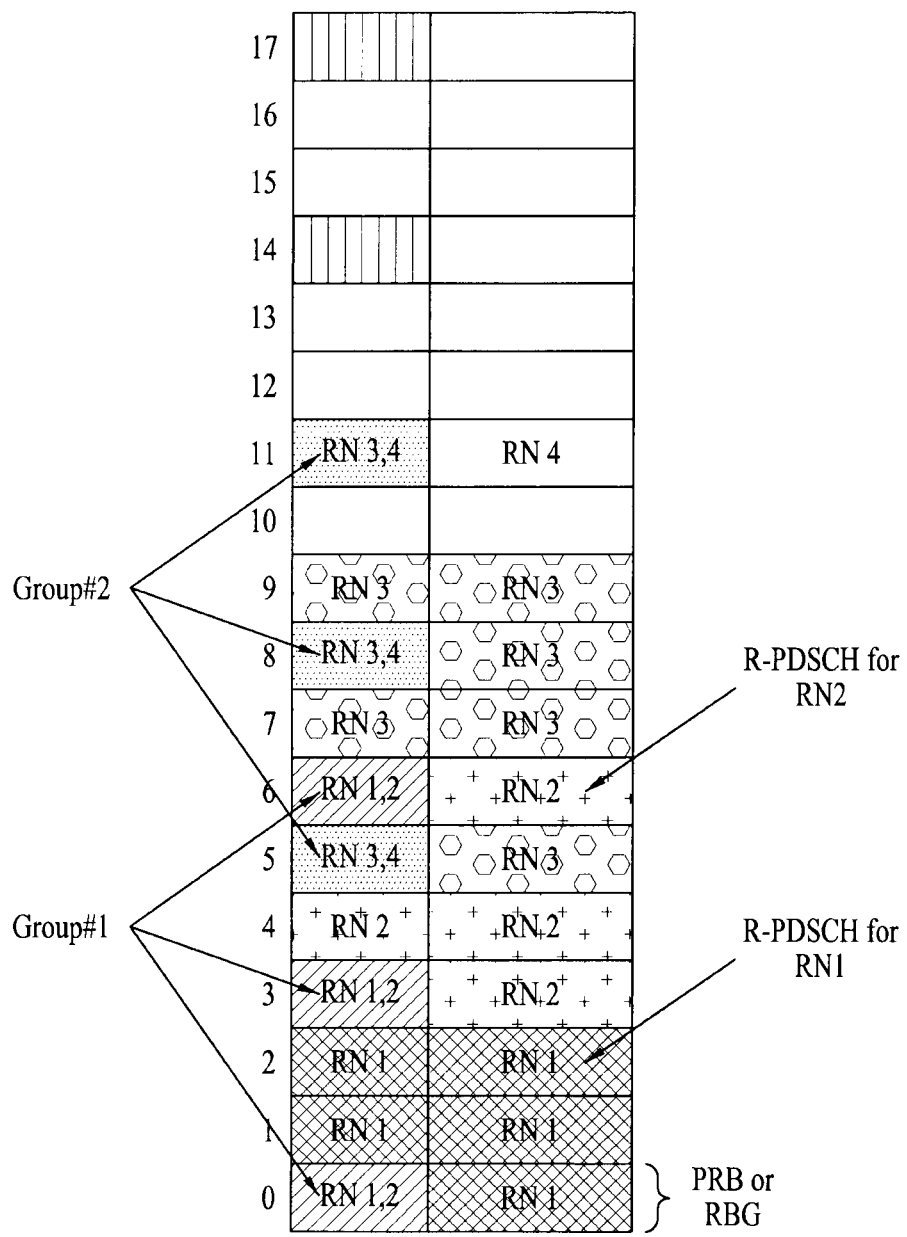
FIG. 19 illustrates an example of transmitting R-PDCCHs and R-PDSCHs.

FIG. 19 illustrates an example of transmitting R-PDCCHs and R-PDSCHs according to the above-described method.

In FIG. 19, it is assumed that there are 18 RBs (or RBGs) in total and a total SS is composed of RBs (or RBGs) #0, #3, #5, #6, #8, #11, #14 and #17 out of the 18 RBs (or RBGs). It is also assumed that R-PDCCHs are transmitted only in RBs (or RBGs) #0, #3, #5, #6, #8 and #11 in a specific subframe. For R-PDCCH reception, RN 1 and RN 2 are supposed to decode RBs #0, #3 and #6, and RN 3 and RN 4 are supposed to decode RBs #5, #8 and #11 in the illustrated case of FIG. 19. The number of RBs that an RN should search may be indicated by RN-specific signaling.

Referring to FIG. 19, RN 1 and RN 2 assume that their R-PDCCHs may exist in RBs (RBGs) #0, #3 and #6 in the first slot of the subframe. Based on this assumption, RN 1 and RN 2 may decode R-PDSCHs successfully in the second slot of the subframe and other RBs (RBGs). Further, if RN 1 and RN 2 can also be aware of areas carrying R-PDCCHs to RN 3 and RN 4, that is, RBs (or RBGs) #5, #8 and #11, RN 1 and RN 2 determine that R-PDCCHs may exist in the first slots of RBs (or RBGs) #5, #8 and #11 as well as in the first slots of RBs (or RBGs) #0, #3 and #6 in the subframe. Thus, the BS may allocate R-PDSCHs only to the second slots of the RBs (or RBGs) carrying the R-PDCCHs or leave the second slots of the RBs (or RBGs) carrying the R-PDCCHs empty. It may be also assumed that the other RBs (or RBGs) #10, #12, #13, #14, #15, #16 and #17 can carry R-PDSCHs to RN 1 and RN 2, starting from their first slots, if the R-PDSCHs are scheduled for RN 1 and RN 2.

Therefore, if an R-PDSCH is allocated to a PRB other than PRBs carrying R-PDCCHs, the R-PDSCH may be transmitted, starting from the first slot of the allocated PRB. On the other hand, an R-PDSCH is allocated to the second slot of a PRB pair that carries an R-PDCCH in its first slot.

For RN 1 and RN 2 to identify PRBs whose first slots are not available for R-PDSCH transmission, the BS may signal actual PRBs carrying R-PDCCHs of group #1 and group #2. In addition, the scheduler should not allocate R-PDSCHs for RNs of group #1 to PRBs carrying R-PDCCHs for group #2 (in their first slots). Instead, the scheduler should transmit R-PDSCHs, starting from the first slot, in PRBs other than PRBs carrying R-PDCCHs for the RNs of group #1 and group #2. RN decoding is also based on this assumption.

Therefore, an RN performs R-PDSCH decoding in a PRB pair, starting with the first slot, if the PRB pair does not carry an R-PDCCH. On the contrary, if the PRB pair carries an R-PDCCH, the RN does not attempt R-PDSCH decoding in the first slot of the PRB pair. This operation may be performed based on blind decoding, instead of signaling. To facilitate blind decoding, a unit (e.g. the number of RBs) in which the RN attempts decoding may be limited. For instance, if the RN fails to detect an R-PDCCH by blind decoding in one (e.g. 25 RBs) of candidate units, it may attempt blind decoding in a blind decoding RB area of the next size (e.g. 50 RBs). If the RN succeeds in the blind decoding, it may determine that an R-PDCCH exists in the RBs. In this case, the RN may assume that at least its R-PDCCH is not present in the other RBs, while it does not know whether any R-PDCCH exists in the other RBs. In addition, the RN assumes that its R-PDSCH exists in an RB or RBG indicated by RA information. Accordingly, the RN may perform R-PDSCH decoding, determining that an R-PDCCH may exist in the first slot of an R-PDCCH-detected SS. Meanwhile, if an RA bit (an RB or RBG allocation indicator) indicates the presence of data in an SS where an R-PDCCH has not been detected, the RN performs demodulation, determining that the first slot of the RB or the RBG does not have an R-PDCCH. In this case, the BS should allocate the data to an appropriate RB accordingly. In another method, an R-PDSCH for RN 1 of group #1 may be transmitted in an R-PDCCH area of group #2. It is natural on the part of RN 1 because RN 1 does not know the existence of group #2. However, since the BS can determine whether the R-PDSCH of RN 1 exists in the R-PDCCH area of group #2, the BS may schedule in such a manner that the R-PDSCH of RN 1 is not overlapped with R-PDCCHs of RN 3 and RN 4. Meanwhile, an RN determines the presence or absence of its R-PDCCH by blind decoding and performs R-PDSCH decoding according to the determination.

In the mean time, the BS may indicate RBs carrying an R-PDCCH to each RN. For example, the BS may indicate RBs carrying an R-PDCCH in their first slots from among RBs carrying R-PDSCHs. However, since the number of RBs that the BS should indicate to the RN is changed, a signaling format used to indicate the RBs is also changed.

SS Design Based on Multi-Level Blind Decoding

Figure 20:
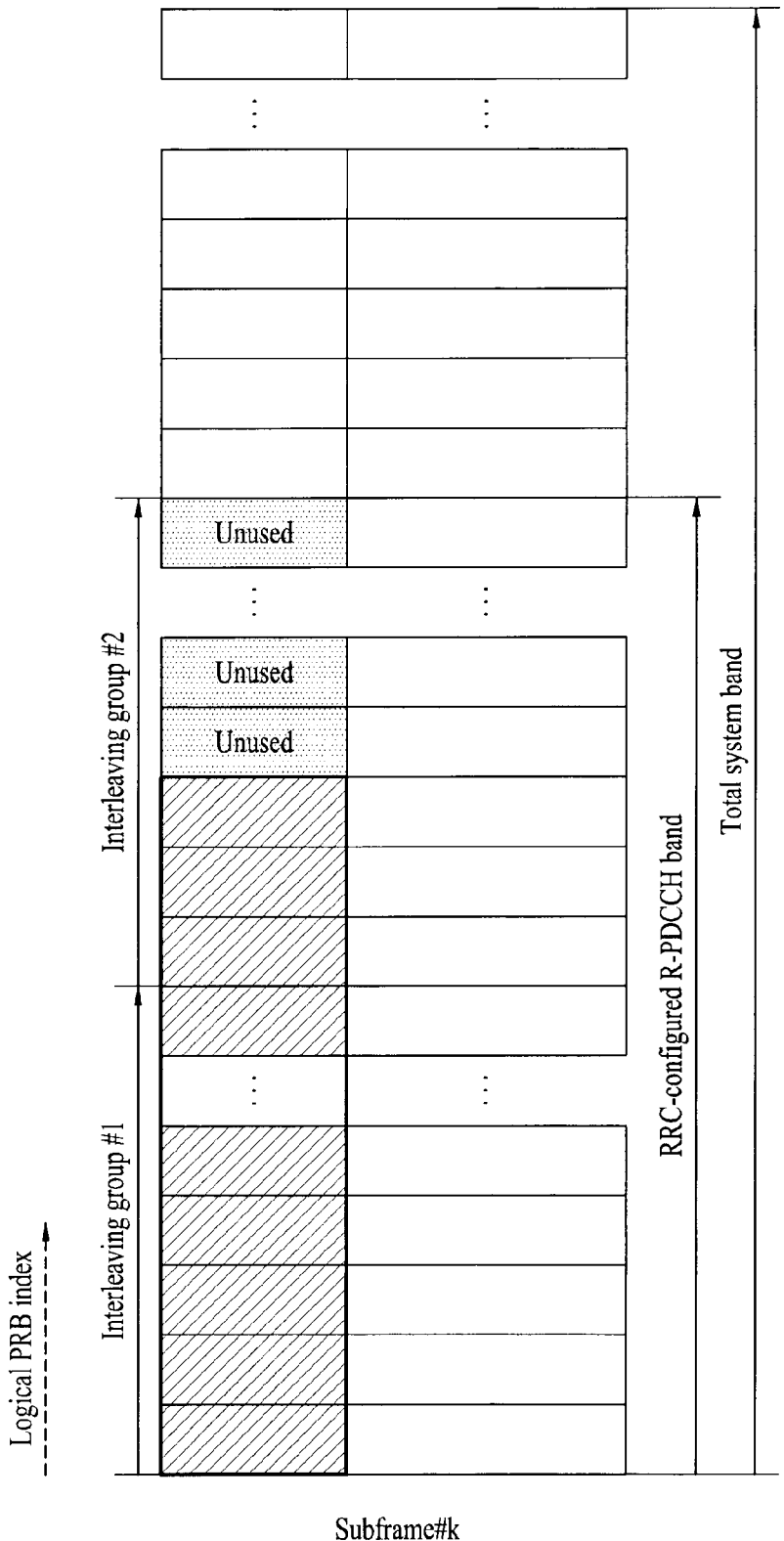
FIGS. 20 and 21 illustrate an example of configuring R-PDCCH Resource Blocks (RBs)
Figure 21:
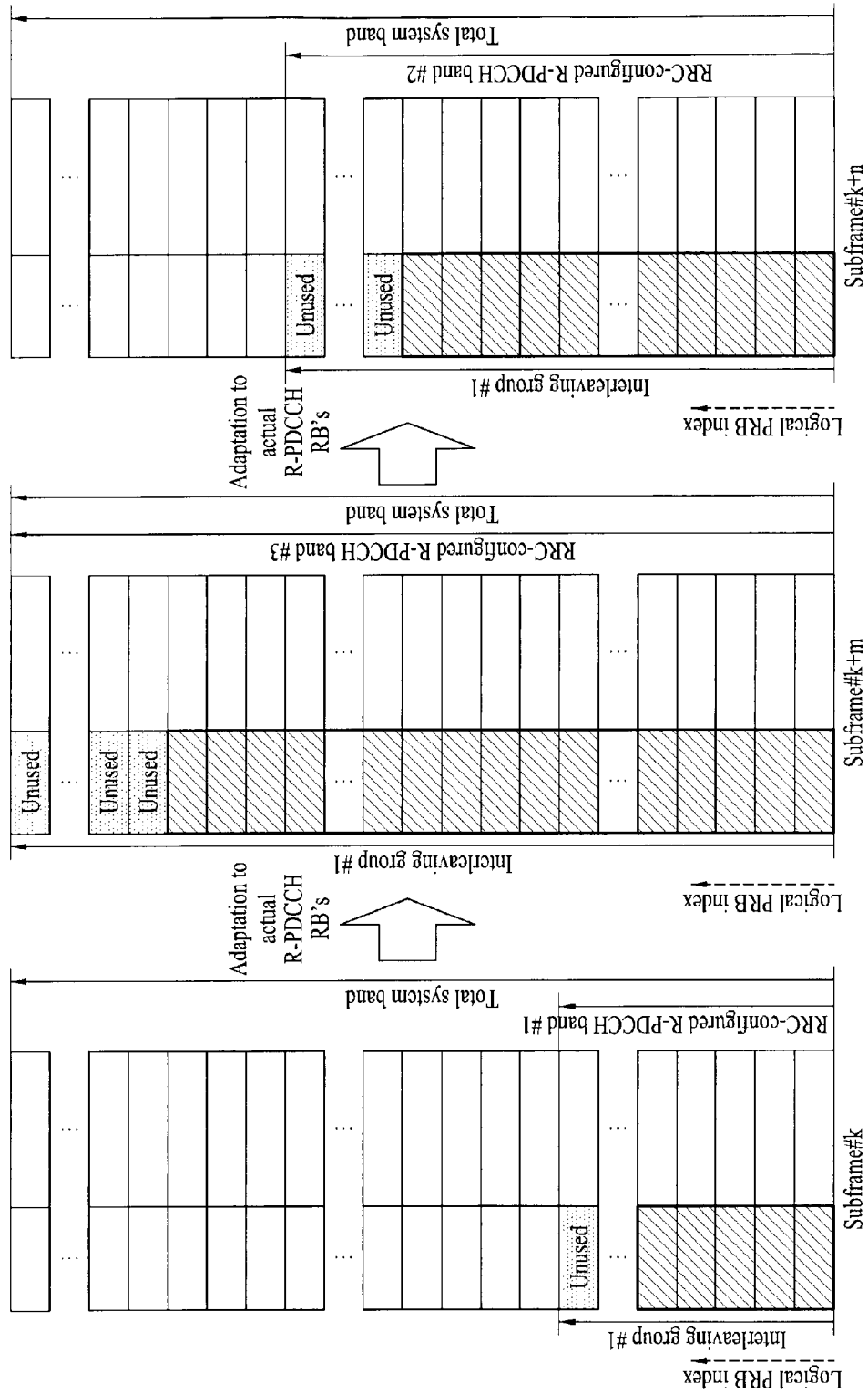

FIGS. 20 and 21 illustrate an example of configuring R-PDCCH RBs.

Referring to FIGS. 20 and 21, RBs carrying an R-PDCCH to an RN may be signaled semi-statically by RRC signaling and the R-PDCCH may be transmitted actually in part of the RBs. An actual resource area carrying an R-PDCCH may be identical to or different from an RRC-configured R-PDCCH area (an interleaving unit in most cases). In the latter case, the actual resource area carrying the R-PDCCH may be determined by blind decoding. Specifically, M RBs are set as a candidate R-PDCCH transmission set and the R-PDCCH is transmitted in an N RB subset (M≥N). Basically, a different subset may be set for each RN, while an R-PDCCH for one RN may be distributed across a plurality of subsets. The RN performs blind decoding on an aggregation level basis within the subset in order to receive an R-PDCCH. The problem is that because the RN does not know the positions of R-PDCCHs for other RNs, the BS transmits data in the remaining area except all positions at which R-PDCCHs are likely to be transmitted in the above-described candidate set or on the assumption that predetermined areas of RBs or RBGs allocated to R-PDCCHs are available or unavailable for data transmission. Herein, full interleaving or partial interleaving is applicable.

Full interleaving refers to interleaving R-PDCCHs of all RNs according to an interleaving unit and then mapping the interleaved R-PDCCHs to PRBs, whereas partial interleaving refers to joint interleaving only R-PDCCHs of some RNs. On the part of an RN, if a single R-PDCCH interleaving area is to be monitored, it may determine full interleaving. If a plurality of R-PDCCH interleaving areas are included in a monitoring set, the RN may determine partial interleaving. Therefore, the terms may have different meanings on the parts of a BS and an RN.

However, it may often occur that after interleaving, an R-PDCCH of a specific RN is not mapped uniformly to an R-PDCCH RB set in a total band (e.g. a system band) or a partial band. That is, if an interleaver unit is 4 REs (e.g. an REG), an R-PDCCH having 36 REs (e.g. 1 CCE) may be mapped uniformly to 9 RBs (4 REs per RB). However, if the R-PDCCH should be mapped to 9 or more RBs, some RBs of the R-PDCCH subset may not include even a part (e.g. 4 REs) of the R-PDCCH of the RN. In this case, this R-PDCCH area cannot be used to deliver an R-PDSCH even though it does not include the R-PDCCH, like an R-PDCCH RB. That is, none of the RNs of an RN group subject to joint interleaving can use the RBs of an R-PDCCH subset in receiving an R-PDSCH.

To avoid this resource waste, the interleaving range (e.g. a band or RBs) of an RN group is set to match the amount of resources (e.g. the size of a band or the number of RBs) that can be allocated or used for all RNs of the RN group after interleaving. While the two sizes may not be perfectly equal, an extra band or extra RBs are preferably minimized. For instance, if four R-PDCCHs each having one RB should be transmitted to four RNs, the four R-PDCCHs may be mapped to four RBs after interleaving. In this case, four consecutive logical indexes may be assigned to the R-PDCCHs. However, four PRB indexes for the R-PDCCHs may be apart from one another by a predetermined interval (e.g. 3 or 4 RBs as an RBG size unit). Herein, the interval is determined according to an RBG size. Thus, the R-PDCCH PRB indexes may be non-contiguous (e.g. 0, 4, 8 . . . ). As a consequence, the four R-PDCCHs are transmitted across 4 RBs. If 7 R-PDCCHs are to be transmitted to 7 RNs, each to one RN, but the basic interleaving unit is a multiple of 4 RBs, a total of 8 RBs may be reserved for the 7 R-PDCCHs. Then, resources corresponding to the REs of one RB may be wasted. Nonetheless, the proposed method can reduce the resource waste remarkably, compared to the afore-described method. Setting of the basic interleaving unit such as 4 serves the purpose of reducing the number of blind decodings, as described later. Blind decoding may be performed in two methods: one is to blind-decode 4 RBs and then blind-decode the next 4 RBs that do not overlap with the previous 4 RBs and the other is to blind-decode RB #0 to RB #3 (4 RBs) and then blind-decode RB #0 to RB #7 (8 RBs).

On the assumption that 8 R-PDCCHs each having one CCE are transmitted to 8 RNs, each R-PDCCH to one RN (one CCE corresponds to the number of available REs in the first slot of a PRB pair, for example), a total of 8 RBs are required and interleaving is performed on an 8-RB basis. In this scheme, the BS does not indicate a (partial) interleaving band/depth to the RNs. Instead, it is known to the BS and the RNs that if a minimum interleaving unit is 4 RBs, the interleaving band/depth is defined as a multiple of 4 RBs. Under this setting, each RN performs blind decoding on the minimum unit, that is, on 4 RBs (first-step blind decoding). If the RN fails to detect an R-PDCCH, it may double the interleaving band/depth to 8 RBs and thus perform blind decoding on 8 RBs (second-step blind decoding). If the RN succeeds in blind decoding for the interleaving band/depth, the RN completes the band/depth search. On the contrary, if the RN fails in blind decoding for the interleaving band/depth, the RN proceeds to the next R-PDCCH aggregation level search step. In this manner, R-PDCCHs are interleaved in units of a minimum required amount of resources and mapped to PRBs. Then each of the RNs performs blind decoding on R-PDCCH resources with contiguous logical indexes within a basic blind decoding range B1 (e.g. 4 CCEs) after deinterleaving. If the RN fails in the blind decoding, it performs blind decoding in an increased bandwidth, that is, a widened blind decoding range B2 (e.g. 8 CCEs). Thus, the RN can decode an R-PDCCH successfully. The blind decoding of the blind decoding ranges B1 and B2 is done to determine an interleaving depth, not an aggregation level. The basic granularity B1 may be set to various values such as 1, 2, 3, 4, . . . and the blind decoding range B2 may be given as a multiple of B1 or the sum of B1 and a predetermined value.

An interleaver row size may vary with the size of an R-PDCCH to be transmitted/interleaved. While it is preferred to keep an interleaver column size unchanged, it is possible to change the interleaver column size within a given number of columns sizes such as 8, 16, and 32. The interleaver column size may be indicated by higher-layer signaling. Since the granularity with which the interleaver band/depth is changed is larger than 1, as many interleavers as the number of RBs in a system band are not required. For example, if an interleaving size granularity is 16 RBs in a 96-RB system, about 6 interleaver sizes may be sufficient.

To reduce the number of interleavers to be designed, the following method may further be contemplated. For example, if an interleaver size is 4 and R-PDCCHs are to be transmitted with a band/depth of 8 RBs, two 4-RB interleavers may be concatenated. That is, since the R-PDCCH band is 8 RBs, two 4-RB interleavers can be used. In this manner, a system can be implemented only with a single interleaver. As stated before, it is possible to change an interleaver row size, while fixing an interleaver column size, or vice versa.

Importantly, the size of R-PDCCHs to be transmitted determines the actual transmission band/depth (e.g. 7 RBs) of the R-PDCCH. In this case, the BS selects the smallest interleaving band/depth (e.g. B1×2=8 RBs) including 7 RBs and transmits the R-PDCCHs using the selected interleaving band/depth. On the other hand, an RN performs blind decoding by increasing an interleaving band/depth or its index, starting from a basic interleaving band/depth, until an R-PDCCH is finally detected. Another feature is to use a variable interleaver size. Alternatively or additionally, a basic interleaver size is defined and interleavers each having the basic interleaver size are concatenated, for interleaving.

Figure 22:
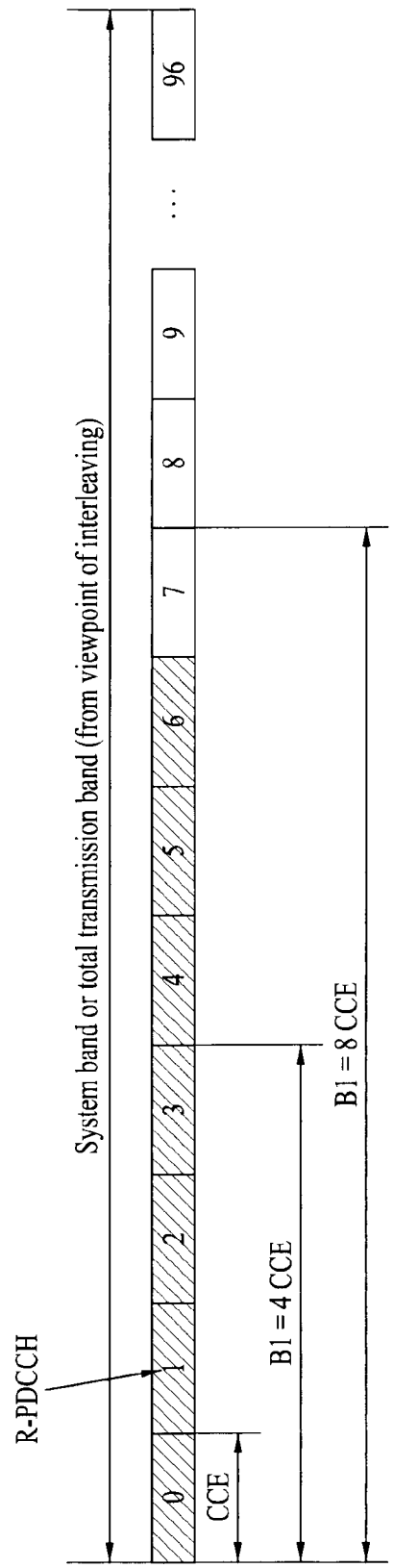
FIGS. 22, 23 and 24 illustrate exemplary operations for transmitting an R-PDCCH and performing associated blind decoding according to whether interleaving is applied to the R-PDCCH.

FIG. 22 illustrates a case where an interleaving depth is not applied. Each box is a logical representation of CCE resources in the first slot. A CCE may be defined as 9 REGs or available REs in the first slot of a PRB pair. Referring to FIG. 22, an R-PDCCH is mapped to one or more CCEs according to a CCE aggregation level.

Figure 23:
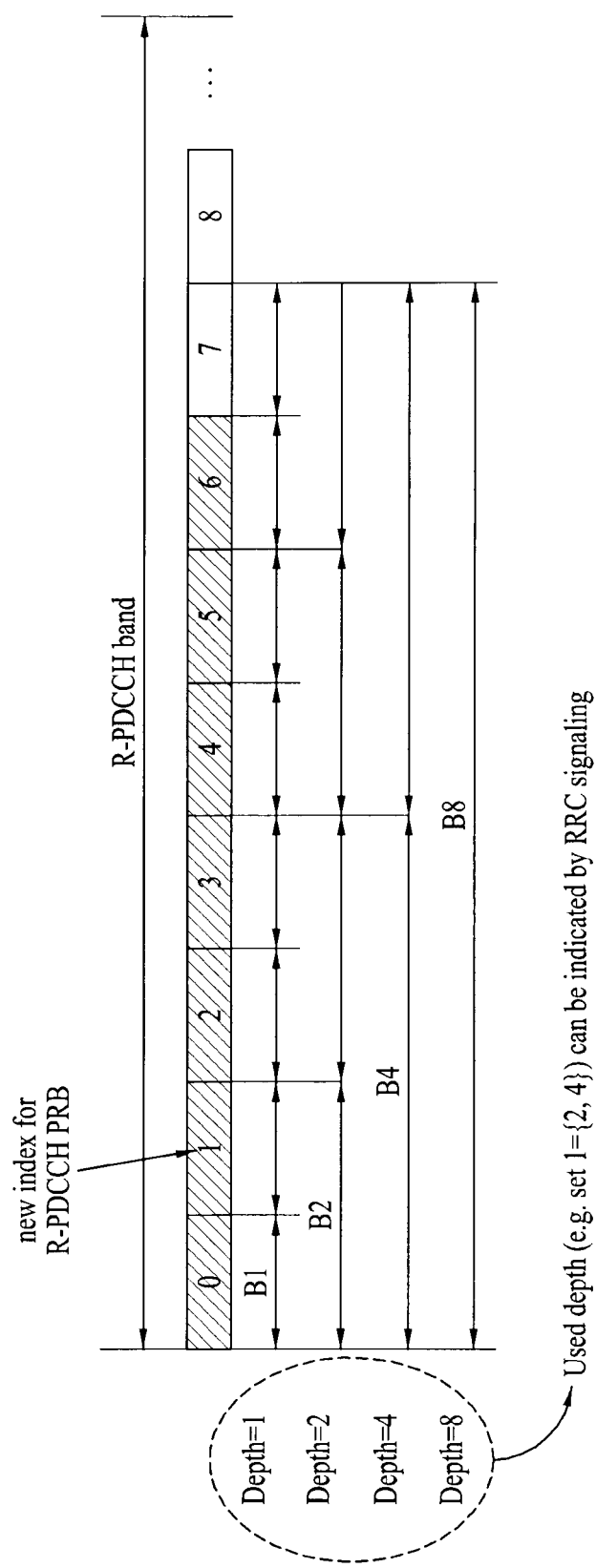

FIG. 23 illustrates a case in which an interleaving depth is applied according to the present invention.

Referring to FIG. 23, an RN performs blind decoding to determine an interleaving depth. That is, the RN may perform blind decoding in blind decoding ranges B1, B2, B4 and B8 sequentially until it detects an R-PDCCH. If the RN fails in blind decoding in the blind decoding ranges B1, B2, B4 and B8, the RN repeats the same operation for the next aggregation level. On the assumption that the RN succeeds in blind decoding of an R-PDCCH in the blind decoding range B2, the RN performs R-PDSCH demodulation, determining that an R-PDCCH exists in any RB of B2. That is, the RN assumes that no R-PDSCH exists in any slot of the blind decoding range B2 including the first slot of an RB in which the R-PD- CCH has been detected, for R-PDSCH demodulation. On the other hand, the RN does not assume the presence of an R-PDCCH outside the blind decoding range B2. Therefore, the RN performs R-PDSCH demodulation in allocated RBs, considering that RBs indicated by the BS (the remaining area) do not have an R-PDCCH. Obviously, an R-PDCCH may exist in the remaining area. However, as an R-PDSCH is allocated to an RB that does not carry an R-PDCCH, the RN can accurately demodulate the R-PDSCH without impairing the assumption set for RN R-PDSCH demodulation (i.e. the absence of an R-PDCCH in the first slot of the allocated RB).

Figure 24:
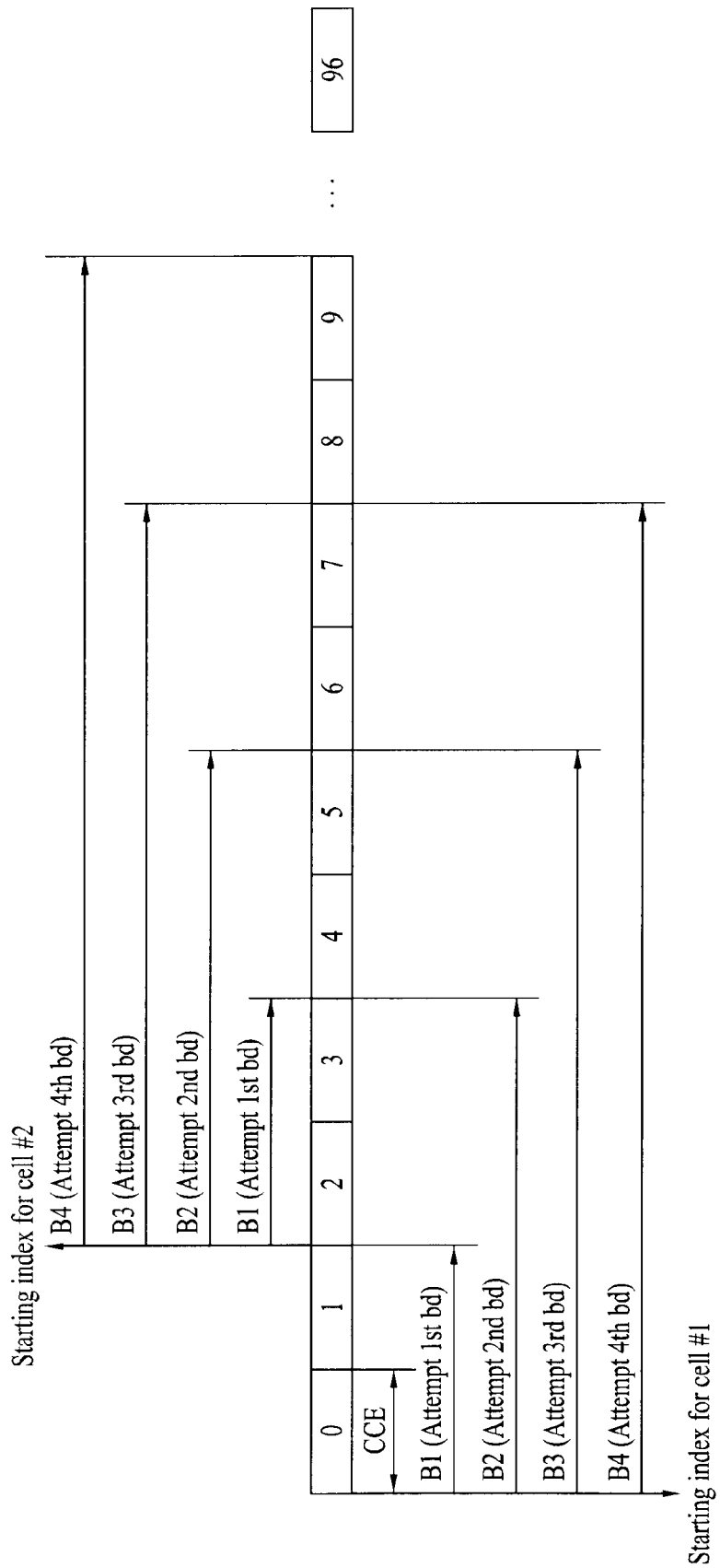

FIG. 24 illustrates multi-level blind decoding.

Referring to FIG. 24, an RN performs blind decoding for interleaving depth B1. If the RN fails in detecting an R-PDCCH based on interleaving depth B1, the RN performs blind decoding for interleaving depth B2. Similarly, the RN increases the interleaving depth until it succeeds in blind decoding. While interleaving randomizes inter-cell interference, interference can be further mitigated by setting a different blind decoding starting position for each cell. In FIG. 24, cells may differ in a blind decoding starting position and a blind decoding depth Bi (i=1, 2, 3, . . . ). For example, there is no need for setting a cell-specific blind decoding starting position in units of B1. A blind decoding starting offset may set for a cell according to the level of interference. In case of a 3-cell structure, an offset may be set to a system band/3. While Bi values are shown to widen a blind decoding area in one direction with respect to a starting point, the blind decoding area may be extended in both directions from a starting index. Especially without interleaving, such an offset may minimize interference. If the same starting index is set for each cell, an offset may be applied to an interleaver for each cell. That is, an interleaver offset may be set according to a cell ID or a cell-specific value so as to achieve a different interleaving result for each cell.

A change of an interleaver size amounts to a change of a row×column value. If the number of columns is given, the number of rows may be changed or vice versa. The interleaver size may be changed according to the total number of REGs in a PRB to which an R-PDCCH is mapped. For example, on the assumption that each RB includes 8 REGs in the first slot of a subframe and a total frequency band is 20 MHz (i.e. 100 RBs), there are 800 REGs in total (=8 REGs×100 RBs). Typically, all of the REGs are not defined as an SS. In this case, interleaved REG indexes are achieved by inputting 800 REG indexes to an interleaver with 32 columns, subjecting the REG indexes to column permutation, and reading the permuted REG indexes column by column. If the number of REGs for an SS is reduced to 400, the indexes of the REGs may be interleaved by reducing the number of rows, while the number of columns is maintained in the interleaver. In this sense, the interleaver may be referred to as a variable interleaver.

Meanwhile, if a UL grant SS is configured independently in the second slot of the subframe, the above-described proposed method may also be applied to the second slot.

Figure 25:
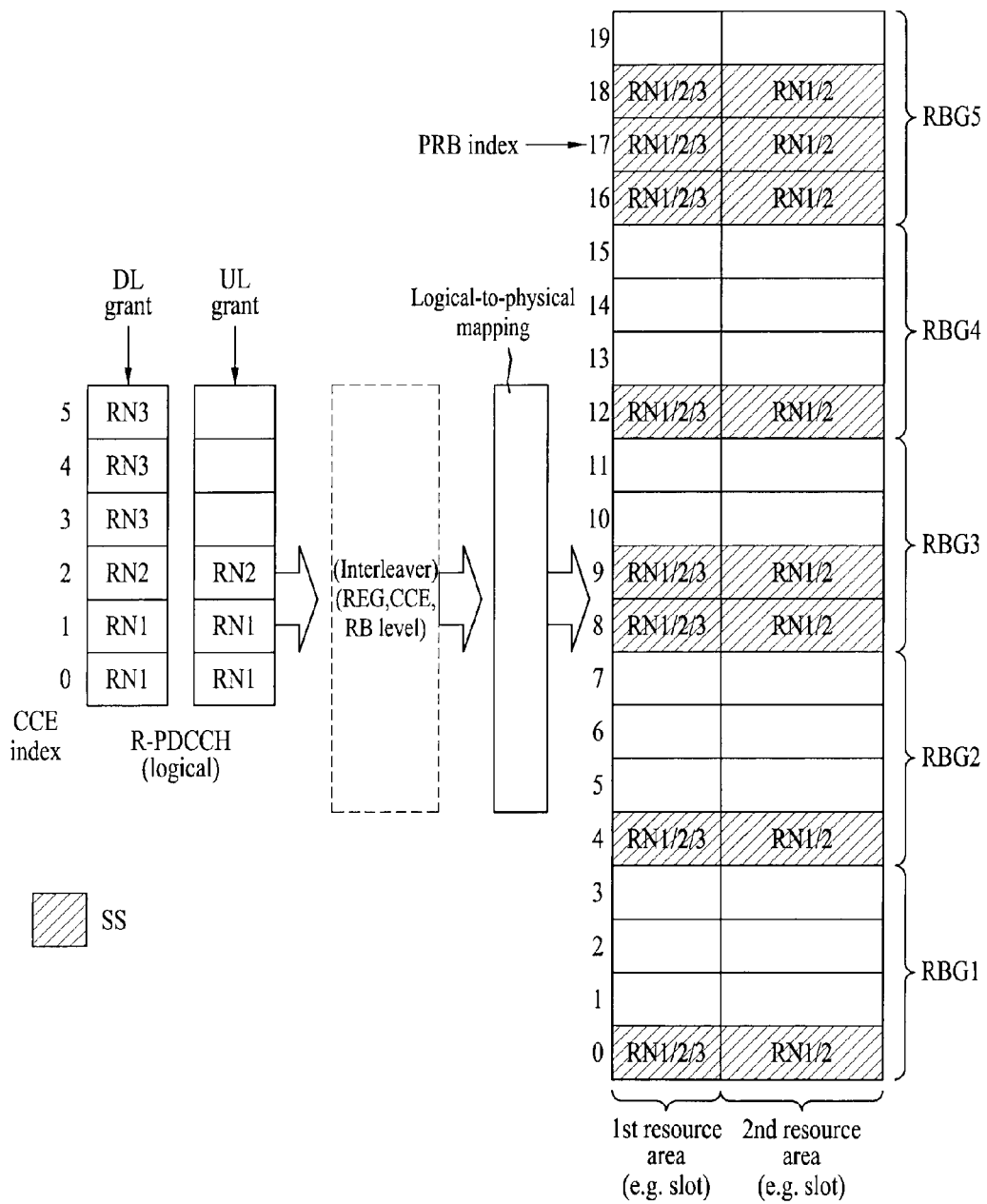
FIG. 25 illustrates an exemplary operation for mapping R-PDCCHs to PRBs.

FIG. 25 illustrates an example of mapping R-PDCCHs to PRBs. More specifically, FIG. 25 illustrates an operation for mapping logical R-PDCCH indexes (e.g. CCE indexes, REG indexes, or interleaving unit indexes) to PRBs through an interleaver. Interleaving may be performed only when needed. The R-PDCCH-to-PRB mapping is performed under the following conditions.

Interleaver size (the following features are applicable to every afore-described interleaver).

Only the column size is fixed, while the row size is variable.

Or a few values may be available as the column size. The column size may depend on a bandwidth.

Column permutation may be performed.

Interleaver On/Off

The interleaver may be used or not according to a transmission mode/configuration.

The interleaver is basically off. The interleaver may be activated or deactivated (on or off) by higher-layer signaling.

For DM RSs, the interleaver is off all the time. For CRSs, the interleaver is on all the time.

R-PDCCHs are mapped to PRBs at predetermined positions in an SS reserved for R-PDCCH transmission (i.e. an R-PDCCH SS). If interleaving is off, an R-PDCCH is mapped in units of a basic unit (e.g. a CCE) or, in other words, an R-PDCCH unit. If interleaving is on, the R-PDCCH is mapped in units of an REG or, in other words, an interleaving unit and arranged at predetermined REG indexes. Therefore, if interleaving is on, one R-PDCCH (e.g. a DL grant) is distributed to a plurality of PRBs.

Referring to FIG. 25, DL grant interleaving/mapping and UL grant interleaving/mapping may be performed independently. For example, a DL grant may be mapped to the first slot of a PRB pair, while a UL grant may be mapped to the second slot of the PRB pair. In the illustrated case of FIG. 25, while DL grants are transmitted to RN 1, RN 2 and RN 3, UL grants may be transmitted only to RN 1 and RN 2. Then, the DL grants are interleaved and mapped to a plurality of PRBs, and the UL grants are also interleaved and mapped to a plurality of PRBs. As illustrated in FIG. 25, the R-PDCCH SS is preferably configured in PRB pairs irrespective of interleaving on/off. That is, it is preferred to configure the same RB sets for DL grants and UL grants (i.e. the same DL and UL SSs) irrespective of interleaving on/off.

In the presence of a DL grant in the first slot of a PRB pair, it may be necessary to indicate the use state of the second slot of the PRB pair (e.g. a UL grant, an (R-) PDSCH, empty, etc.). Thus, when a DL grant is positioned in the first slot of a PRB pair, the presence or absence of an R-PDSCH in the second slot of the PRB pair may be indicated by means of an RA bit. In this case, an R-PDCCH for one RN resides preferably in one RBG. However, when the R-PDCCH is interleaved, it is distributed to a plurality of PRBs, thereby making it difficult to use an RA bit reliably. Accordingly, even though a UL grant is transmitted only to one of RNs for which R-PDCCHs are jointly interleaved, the BS should notify the RNs whether a UL grant is present in each of individual RBs to which interleaved UL grants are mapped.

For instance, even though the BS does not transmit a UL grant to RN 3, it should signal the state of the second slot to RN 3 if a UL grant SS is defined in a resource area allocated to an (R-)PDSCH for RN 3, because the BS transmits jointly interleaved UL grants of RN 1 and RN 2 in the second slot. The use state of the second slot may be signaled by higher-layer signaling (e.g. RRC signaling) or physical-layer signaling. Because the BS has knowledge of the presence or absence of an interleaved R-PDCCH in an RB or RBG allocated to the (R-)PDSCH of RN 3, the BS rate-matches the (R-)PDSCH, taking into account an area having an R-PDCCH. One thing to note herein is that when RN 3 decodes the R-PDCCH area, it should know the presence or absence of an R-PDCCH and thus the use state of the second slot needs to be signaled to RN 3. It may be further contemplated as another embodiment that areas of interleaved R-PDCCHs are always empty in the second slot, for system simplification. Specifically, RN 3 decodes a downlink signal on the assumption that the second slot of a DL SS is all a UL SS or is free of an (R-)PDSCH, and the BS schedules based on the same assumption.

Multiplexing of Backhaul DL Data

If R-PDCCHs are interleaved for a plurality of RNs, this implies that DL/UL grants of the RNs are interleaved. Thus, PRBs of RBGs carrying the DL grants need to be allocated carefully. In other words, collision between RN data (e.g. (R-)PDSCHs) should be considered for PRBs other than R-PDCCH PRB pairs and collision between data and UL grants should be considered for the second slots of the R-PDCCH PRBs.

First, a case where an RA bit for a specific RBG carrying a DL grant is set to 0 will be considered. In this case, it is preferred that the BS does not use any of the remaining PRB(s) of the RBG in order to avoid collision between data transmitted to RNs. Although it is possible to allocate a remaining PRB pair of the RBG to another RN, each RN sharing the interleaved DL grant cannot determine whether the PRB pair is used for another RN.

In the case where an RA bit for an RBG carrying a DL grant is set to 1, an RN expects the RBG to include data. The second slot of an R-PDCCH PRB pair may serve two usages depending on whether the second slot is designated as a UL grant SS or not. If the second slot of a PRB pair carrying a DL grant in its first slot is designated as a UL grant SS by higher-layer signaling, data transmitted in the second slot of the PRB pair is highly vulnerable to interference caused by a UL grant for another RN. That is, because an RN (RNs) is likely to receive a UL grant in the second slot of the R-PDCCH PRB pair, it is necessary not to allocate data to another RN in the second slot of the R-PDCCH PRB pair to avoid collision between the UL grant and the data. On the other hand, if the second slot of the R-PDCCH PRB pair is not designated as a UL grant SS, data can be transmitted to the RN in the second slot of the R-PDCCH PRB pair.

Accordingly, resources may be allocated in the following manner. When an RA bit for an RBG carrying a DL grant is 0, a PRB (PRBs) other than a PRB carrying the DL grant is not used for data transmission in the RBG. On the contrary, if an RA bit for an RBG carrying a DL grant is 1, a non-R-PDCCH RBG pair in the RBG is used for RN data transmission, whereas the second slot of an R-PDCCH PRB pair is not used for RN data transmission. In another method, if an RA bit for an RBG carrying a DL grant is 1 and the second slot of an R-PDCCH PRB pair is designated as a UL grant SS in the RBG, the second slot of the R-PDCCH PRB pair is not used for data transmission. In any other case, the second slot of the R-PDCCH PRB pair is used for data transmission.

FIG. 26 illustrates an example of the afore-described resource allocation. The example is based on the assumption that DL grants for two RNs, RN 1 and RN 2 are interleaved and allocated to R-PDCCH PRBs of at least two RBGs. For the convenience' sake, RA bits for first and second RBGs are assumed to be 0 and 1, respectively. In Case 1, the RBGs include at least part of a UL grant SS, and in Case 2, the RBGs do not include a UL grant SS. The rule of allocating one RN per RBG and configuring an RBG into PRB pairs in an SS is also applicable even when interleaving is used.

Upon detection of a DL grant in the first slot, an RN can identify an RB or RBG allocated to it based on the relationship between the CCE index of an R-PDCCH and a PRB. In this case, the RN can determine whether data is present in the second slot by interpreting an RB or RBG RA bit associated with the PRB. For example, if CCEs are mapped to RBGs at 1:1 or at A:B, the RN detects a CCE index and locates its PRB using the CCE index. Then, the RN can determine the presence or absence of data in the second slot using an RA bit for the PRB. For instance, if a UL grant is present in the second slot, the RA bit may indicate no data. The other PRB pairs except for the PRB in the RBG can be used for R-PDSCH transmission.

Figure 27:
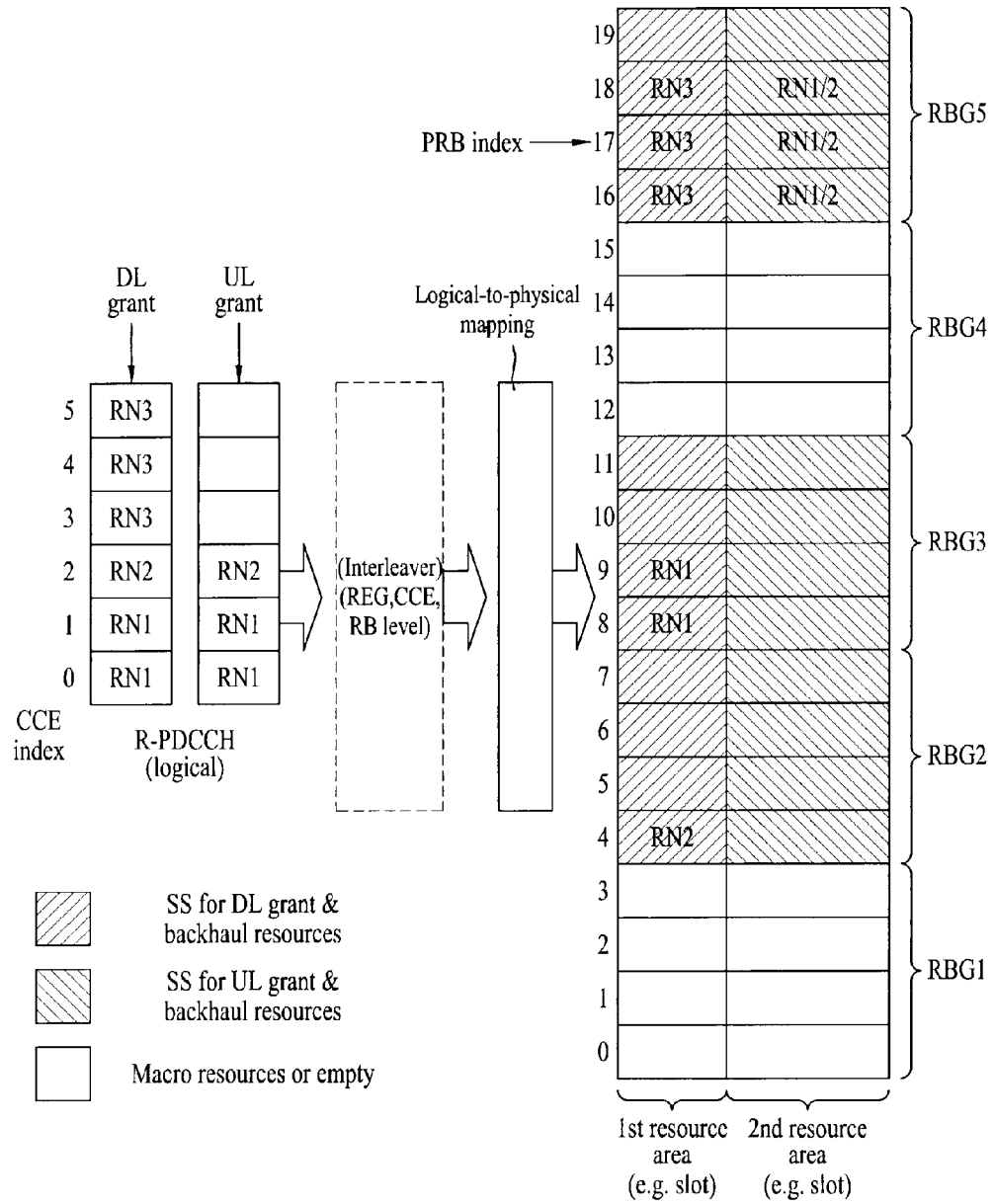
FIG. 27 illustrates exemplary R-PDCCH mapping in case of interleaving-off.

FIG. 27 illustrates an example of R-PDCCH mapping in case of interleaving-off. When interleaving is off, an R-PDCCH for each RN is mapped on a CCE or slot basis without interleaving. If an R-PDCCH aggregation level increases, the number of PRBs for an R-PDCCH increases within the same RBG. The aggregation levels of 2, 1 and 3 are set for RN 1, RN 2 and RN 3, respectively in FIG. 27. If the aggregation level of an RN exceeds the number of RBs set as an SS, it may be extended to another SS RBG. For instance, given one RB per RBG as an SS, if the aggregation level is 4, the RN may achieve one R-PDCCH by performing blind decoding over 4 RBGs.

Within a backhaul RBG allocated for an R-PDCCH SS, the first RB may be used as the R-PDCCH SS, basically. Since different backhaul resources may be allocated according to a channel state over time, a change in an SS is indicated preferably by RRC signaling. For example, if an RBG includes 4 RBs, an R-PDCCH SS may be configured with up to 4 RBs per RBG. If an RBG includes 3 RBs, an R-PDCCH SS may be configured with up to 3 RBs per RBG. However, if only CCE aggregation levels 1 and 2, not 3 are available, only 2 RBs per RBG may be designated as part of an R-PDCCH SS. FIG. 27 illustrates an example in which 4 RBs of an RBG are all designated as R-PDCCH transmission candidates on the assumption that each RBG includes 4 RBs and a CCE aggregation level of 4 is supported. In the illustrated case of FIG. 27, RN 2 detects a DL grant from the first PRB of RBG 2, PRB #4 by blind decoding in an indicated R-PDCCH SS (RBG 2, RBG 3 and RBG 5).

In fact, every RBG used as backhaul resources may correspond to an SS. Accordingly, RBGs set as a backhaul resource area may be naturally set as an SS. Alternatively, only some RBGs of the backhaul resources may be set as an SS. Depending on real implementation, frequency resources (e.g. RBGs) may be allocated to an SS in various manners. For instance, if the indexes of resources allocated for backhaul communication are uniformly distributed such that the indexes of the frequency resources are odd-numbered, then even-numbered, and so on, an SS may be configured only with odd-numbered or even-numbered backhaul resources. It is also possible to configure an SS with every Nth frequency resource, starting from a frequency resource corresponding to a predetermined starting offset.

SS Configuration Patterns and Signaling

Figure 28:
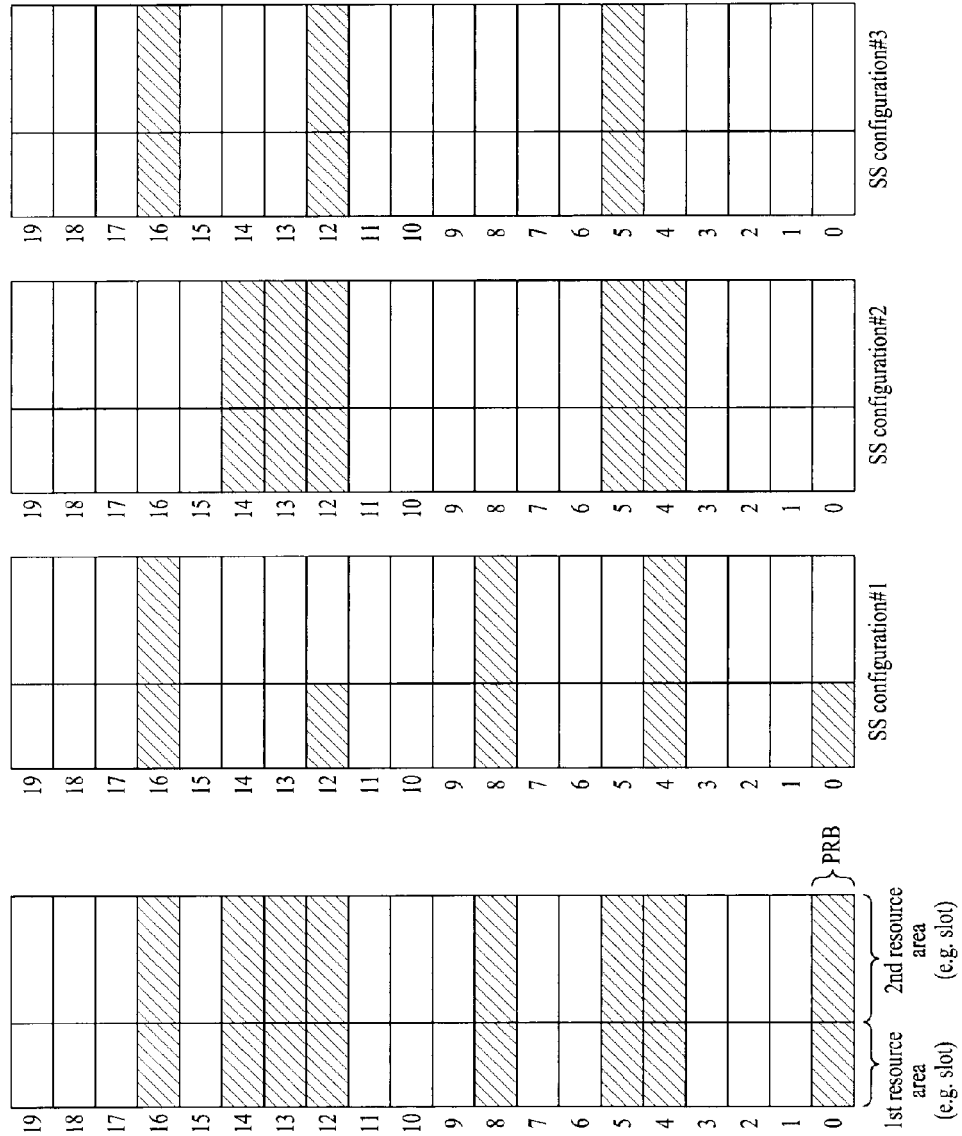
FIG. 28 illustrates an example of configuring different Search Space (SS) RBs or different SS RB Groups (RBGs) over time.

FIG. 28 illustrates an example of configuring different SS RBs or different SS RBGs over time. Since the frequency positions of backhaul resources may change over time, for the purpose of a frequency-selective scheduling gain, different SS RBs or different SS RBGs may be configured according to the changed backhaul resources. An SS may be always configured in units of a PRB pair. In this case, the same mapping area may be set for an interleaved or non-interleaved R-PDCCH (e.g. a DL grant) in the first slot and an interleaved or non-interleaved R-PDCCH (e.g. a UL grant) in the second slot. That is, a DL grant SS and a UL grant SS may be identical. Preferably, the DL grant SS and the UL grant SS may be identical only in non-interleaving mode. In addition, the UL grant mapping area of the second slot may be equal to or smaller than the DL grant mapping area of the first slot. This means that the UL grant mapping area may be a subset of the DL grant mapping area.

Referring to FIG. 28, a reference SS configuration is shown at the leftmost side. The reference SS configuration is an arbitrarily defined basic SS configuration. Depending on implementations, a reference SS configuration may not be defined separately. In this example, an SS may change over time, cell-specifically, RN group-specifically, or RN-specifically. As illustrated in FIG. 28, when an SS configuration set includes SS configuration #1, SS configuration #2 and SS configuration #3, one of the SS configurations may be signaled to thereby change an existing SS configuration. The SS configuration may be changed semi-statically by higher-layer signaling (e.g. RRC signaling) or dynamically by physical-layer signaling.

If an SS is limited to one PRB (pair) per RBG, the PRB (pair) may be at any position in an RBG. However, considering RS-based demodulation, the middle RB of an RBG is preferable for the SS to achieve better performance. For example, if an RBG includes 3 RBs, the second RB may be used for the SS. Similarly, if an RBG includes 4 RBs, the second or third RB may be used for the SS. In this case, although the SS may be fixed to the second or third RB, an RB used as the SS is preferably signaled to thereby adapt the SS to an environment change. An RB used for an SS may be changed semi-statically by higher-layer signaling (e.g. RRC signaling) or dynamically by physical layer signaling.

For an SS configuration, the following information may be signaled.

1. Signaling of DM RS-based demodulation or CRS-based demodulation.
2. Signaling of interleaving mode or non-interleaving mode.
3. Signaling of the position of an SS RB in an RBG: e.g. for 4 RBs in an RBG, 1, 2, 3, or 4 among four positions is indicated.
4. Signaling of one of relay backhaul resource areas or boundaries: e.g. one of candidate boundaries is signaled.

While the above signals may be transmitted separately, they may be transmitted together in specific fields of the same RRC signal.

SS Configurations Based on RA Types

An R-PDCCH SS may be configured according to an RA type as follows. As described before with reference to FIGS. 7, 8 and 9, RA Types 0, 1 and 2 are defined in legacy LTE. A description will first be given of RA Type 2.

FIGS. 29 and 30 illustrate examples of configuring an R-PDCCH SS according to RA Type 2. In FIGS. 29 and 30, DVRBs are illustrated. Referring to FIGS. 29 and 30, the concept of an RBG subset may be introduced to RA Type 2, for an SS configuration, like RA Type 1 of legacy LTE. An R-PDCCH SS may be configured within the same RBG subset from among resources allocated by RA Type 2. For example, if PRBs #0, #1, #2, #3, #16, #17, #18 and #19 form subset #0, an SS is configured preferably within the area of subset #0. Likewise, if PRBs #4, #5, #6, #7, #20, #21, #22 and #23 form subset #1, an SS is configured preferably within the area of subset #1.

Figure 31:
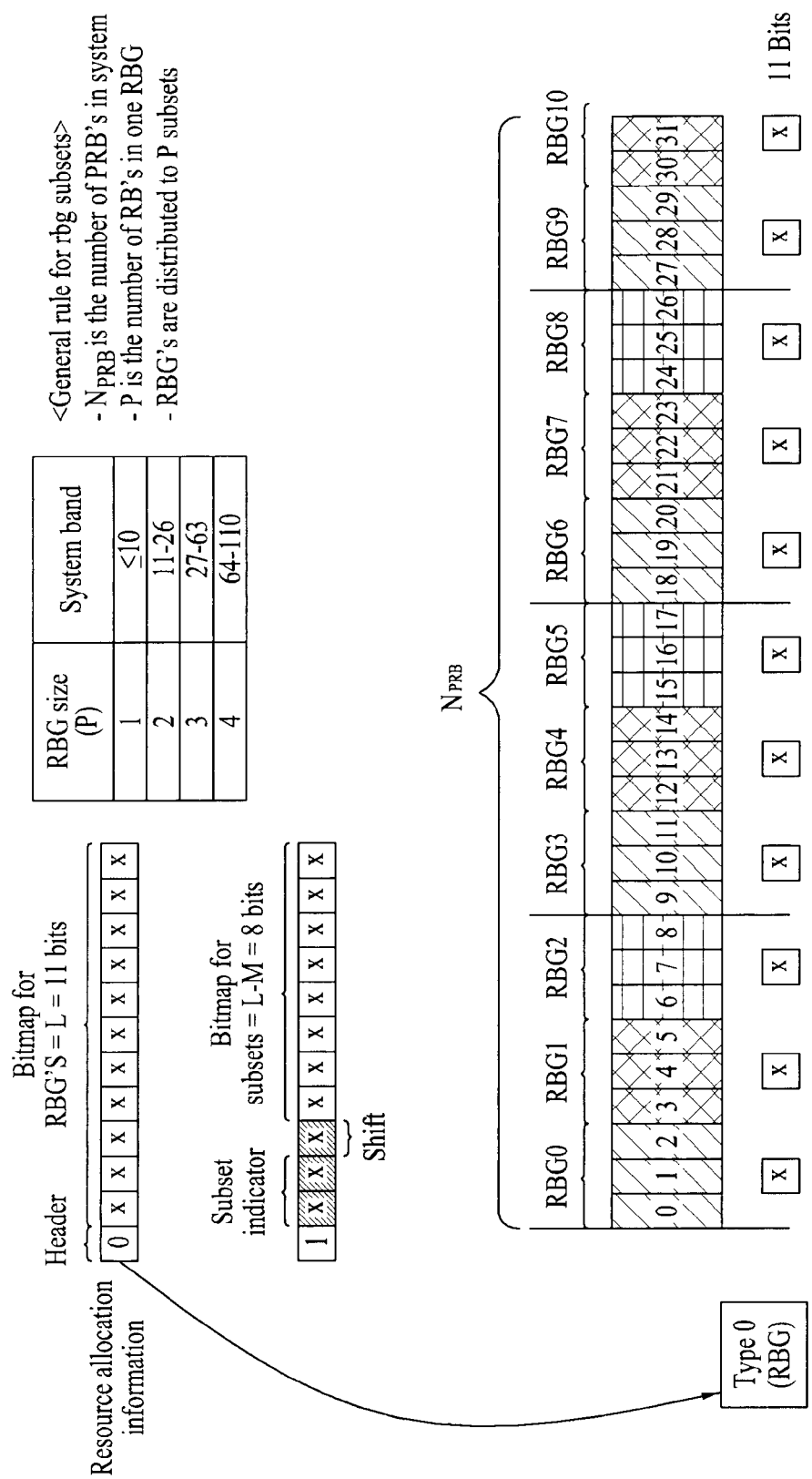

FIG. 31 illustrates an example of configuring an R-PDCCH SS according to RA Type 0.

Referring to FIG. 31, only the concept of an RBG is used but the concept of an RBG subset is not explicitly defined, in RA Type 0. Nonetheless, for an SS configuration, a BS/RN may regard RBGs #0, #3, #6 and #9 as subset #0, RBGs #1, #4, #7 and #10 as subset #1, and RBGs #2, #5 and #8 as subset #2. As described before, it is preferred to configure an R-PDCCH SS within the same subset. Therefore, the R-PDCCH SS may be defined in, for example, subset #0. If there are many R-PDCCHs, the R-PDCCH SS may be defined in subset #0 and subset #1. If more R-PDCCHs exist, the R-PDCCH SS may be defined in every subset. In most cases, one subset, subset #k (k=0 to p) may be sufficient for the R-PDCCH SS.

Figure 32:
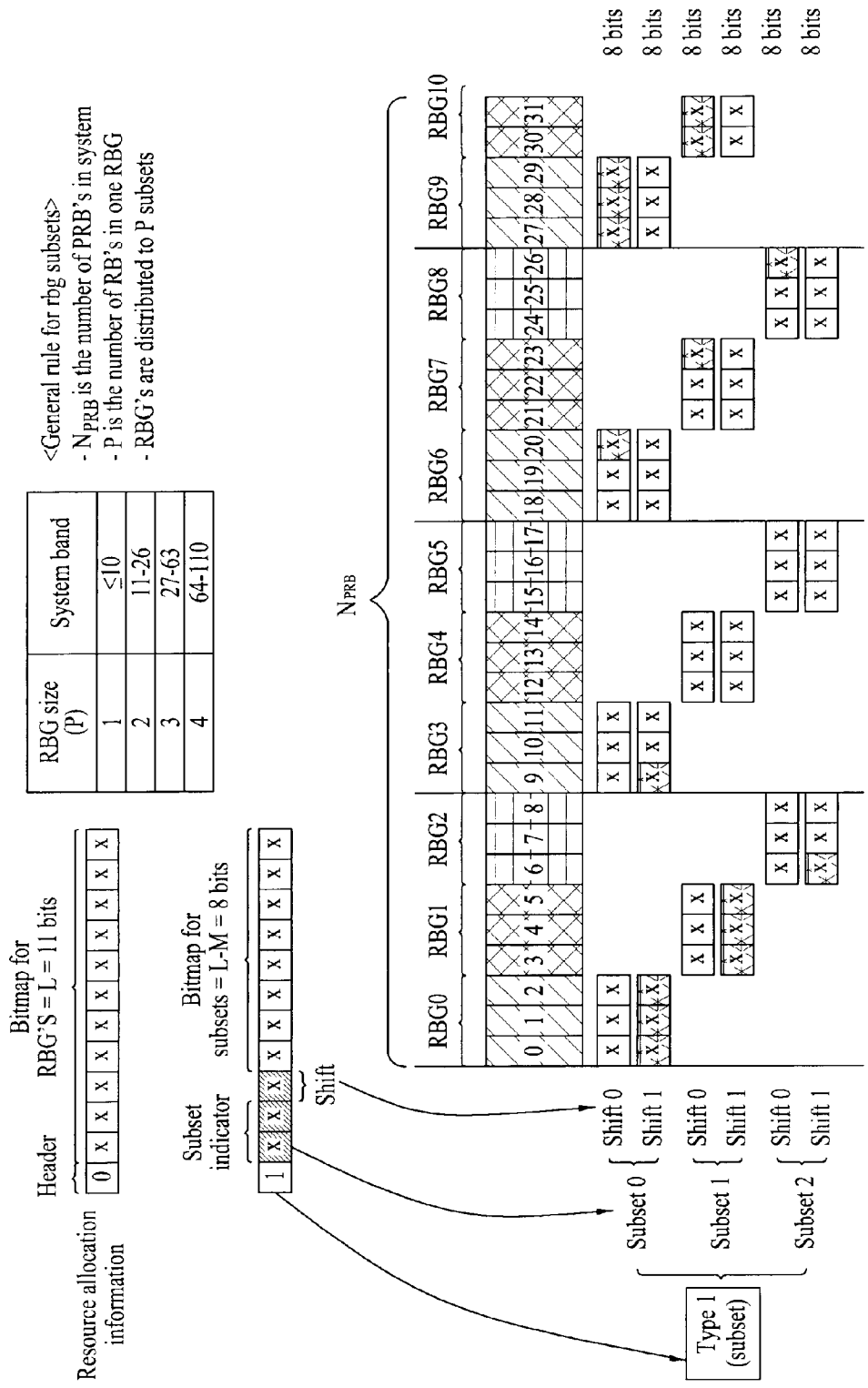

FIG. 32 illustrates an example of configuring an R-PDCCH SS according to RA Type 1. Referring to FIG. 32, RA Type 1 is a typical RA type to which the concept of an RBG subset (shortly, a subset) is introduced. As illustrated in FIG. 32, given a system band of 32 RBs, three subsets may be configured. Preferably, the R-PDCCH SS is configured using RBGs of the same subset index, first of all. In FIG. 32, subset #0 includes RBGs #0, #3, #6 and #9. Hence, the R-PDCCH SS may be configured using RBGs #0, #3, #6 and #9. Whether all or part of the RBGs of subset #0 are used is indicated by separate signaling or determined according to a preset pattern. It is also preferred to create a bitmap indicating a specific subset and specific RBGs within the specific subset. For example, the bitmap may be created to indicate subset=0 and RBGs=0 and 6. Given 32 RBs, a 6-bit signal suffices, including a subset indicator of 2 bits and an RBG bitmap indicator of 4 bits. This indication information may be transmitted semi-statically by RRC signaling. If a single subset is used to configure the R-PDCCH SS, a specific subset (e.g. subset #0) is preset as the single subset and thus only an RGB bitmap indicator may be signaled. If one or more subsets are used to configure the R-PDCCH SS, these subsets may be indicated by a bitmap. When the size of the bitmap is large, the subset indication information may be reduced by compression, for example, by representing a starting subset and a subset length.

If the R-PDCCH SS is set within a single subset as described before, R-PDCCH SS RBs may be apart from one another by the square of P. P is the number of RBs in an RBG. In the above example of 32 RBs, 11 RBGs may be defined. Since each RBG includes 3 RBs, P=3. Accordingly, the R-PDCCH SS RBs may be disposed with a spacing of 9 RBs ($=3^2$). If a plurality of subsets are used for the R-PDCCH SS, $P^2$ is the interval between SS RBs in each subset. The interval between subsets may be determined according to selected subsets and the number of the selected subsets.

In legacy LTE, the starting position of an SS is different for each aggregation level. However, there is no need for differentiating the starting position of an SS for an RN on a backhaul link according to an aggregation level. In this case, depending on a DCI payload size and a subblock interleaver size, the aggregation level of specific DCI may not be determined and as a result, a PUCCH resource assignment generated based on CCE-to-ACK/NACK linkage may not be detected correctly. However, setting of a different starting position for an SS according to each aggregation level causes difficulties in actual PRB mapping. While a PDCCH SS is mapped to contiguous PRBs in a control region, an R-PDCCH SS resides in non-contiguous PRBs and suffers from the constraint that a DL grant and a UL grant exist in the same PRB pair. Therefore, blind decoding for aggregation level N (e.g. 1) and blind decoding for aggregation level M (e.g. 2) start preferably at the same position. Consequently, there is no need for calculating a hash function each time the starting position of blind decoding is to be determined according to an aggregation level.

The blind decoding starting positions of a DL grant and a UL grant may be matched implicitly (or preset to be identical). That is, if an R-PDCCH SS for a DL grant has N CCEs in total, the total number of CCEs in an R-PDCCH SS for a UL grant may also be N. In this case, the index of the starting position of the DL grant (e.g. a starting CCE index for DL grant blind decoding) may be reused as the index of the starting position of the UL grant (e.g. a starting CCE index for UL grant blind decoding), which obviates the need for calculating a hash function for the UL grant.

If an SS is configured using one RB per RBG, the RB is preferably positioned in the middle of an RBG. To simplify implementation, it is also possible to set only one PRB located at one end of an RBG as an SS. However, if SS resources are allocated on an RBG basis, any RB of an allocated RBG is available as an SS.

Finally, if an RBG includes fewer RBs than P, an SS may be configured only with a predetermined number of RBs (N RBs, N<P) in an RBG. For example, the SS may be formed with N RBs counted from the first or the last RB of each RBG.

Considering a shift in a subset in RA Type 1, it may occur that even though a subset includes Q RBGs, all of the Q RBGs is not indicated to an RN in relation to RA.

Therefore, the scheduler preferably maps an R-PDCCH, taking into account this case. Referring to FIG. 32, in case of subset #0 and shift #0, an RA bitmap actually indicates only RBGs #0, #3 and #6 out of RBGs #0, #3, #6 and #9. Hence, all of the RBGs need not be blind-detected on the part of an RN. Thus, three RBGs may be determined to be a maximum blind decoding size in the above example. The maximum blind decoding size may vary with a band. For instance, given 96 RBs, P=4 and a total of 25 RBGs are defined. Only part of the 25 RBGs are indicated in relation to RA.

Figure 33:
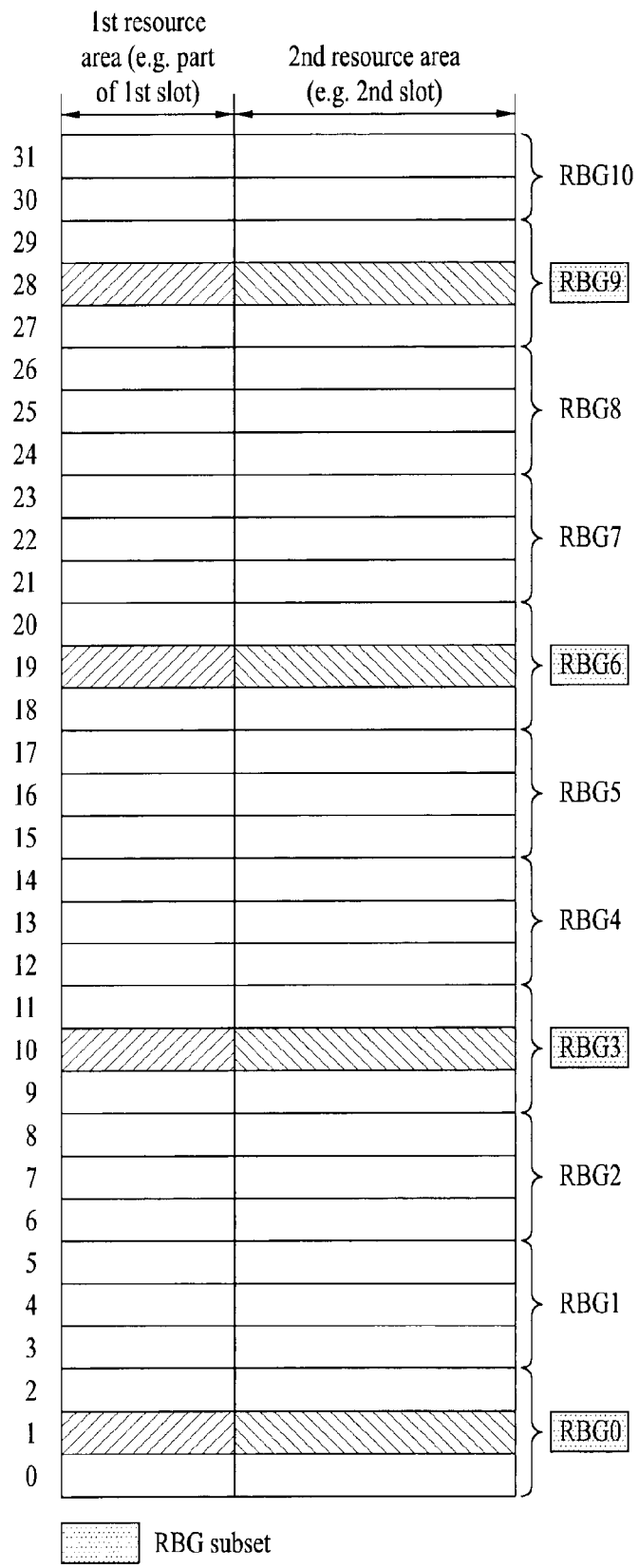
FIGS. 33, 34 and 35 illustrate various examples of configuring an R-PDCCH SS within each RBG.
Figure 34:
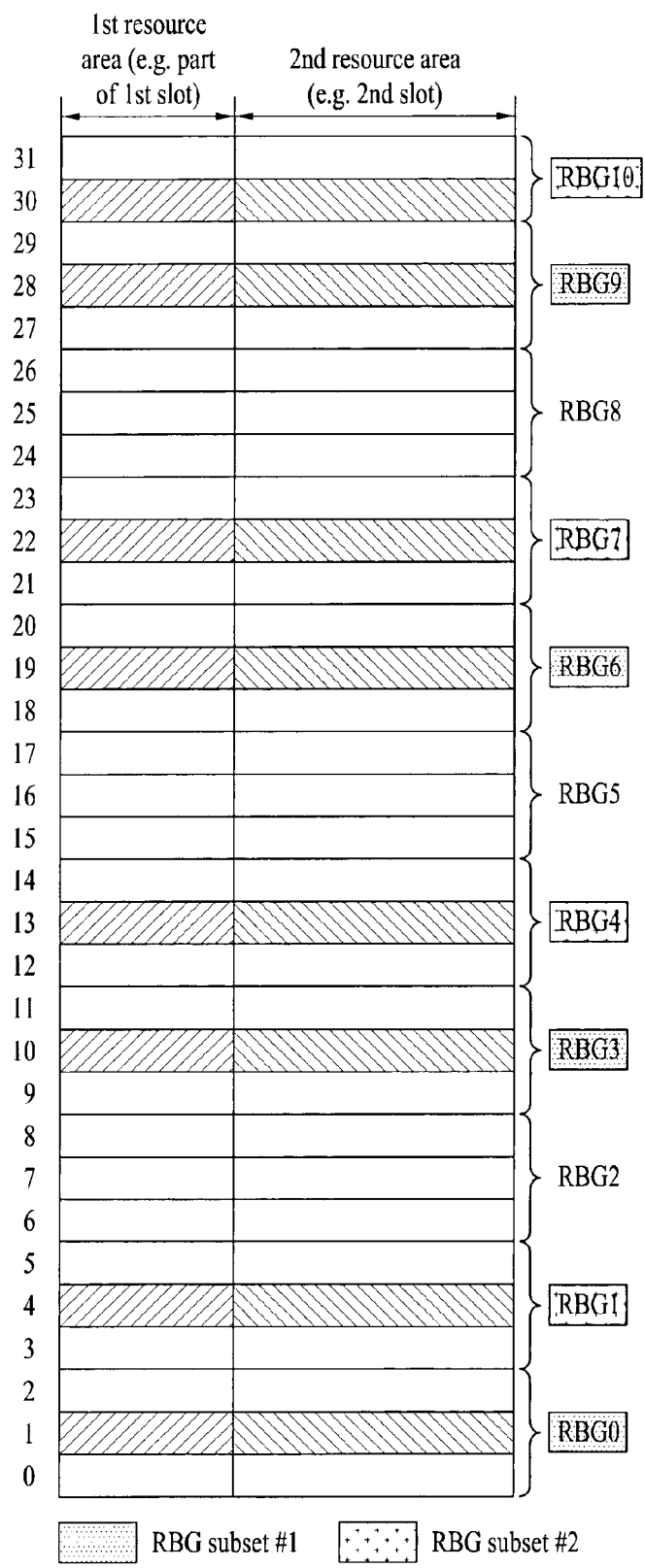
Figure 35:
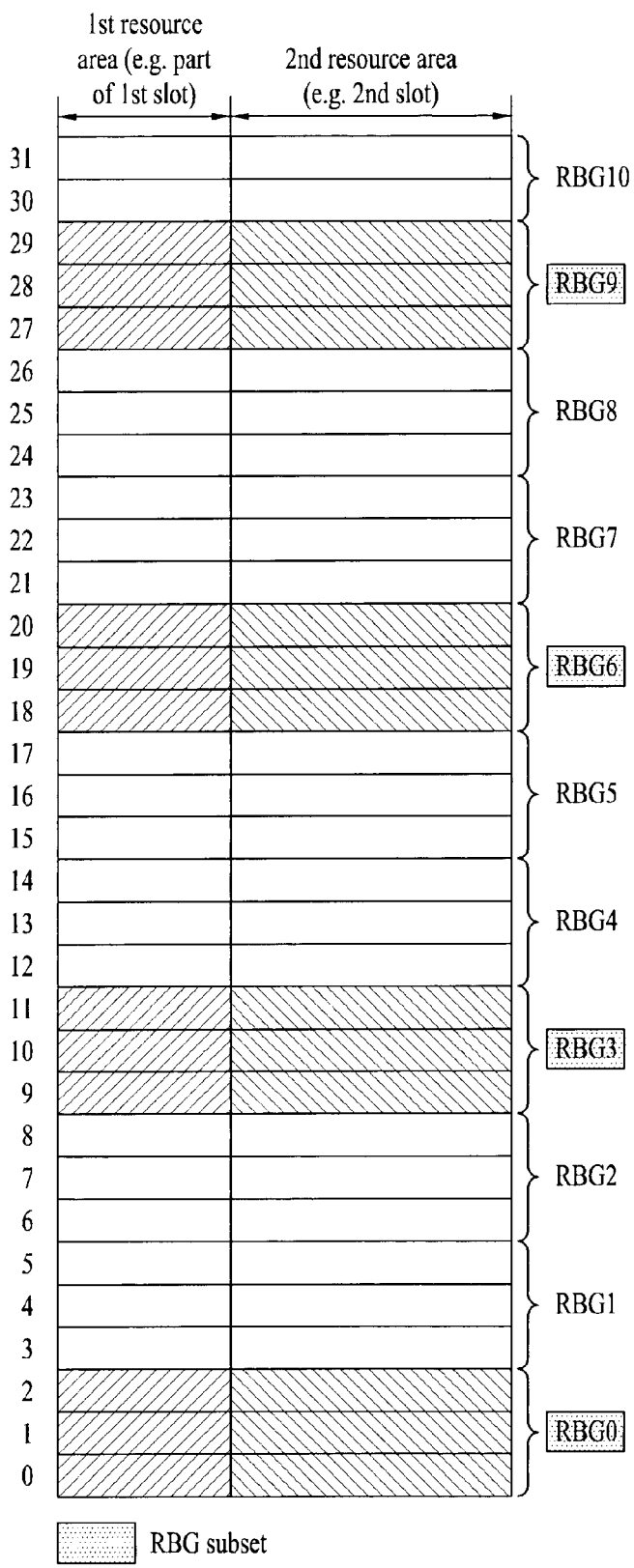

FIGS. 33, 34 and 35 illustrate various examples of configuring an R-PDCCH SS in RBGs according to the foregoing methods. In FIGS. 33, 34 and 35, an R-PDCCH SS is configured using RBGs within the same RBG set. Specifically, the R-PDCCH SS is configured with the middle RB pair of each RBG in an RBG subset in FIG. 33. In FIG. 34, two R-PDCCH SSs are configured in different RBG subsets. In addition, when the last RBG includes fewer RBs than P, an SS may be configured only with a predetermined number of RBs (e.g. 2 RBs) in each RBG in FIG. 34. FIG. 35 illustrates an example of configuring an SS using all RB pairs in each of RBGs.

Common Search Space (CSS)

At least in a CRS-based R-PDCCH demodulation mode, a DL grant CSS and/or a UL grant CSS may be set. Preferably, a CSS may be set only for UL grants. If both DL and UL grants are interleaved and a smaller number of UL grants are paired with DL grants, the smaller number of interleaved UL grants are filled in PRB pairs, while the other areas of the PRB pairs are unused. This problem may be solved in the following methods.

One of the methods is that in case of partial (or full) interleaving, the second slots of PRB pairs (in an interleaving group) are not used for R-PDSCH transmission, in spite of only one UL grant interleaved in the second slots of the PRB pairs. Unused REGs of the second slots may be used by indicating distributed positions of REGs of the (interleaved) UL grant through signaling. Alternatively, the second slots of the PRB pairs may always be left empty irrespective of transmission of the (interleaved) UL grant.

Another method is that when a DL grant SS and a UL grant SS are independently configured and a significant resource waste is expected due to a relatively small number of UL grants with respect to DL grants irrespective of the positions of the DL grants, the UL grants may be disposed in a CSS. According to this method, the second slots of PRB pairs carrying a plurality of DL grants can be used for another purpose (e.g. R-PDSCH transmission), thereby reducing resource waste. Meanwhile, some UL grants may be paired with DL grants and thus the paired UL and DL grants may be positioned in the same PRB pairs. Therefore, an RN first attempts to detect a DL grant in the first slot of an RB pair in order to receive an R-PDCCH. Upon detection of the DL grant in the first slot, the RN attempts to detect a UL grant in the second slot of the RB pair. If the RN fails in detecting a UL grant in the RB pair, the RN attempts to detect a UL grant in a UL grant CSS configured in the second slot.

A third method is to differentiate a DL grant interleaving size from a UL grant interleaving size. For instance, DL grants may be partially interleaved in units of 4 RBs, whereas UL grants may be partially interleaved in units of 2 RBs. To facilitate DL and UL grant interleaving of different sizes, a DL grant resource area and a UL grant resource area should be managed independently. As stated before, when a UL grant CSS is used, interleaving can be performed for DL and UL grants according to different interleaver sizes.

Figure 36:
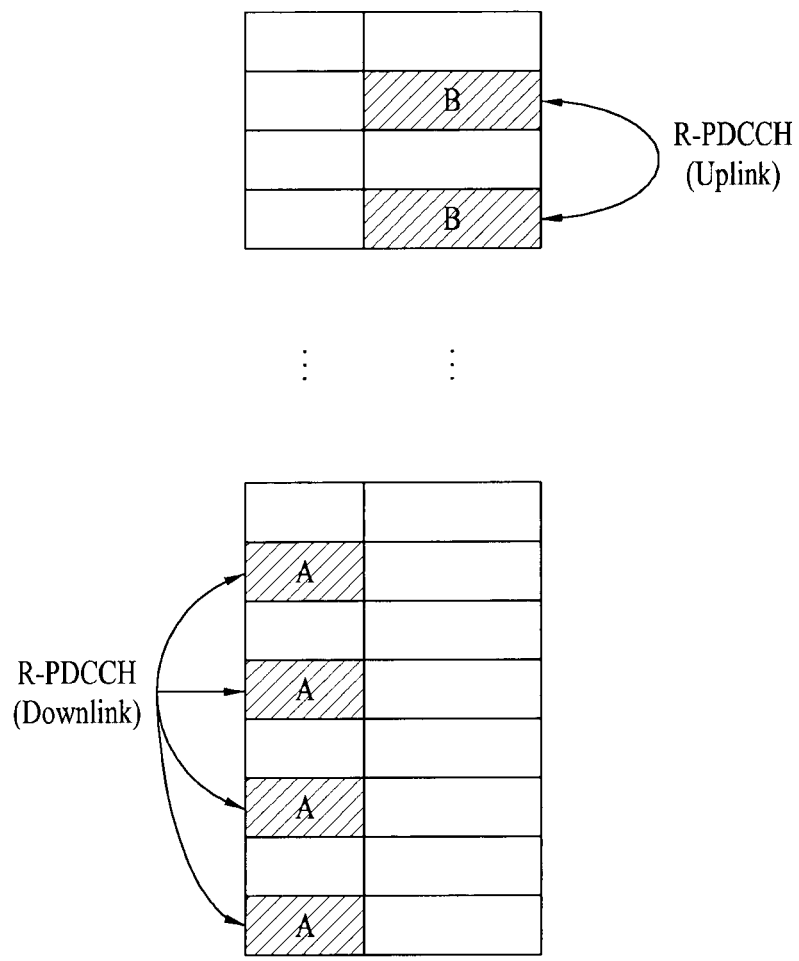
FIG. 36 illustrates an example of configuring an R-PDCCH Dedicated SS (DSS) and an R-PDCCH Common SS (CSS)

Referring to FIG. 36, reference characters A and B denote a DL grant SS and a UL grant SS, respectively. The DL grant SS may be a dedicated SS (DSS) and the UL grant SS may be a CSS. For example, if DM RSs are used, a DSS may be configured. If CRSs are used, a CSS may be configured. It may be indicated by signaling whether an SS is a DSS or a CSS.

CCE Aggregation Levels Based on RBG Size

Figure 37:
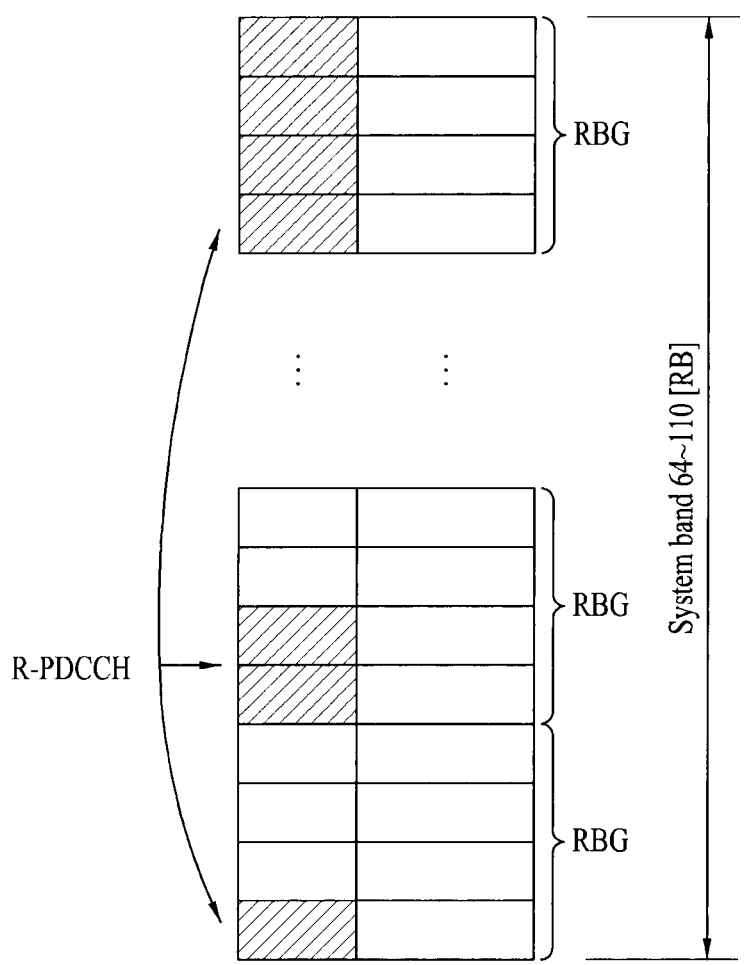
FIG. 37 illustrates exemplary R-PDCCH transmission according to a system band.

An RBG size depends on a system BandWidth (BW). In LTE, four RBG sizes, 1, 2, 3 and 4 RBs are defined according to system BWs. If a system BW includes 64 to 110 RBs to ensure backward compatibility with legacy LTE, each RBG includes 4 RBs. Accordingly, the CCE aggregation levels of R-PDCCHs may be limited to one or more sets of $\{1, 2, 3, 4\}$, $\{1, 2, 3,\}$, $\{1, 2, 4\}$, or $\{1, 2\}$ (e.g. 1 CCE=1 RB). An example of R-PDCCH transmission in a system BW of 64 to 100 RBs is illustrated in FIG. 37. If the BW includes 27 to 63 RBs, the RBG size is 3 RBs and thus the CCE aggregation levels of R-PDCCHs may be limited to one or more sets of $\{1, 2, 3\}$, $\{1, 2\}$, and $\{1, 3\}$. If the BW includes 11 to 26 RBs, the RBG size is 2 RBs and thus the CCE aggregation levels of R-PDCCHs may be limited to one or more sets of $\{1, 2\}$, $\{1\}$, and $\{2\}$. It is possible to set 1, 2, 3 and 4 available as the CCE aggregation levels of R-PDCCHs and then to limit the highest CCE aggregation level to one of the values, to cover all cases. For example, different aggregation levels may be supported according to BWs.

Table 4 illustrates supportable aggregation levels for different BWs.

TABLE 4

| System BW [RB] | Supportable aggregation level |
| --- | --- |
| 64 to 110 | 1, 2, 3, 4 |
| 27 to 63 | 1, 2, 3 |
| 11 to 26 | 1, 2 |
| <=10 | 1 or not supported |

Interleaving and Mapping for R-PDCCH

Figure 38:
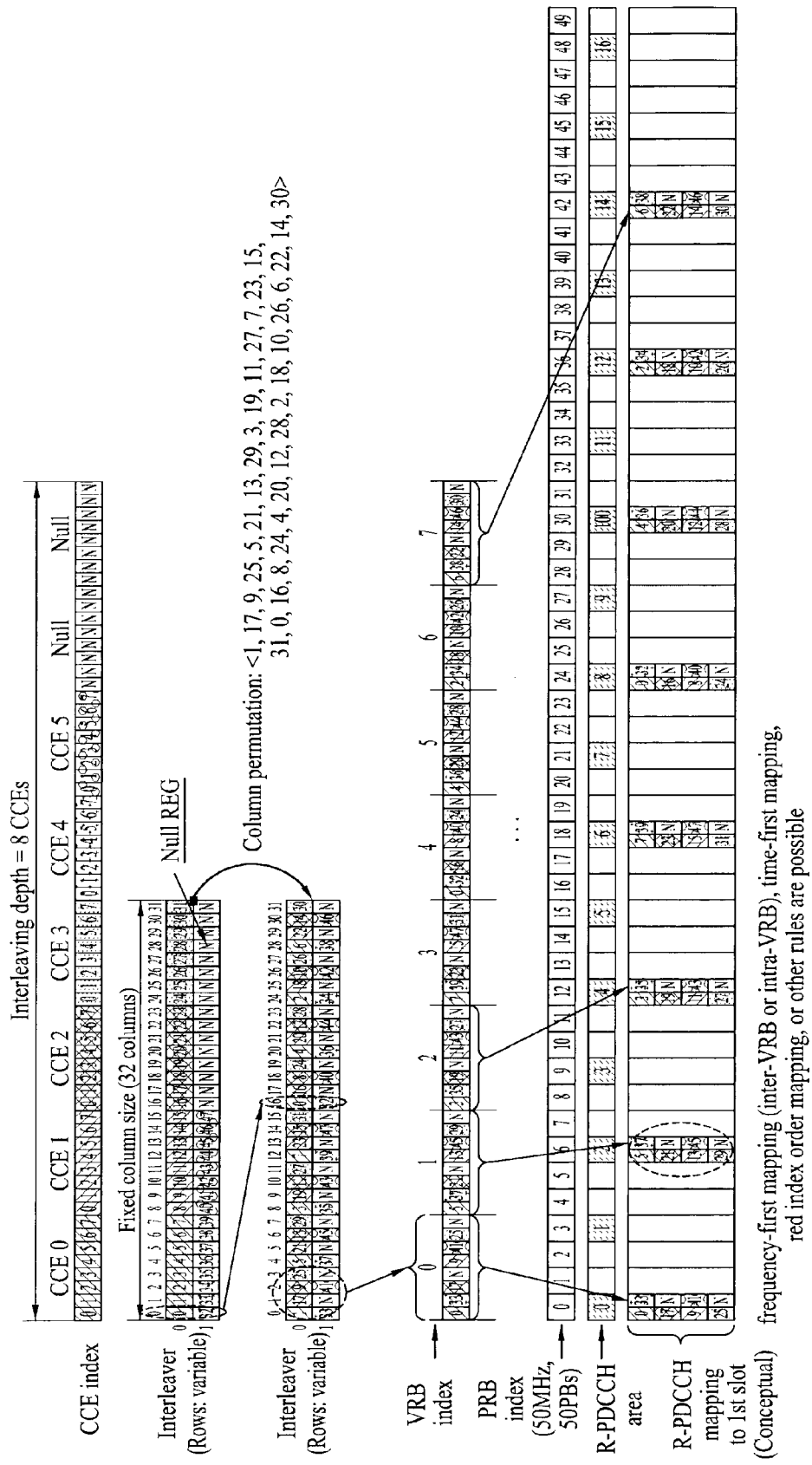
FIGS. 38 to 42 illustrate exemplary mapping operations for R-PDCCH transmission.

FIG. 38 illustrates an exemplary mapping operation for R-PDCCH transmission. This example is characterized in that an R-PDCCH is interleaved and mapped to a PDSCH area according to a VRB-to-PRB mapping rule in order to transmit the R-PDCCH in the PDSCH area, instead of an LTE PDCCH area. For the R-PDCCH transmission, various interleaving schemes and various mapping schemes can be used. It is also possible to subject CCEs to interleaving (partial interleaving) on a group basis and then map the interleaved CCEs based on the operation of FIG. 38. On the part of an RN, an operation for detecting an R-PDCCH in one or more partial-interleaved areas may be included.

FIG. 38 is based on the assumption that an area in which an R-PDCCH (R-PDCCHs) corresponding to 8 CCEs can be transmitted is semi-statically signaled and the R-PDCCH is actually transmitted in resources corresponding to 6 CCEs (all or each of 6 CCEs may be used by one RN). The size of a CCE may be different according to a normal CP or an extended CP or according to a CRS mode or a DM RS mode. Herein, it is assumed that 8 REGs of a PRB in the first slot are available and defined as one CCE in case of a normal CP/a DM-RS mode. In the illustrated case of FIG. 38, a bandwidth includes 50 RBs and one PRB per RBG (1 RBG=3 RBs) is used for R-PDCCH transmission. The RBG size may be determined as defined in legacy LTE.

Interleaving & Permutation

In Method 1, 8 CCEs including nulls are interleaved (including column permutation in a column permutation pattern). Bit reversal is an example of the column permutation pattern. For reference, an RN-specific SS (within a logical CCE index domain) is basically assumed. Method 2 will be described later. Method 3 is different from Method 1 in that one or more interleaving units are used. For instance, 8 CCEs are divided into a plurality of parts (e.g. two parts each having 4 CCEs) and interleaved in Method 3. Meanwhile, if RB-level permutation is performed during VRB-to-PRB mapping (e.g. using bit reversal), REG-level column permutation or bit reversal may be omitted during interleaving, which does not much affect performance. For reference, an SS in a logical CCE domain is assumed to be a CSS accessible to all RNs in Method 3. The use of an RN-specific SS may slightly decrease operation efficiency or resource efficiency, but does not limit the implementation of the present invention.

After interleaving and permutation, an R-PDCCH is mapped to PRBs according to various rules. To describe the mapping, the concept of VRB may be used. In the example of FIG. 38, 8 REGs being 1, 33, 17, N, 9, 41, 25, N (N is a null REG) among values (outputs) read column by column after interleaving and permutation form one VRB. While a VRB and a CCE are equal in size in FIG. 38, the same performance may be achieved even though the VRB size is larger than the CCE size. Even in case of a normal CP, the following various numbers of REGs are available. Therefore, the CCE size and the VRB size may be changed based on the number of available REGs per RB according to a transmission mode, as follows.

$1^{st}$ slot:
8 REGs in the $1^{st}$ slot (e.g. DM RS used)
11 REGs in the $1^{st}$ slot (e.g. CRS used)
$2^{nd}$ slot:
15 REGs in the $2^{nd}$ slot (e.g., DM RS used and 4TX CRS)
16 REGs in the $2^{nd}$ slot (e.g. DM RS used and 2TX CRS)
18 REGs in the $2^{nd}$ slot (e.g. CRS used and 4TX CRS)
19 REGs in the $2^{nd}$ slot (e.g., CRS used and 2TX CRS)

For example, when a DL grant is transmitted in the first slot, the DL grant is interleaved by defining one CCE as 8 REGs. A VRB size may be defined as 8 REGs in case of DM RSs and as 11 REGs in case of CRSs. According to this method, a detection operation may be facilitated by fixing the CCE size. In addition, the VRB size is set to an optimum value (e.g. the number of available REGs) to efficiently use the number of available REGs which varies according to an RS mode. Therefore, resource waste can be minimized.

It is also preferred to define VRB sizes as 15, 16, 17 and 19 REGs in actual VRB-to-PRB mapping, with a CCE size given as 8 REGs, in the second slot. The size of one VRB is given as an example according to a change in RSs and TX antennas. The VRB size may be changed despite the same logic and rule.

VRB-to-PRB Mapping

The simplest mapping rule is to sequentially map VRB indexes to R-PDCCH PRB indexes (renumbered indexes only for R-PDCCH RBs or indexes labeled in an R-PDCCH area in FIG. 38) at 1:1. Despite its simplicity, this mapping rule causes localization of jointly interleaved CCEs in a part of an R-PDCCH PRB (R-PDCCH PRBs). The localization may not matter if the part includes 4 or more PRBs, while it may cause a problem with a diversity gain if the part includes 3 or fewer PRBs.

In another method, permutation may be performed (e.g. by bit reversal) at an RB level. This method is simple and maps VRBs uniformly to PRBs. For example, if a total of four R-PDCCH PRBs exist, VRB #0 (00), VRB #1 (01), VRB #2 (10), and VRB #3 (11) may be mapped to R-PDCCH PRBs #0 (00), #2 (10), #1 (01), and #3 (11), respectively. If the number of R-PDCCH PRBs is not $2^N$, VRBs may be mapped to the R-PDCCH PRBs by such a method as pruning, while the bit reversal rule is maintained. When bit reversal is applied, it is preferable not to use column permutation (e.g. REG-level bit reversal) during interleaving. However, only if implementation complexity permits, both REG-level bit reversal and RB-level bit reversal may be applied.

In a further method, a rule that enables even distribution may be used. For example, a VRB index i may be mapped to a PRB index f(i) by Equation 4. In Equation 4, N represents the size of a physical R-PDCCH area (e.g. in PRBs) and K represents the size of an actual R-PDCCH to be transmitted (e.g. in PRBs). Even when a VRB and a PRB differ in the number of available REs, K is calculated in terms of PRBs. Herein, a, b and c are constants.

$$f(i) = c * \left\lfloor \frac{i*N + a}{K} \right\rfloor + b \quad \text{[Equation 4]}$$

Table 5 and Table 6 illustrate examples of VRB-to-PRB mapping according to [Equation 4]. Table 5 illustrates VRB-to-PRB mapping when K=7, N=16, a=b=0, and c=1. That is, Table 5 illustrates mapping of VRB indexes 0 to 7 (8 RBs, K=7) to R-PDCCH PRB indexes 0 to 16 (17 RBs, N=16) and Table 6 illustrates VRB-to-PRB mapping when K=7 and N=24.

TABLE 5

| VRB index | 0 | 1 | 2 | 3 | 4 | 5 | 6 | 7 |
|---|---|---|---|---|---|---|---|---|
| PRB index (R-PDCCH) | 0 | 2 | 4 | 6 | 9 | 11 | 13 | 16 |

TABLE 6

| VRB index | 0 | 1 | 2 | 3 | 4 | 5 | 6 | 7 |
|---|---|---|---|---|---|---|---|---|
| PRB index (R-PDCCH) | 0 | 3 | 6 | 10 | 13 | 17 | 20 | 24 |

The mapping patterns may be modified through shifting or by adjusting a mapping interval using the additional parameters, a, b and c in [Equation 4].

While REG-to-PRB mapping is not described in detail in FIG. 38, the REG-to-PRB mapping may be carried out in various manners. For example, REGs may be mapped to a PRB in a frequency-first mapping rule, as illustrated in FIG.

38. However, the mapping pattern may vary according to an actual REG configuration and actual indexing.

Figure 39:
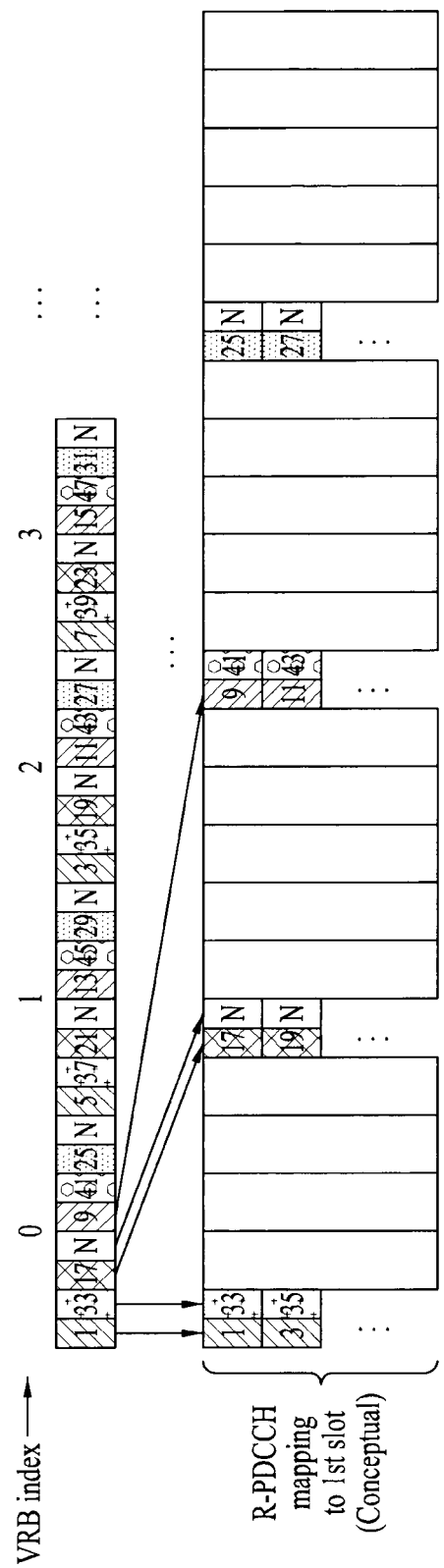

Frequency-first mapping may be performed across total R-PDCCH PRBs. Then an interleaved result as illustrated in FIG. 39 may be achieved. In FIG. 39, CCE 0 and CCE 4 exist in R-PDCCH PRBs #0 and #4 only. Each CCE is present only in an R-PDCCH RBG with an index corresponding to the CCE. Therefore, a diversity gain problem may occur. If the VRB size is different from the PRB size, mapping may be performed in a different manner.

Figure 40:
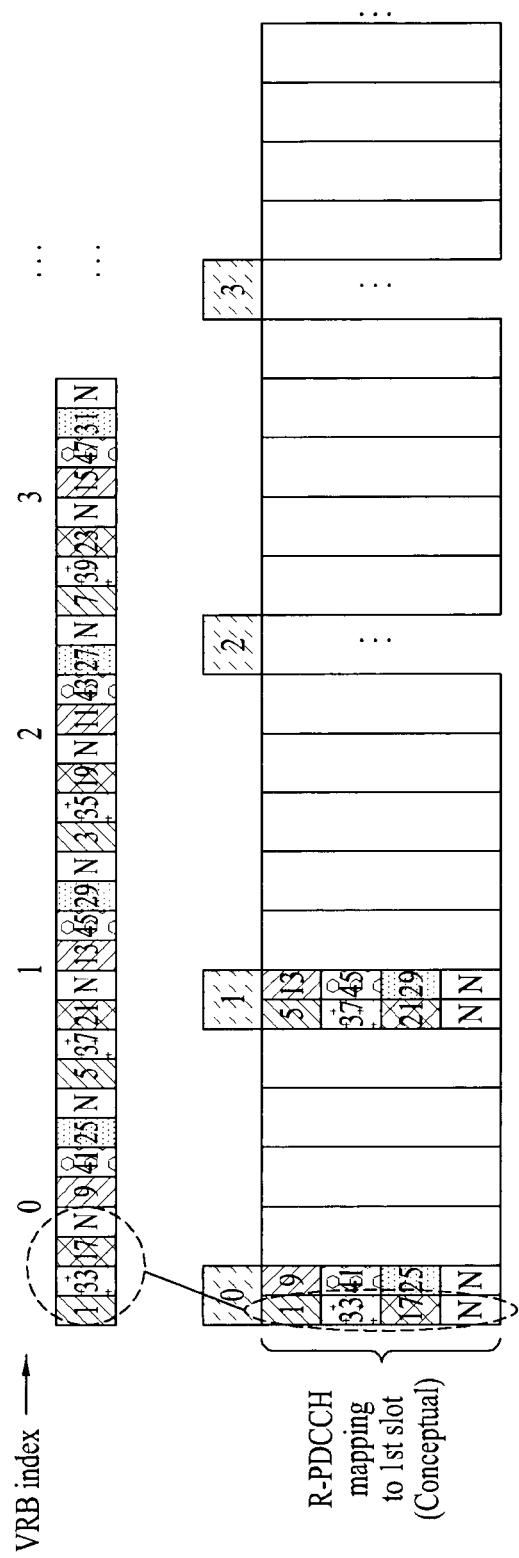

Meanwhile, time-first mapping may be performed within each R-PDCCH PRB. FIG. 40 illustrates an example of time-first mapping.

Interleaving and mapping method 2 is almost identical to the method of FIG. 38 from the perspective of transmission, except that an RN should additionally perform blind decoding according to interleaving depths in order to detect an interleaving depth because the RN does not know the number of RBs as an interleaving unit. Despite this shortcoming, interleaving and mapping method 2 can dynamically optimize resources by setting an interleaving depth equal to the size of an R-PDCCH to be transmitted (e.g. in RBs), when possible. If the interleaving depth is 1 RB, the size of an actual R-PDCCH to be transmitted may equal to the actual interleaving depth. Notably, it is preferred to preset interleaving depths with a predetermined granularity, such as 8 RBs, 12 RBs, etc. in order to reduce the number of blind decodings for interleaving depths. This information may be set by RRC signaling. If an R-PDCCH area includes 16 RBs and only {8 RBs, 16 RBs} are available as interleaving depths, one of various sets such as {4 RBs, 8 RBs, 16 RBs}, {4 RBs, 8 RBs, RBs, 16 RBs}, {4 RBs, 16 RBs} may be preset by signaling.

This signaling scheme may be used when an RN determines a monitoring set in Method 3. That is, one of set 1, set 2 and even full sets may be signaled to an RN, as an appropriate monitoring set. This scheme can be used to signal an RN monitoring set in almost all proposed methods.

Methods 1, 2 and 3 are based on the assumption of a fixed interleaver column size. However, the fixed interleaver column size is purely exemplary and the column size may be variable. For instance, interleaving may be performed in an interleaver with a column size of 16.

RN-Specific CCE Indexing

The foregoing methods have been described so far on the premise that CCE indexes are cell-specific. On the other hand, CCE indexes may be defined RN-specifically. In FIG. 38, CCE 0 to CCE 3 and CCE 4 to CCE 7 are RN-specifically interleaved separately and it is assumed that each interleaving group includes CCE 0 to CCE 3. As a result, CCE 0 of group 1 is different from CCE 1 of group 2. Only when information required to distinguish CCE 0 of group 1 from CCE 0 of group 2 is signaled to an RN, the RN may calculate BS-specific (or cell-specific) CCE indexes. Since BS-specific CCE indexes are used for determining RN PUCCH resources for transmission of a UL ACK/NACK, they should be defined cell-specifically to avoid overlapped resource allocation or resource waste. Instead of additionally transmitting a group index for RN PUCCH resources, the RN PUCCH resources may be allocated by group and the starting RB of allocated RN PUCCH resources may be signaled. For reference, RN PUCCH resources are assumed to be linked to an R-PDCCH CCE index (e.g. a minimum CCE index for an R-PDCCH).

Interleaving and Mapping Method 4

Figure 41:
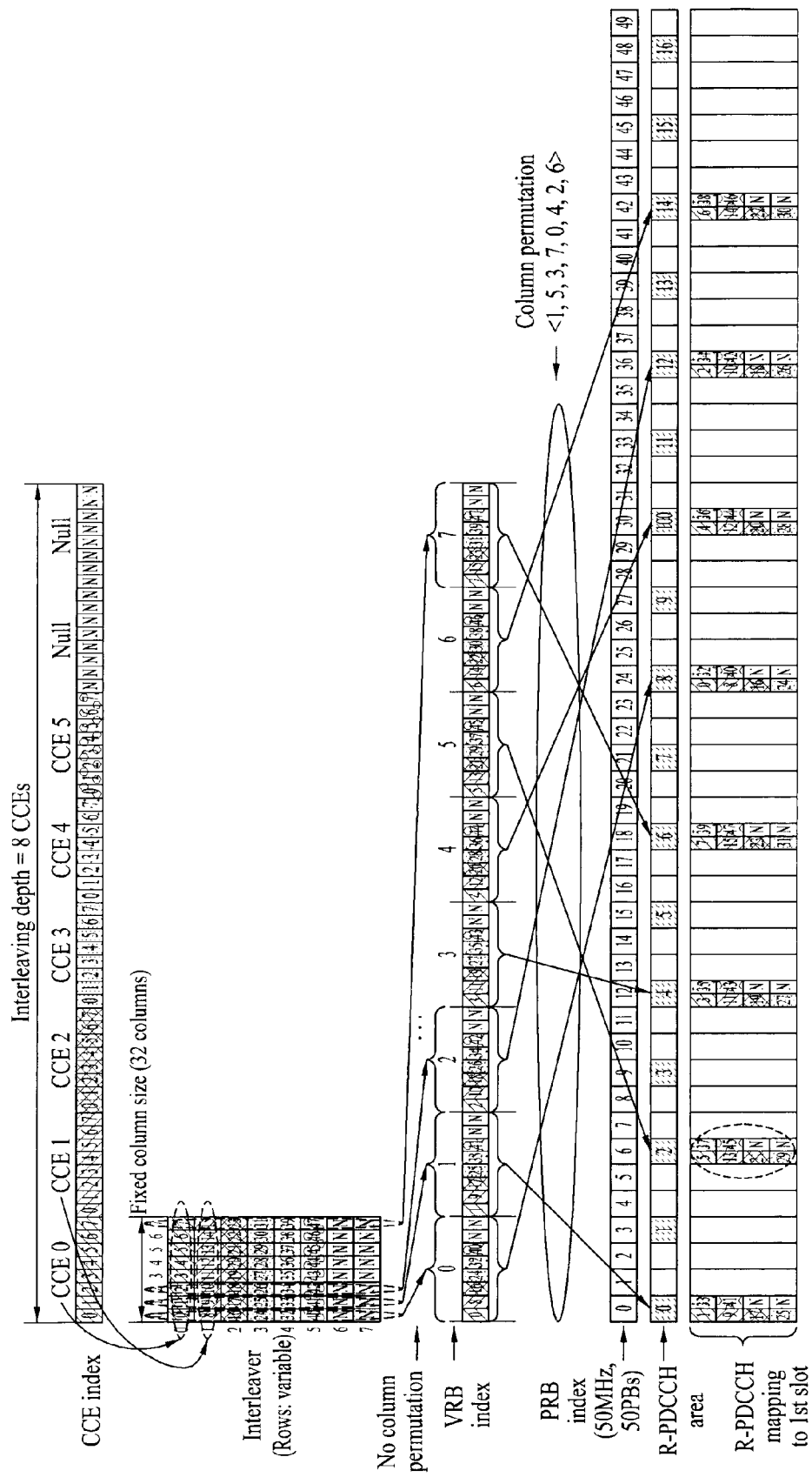

FIG. 41 illustrates an R-PDCCH mapping operation in Method 4. According to Method 4, permutation is uniformly performed (e.g. by bit reversal) during VRB-to-PRB mapping, without column permutation during interleaving. In Method 4, an interleaver column size is defined as the number of REGs in a CCE and an interleaver row size is changed according to the number of CCEs to be interleaved. REGs extracted from 8 different CCEs form one VRB (herein, 1 VRB=8 REGs). If the number of R-PDCCH RBs is not $2^N$ (N=1, 2, 3, . . . ), mapping may be performed by bit reversal pruning. The interleaver column size characteristic of this method is also applicable to Methods 1, 2 and 3.

Interleaving and Mapping Method 5

Figure 42:
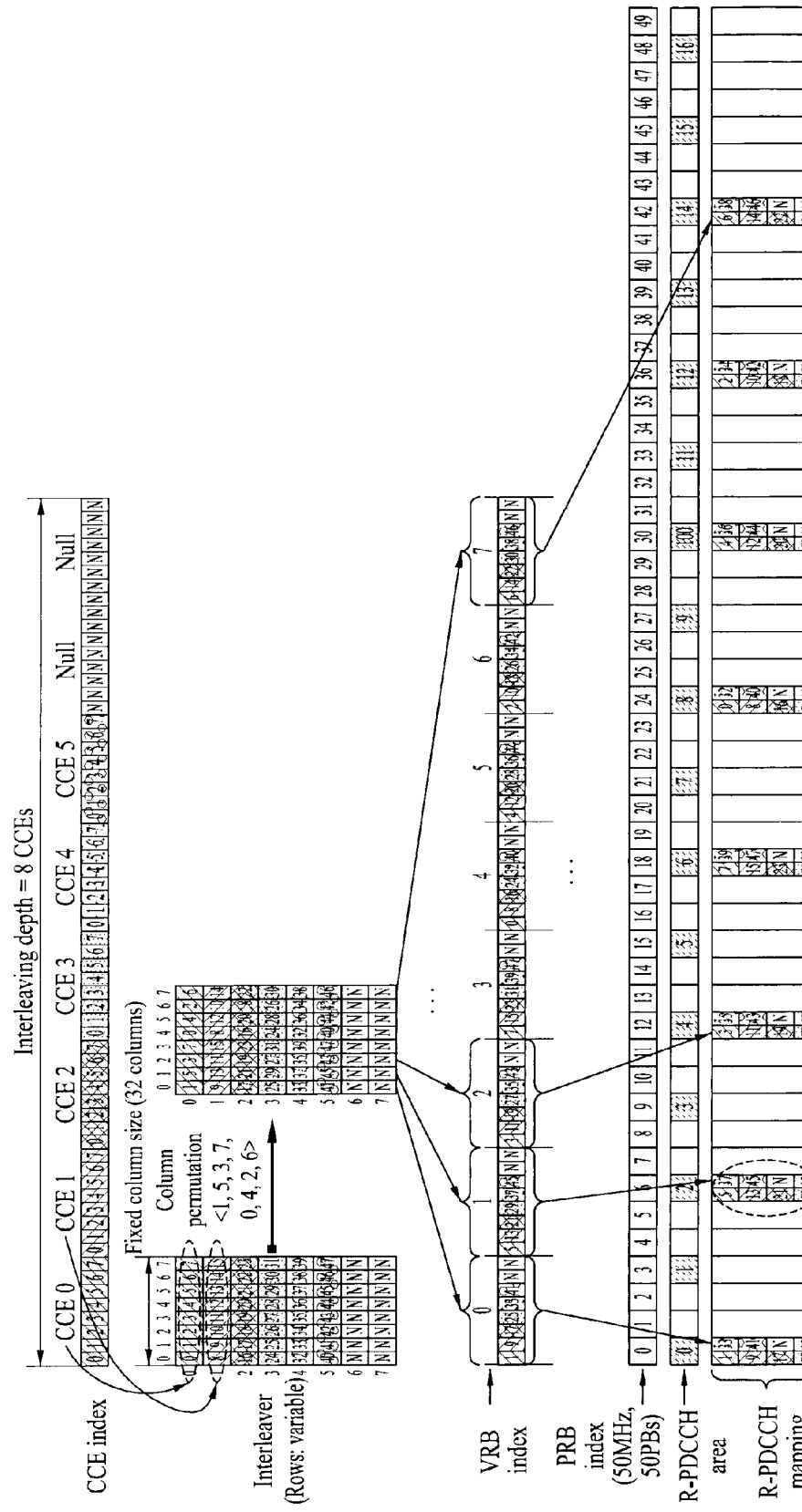

FIG. 42 illustrates an exemplary R-PDCCH mapping operation in Method 5. According to Method 5, column permutation is performed during interleaving and VRB-to-PRB mapping is performed simply without permutation (e.g. bit reversal). [Equation 4] is also applicable to Method 5. The interleaver column size is defined as the number of REGs in a CCE and the interleaver row size is changed according to the number of CCEs to be interleaved.

An RN may demodulate an R-PDCCH/R-PDSCH in various manners according to a mode supported for a relay backhaul link (a Un link), as illustrated in Table 7.

TABLE 7

R-PDCCH/R-PDSCH demodulation RS

| Case | 1st slot demod. | 2nd slot deomod | Supporting modes | Subframe |
|---|---|---|---|---|
| 1 | CRS DL grant | CRS R-PDSCH | Mode 1-1 and 2 | Normal (NCP, ECP) |
| 2 | CRS DL grant | CRS UL grant | Mode 1-1 and 2 | Normal (NCP, ECP) |
| 3 | CRS DL grant | DM RS R-PDSCH | CRS Mode 2 | Normal (NCP, ECP) |
| 4 | DM RS DL grant | DM RS R-PDSCH | DM RS mode 2 | Normal (NCP, ECP) |
| 5 | DM RS DL grant | DM RS UL grant | DM RS mode 2 | Normal (NCP, ECP) |
| 6 | DM RS DL grant | CRS R-PDSCH | DM RS mode 2 | Normal (NCP, ECP) |
| 7 | DM RS DL grant | DM RS R-PDSCH | DM RS mode 2 | MBSFN (ECP) |
| 8 | DM RS DL grant | DM RS UL grant | DM RS mode 2 | MBSFN (ECP) |

Referring to Table 7, an R-PDCCH exists in the first slot, a CRS is used as an R-PDCCH demodulation RS, an R-PDSCH exists in the second slot, and a CRS is used as an R-PDSCH demodulation RS in Case 1. It is preferred in Case 1 that an RN performs CRS-based demodulation and operates in an R-PDCCH interleaving mode (CRS mode 1-1) and an R-PDCCH non-interleaving mode (CRS mode 2). In addition, a normal subframe is used and both a normal CP and an extended CP are supported in Case 1.

Case 4 uses DM RSs to demodulate a DL grant (an R-PDCCH) in the first slot and an R-PDSCH in the second slot. Case 4 is suitable for a non-interleaving mode 'DM RS mode 2] (Mode 2D or replaceable with some other term).

In Cases of Table 7 performing interleaving, the BS needs to determine the number of R-CCEs, PRBs or RNs that are subject to joint interleaving. The number of R-CCEs, PRBs or RNs determined for interleaving may be referred to as an interleaver size or interleaving depth. Despite interleaving on an RN basis, the BS may interleave more CCEs than the RNs according to the CCE aggregation levels (e.g. 1, 2 and 4) of the RNs. The interleaved CCEs may be mapped to PRBs. The interleaver size may be in, but not limited to, RBs or CCEs.

Figure 43:
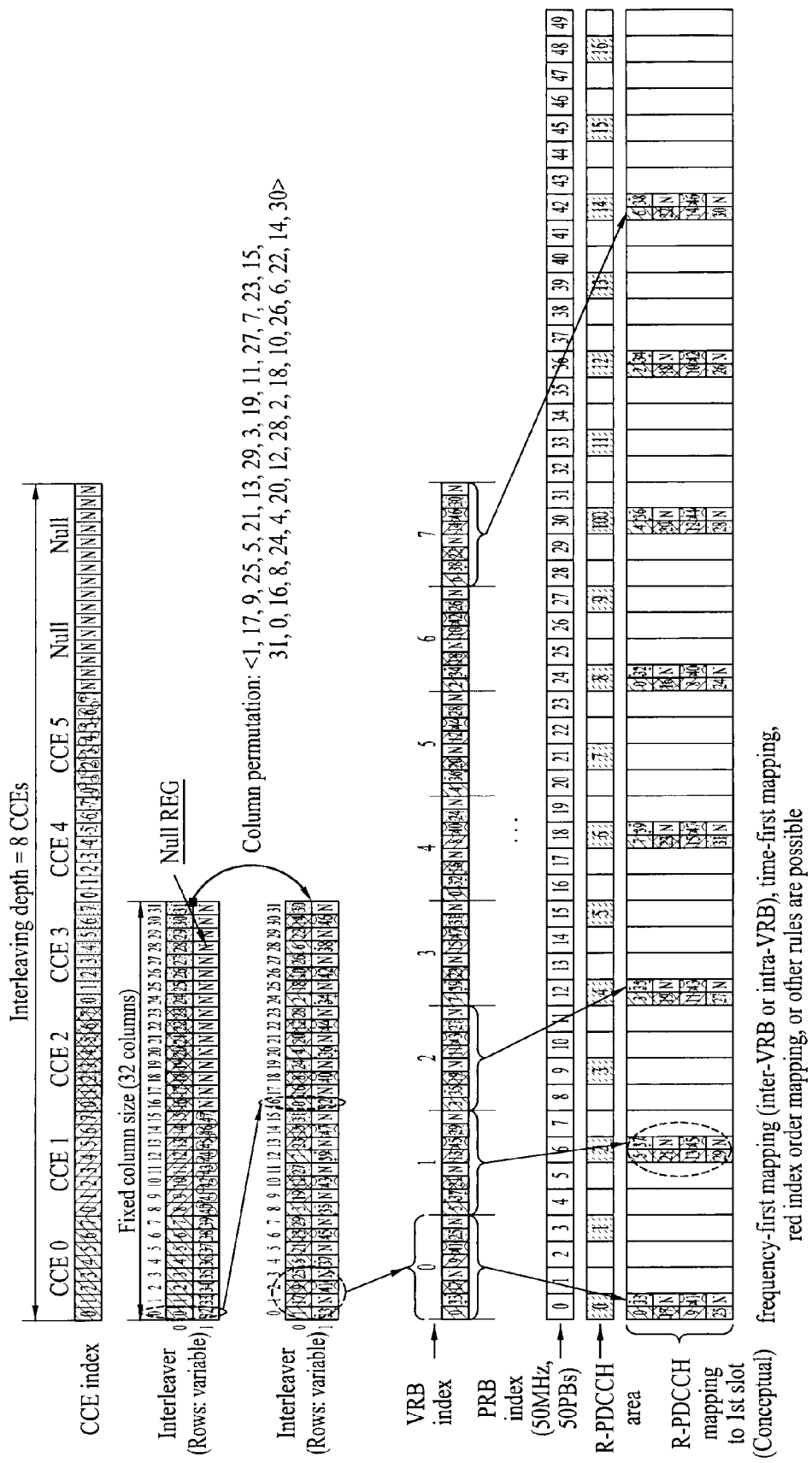
FIG. 43 illustrates an exemplary mapping operation for R-PDCCH transmission.

FIG. 43 illustrates an exemplary mapping operation for R-PDCCH transmission.

The BS may interleave an R-PDCCH for an RN at an R-CCE or REG level. This embodiment is characterized in that an R-PDCCH is interleaved and mapped to a PDSCH area according to a VRB-to-PRB mapping rule in order to transmit the R-PDCCH in the PDSCH area, instead of an LTE PDCCH area. For the R-PDCCH transmission, various interleaving schemes and various mapping schemes are available. It is also possible to subject CCEs to interleaving (partial interleaving) on a group basis and then map the interleaved CCEs based on the operation of FIG. 43. On the part of an RN, an operation for detecting an R-PDCCH in one or more partial-interleaved areas may be included.

As illustrated in FIG. 43, an interleaving depth is assumed to be 8 CCEs. FIG. 43 is based on the assumption that an area in which an R-PDCCH (R-PDCCHs) corresponding to 8 CCEs (for example, if 1 CCC=8 REG) can be transmitted is semi-statically signaled and the R-PDCCH is actually transmitted in resources corresponding to 6 CCEs (6 CCEs may be used, all by one RN or one by each RN). The size of a CCE may be different depending on a normal or extended CP or depending on a CRS mode or a DM-RS mode. Herein, it is assumed that 8 REGs of a PRB in the first slot are available and defined as one CCE in case of a normal CP/DM-RS mode. In the illustrated case of FIG. 38, a BW includes 50 RBs and one PRB per RBG (1 RBG=3 RBs) is used for R-PDCCH transmission. The RBG size may be determined as defined in legacy LTE. 1 CCE includes how many number of REG (for example, 1 CCE=8REG, 1 CCE=9 REG) may vary according to cyclic prefix and configuration of RS in RB Interleaving & Permutation In Method 1, 8 CCEs including nulls are interleaved (including column permutation in a column permutation pattern). Bit reversal is an example of the column permutation pattern. For reference, an RN-specific SS (within a logical CCE index domain) is basically assumed. Method 2 will be described later. Method 3 is different from Method 1 in that one or more interleaving units are used. For instance, 8 CCEs are divided into a plurality of parts (e.g. two parts each having 4 CCEs) and interleaved in Method 3. Meanwhile, if RB-level permutation is performed during VRB-to-PRB mapping (e.g. using bit reversal), REG-level column permutation or bit reversal may be omitted during interleaving, which does not much affect performance. For reference, an SS in a logical CCE domain is assumed to be a CSS accessible to all RNs in Method 3. The use of an RN-specific SS may slightly decrease operation efficiency or resource efficiency, but does not limit the implementation of the present invention.

After interleaving and permutation, an R-PDCCH is mapped to PRBs according to various rules. To describe the mapping, the concept of VRB may be used. In the example of FIG. 43, 8 REGs being 1, 33, 17, N, 9, 41, 25, N (N is a null REG) among values (outputs) read column by column after interleaving and permutation form one VRB. While a VRB and a CCE are equal in size in FIG. 38, the same performance may be achieved even though the VRB size is larger than the CCE size. Even in case of a normal CP, the following various numbers of REGs are available. Therefore, the CCE size and the VRB size may be changed based on the number of available REGs per RB according to a transmission mode, as follows.

$1^{st}$ slot:
8 REGs in the $1^{st}$ slot (e.g. DM RS used)
11 REGs in the $1^{st}$ slot (e.g. CRS used)
$2^{nd}$ slot:
15 REGs in the $2^{nd}$ slot (e.g., DM RS used and 4TX CRS)
16 REGs in the $2^{nd}$ slot (e.g. DM RS used and 2TX CRS)
18 REGs in the $2^{nd}$ slot (e.g. CRS used and 4TX CRS)
19 REGs in the $2^{nd}$ slot (e.g., CRS used and 2TX CRS)

For example, when a DL grant is transmitted in the first slot, the DL grant is interleaved by defining one CCE as 8 REGs. A VRB size may be defined as 8 REGs in case of DM RSs and as 11 REGs in case of CRSs. According to this method, a detection operation may be facilitated by fixing the CCE size. In addition, the VRB size is set to an optimum value (e.g. the number of available REGs) to efficiently use the number of available REGs which varies according to an RS mode. Therefore, resource waste can be minimized.

It is also preferred to define VRB sizes as 15, 16, and 19 REGs in actual VRB-to-PRB mapping, with a CCE size given as 8 REGs, in the second slot. The size of one VRB is given as an example according to a change in RSs and TX antennas. The VRB size may be changed despite the same logic and rule.

VRB-to-PRB Mapping

The simplest mapping rule is to sequentially map VRB indexes to R-PDCCH PRB indexes (renumbered indexes only for R-PDCCH RBs or indexes labeled in an R-PDCCH area in FIG. 38) at 1:1. Despite its simplicity, this mapping rule causes localization of jointly interleaved CCEs in a part of an R-PDCCH PRB (R-PDCCH PRBs). The localization may not matter if the part includes 4 or more PRBs, while it may cause a problem with a diversity gain if the part includes 3 or fewer PRBs.

In another method, permutation may be performed (e.g. by bit reversal) at an RB level. This method is simple and maps VRBs uniformly to PRBs. For example, if a total of four R-PDCCH PRBs exist, VRB #0 (00), VRB #1 (01), VRB #2 (10), and VRB #3 (11) may be mapped to R-PDCCH PRBs #0 (00), #2 (10), #1 (01), and #3 (11), respectively. If the number of R-PDCCH PRBs is not $2^N$, VRBs may be mapped to the R-PDCCH PRBs by such a method as pruning, while the bit reversal rule is maintained. When bit reversal is applied, it is preferable not to use column permutation (e.g. REG-level bit reversal) during interleaving. However, only if implementation complexity permits, both REG-level bit reversal and RB-level bit reversal may be applied.

In a further method, a rule that enables even distribution may be used. For example, a VRB index i may be mapped to a PRB index f(i) by Equation 4.

While REG-to-PRB mapping is not described in detail in FIG. 43, the REG-to-PRB mapping may be carried out in various manners. For example, REGs may be mapped to a PRB in a frequency-first mapping rule, as illustrated in FIG. 43. However, the mapping pattern may vary according to an actual REG configuration and actual indexing.

As described above, after VRBs are configured, they may be mapped to PRBs. Because the BS indicates the positions of PRBs to an RN or an RN group by RRC signaling, the RN or RN group may decode an R-PDCCH at the indicated PRB positions. It is assumed that the BS performs a plurality of interleaving operations. That is, the BS may divide RNs into a plurality of RN groups and perform interleaving by RN group. An RN within a specific group has only to find out a mapping scheme applied to the specific group or the logical indexes of mapped positions. This information may be indicated by RN-specific or RN group-specific RRC signaling. On the part of the RN, there is only one SS. The RN has only to find out the SS without the need for determining whether the SS is RN-specific or cell-specific. The BS does not need to indicate to the RN whether the SS is RN-specific or cell-specific, either.

Table 8 lists exemplary interleaving depths that are available or defined for given system BWs.

TABLE 8

| System BW [Hz] | 1.4 | 3 | 5 | 10 | 15 | 20 | Index |
|---|---|---|---|---|---|---|---|
| No. of RBs in a given System BW | 6 | 15 | 25 | 50 | 75 | 100 | |
| | ■ | 4 | 4 | 4 | 4 | 4 | 1 |
| | 4 | 8 | 8 | 8 | 8 | 8 | 2 |
| | | 12 | 12 | 12 | 12 | 12 | 3 |
| | | | 16 | 16 | 16 | 16 | 4 |
| | | | | 4+16=20 | 4+16=20 | 4+16=20 | 5 |
| | | | | 8+16=24 | 8+16=24 | 8+16=24 | 6 |
| | | | | 12+16=28 | 12+16=28 | 12+16=28 | 7 |
| | | | | 16*2=32 | 16*2=32 | 16*2=32 | 8 |
| | | | | | 16*3=48 | 16*3=48 | 9 |
| | | | | | | 16*5=80 | 10 |
| No. of different interleavers (A) | 2 | 3 | 4 | 8 | 9 | 10 | |
| No. of special interleaver (B) | | | | | | ■ | |
| No. of basic unit interleavers (C) | | | | | | 4 | |
| No. of cocatenated interleavers (D) | | | | | | 6 | |
| Total (E) | | | | | | 11 | |

Referring to Table 8, No. of different interleavers (A) specifies the number of interleavers having different depths (in terms of size), with equal-sized interleavers for a given system BW excluded. For instance, there are a total of 10 interleavers for a system BW of 20 MHz. In the proposed method of Table 8, if an interleaver size is equal to or larger than 20 RBs, a plurality of interleavers having a smaller size than 20 RBs are used for interleaving. No. of special/extra interleaver (B) means that while an interleaver is configured basically with an interleaver size of 4 RBs or a multiple of 4 RBs, 2 RBs are sufficient for 1.4 MHz and thus a 2-RB interleaver is supported. The value of No. of special/extra interleaver (B) may be used for other system bandwidths to reduce the granularity of an interleaver size and minimize resource waste. No. of basic unit interleavers (C) indicates the number of basic unit interleavers. When one interleaving is performed in a given system BW according to one interleaver size, the interleaving depth is equal to the interleaver size. This interleaver size may be said to be a basic unit of interleaver. No. of concatenated interleavers (D) specifies the sum of the sizes of concatenated basic unit interleavers. When an interleaving depth is increased, it is better to deal with the increased interleaving depth by grouping RNs into a plurality of groups and using a plurality of basic unit interleavers for the groups, rather than to use an interleaver of the increased interleaver size. Total (E) indicates the total number of interleaving depths including single interleaving and concatenated interleaving.

As illustrated in Table 8, a total of 11 interleaving depths/sizes may be used, which are 2, 4, 8, 12, 16, 20, 24, 28, 32, 48 and 80. In the system BW of 1.4 MHz corresponding to 6 RBs, an interleaving unit of 2 or 4 RBs may be preferable. When interleaving is to be performed in a situation where only one or two RNs exist, 2, 3, 4, 5 and 6 RBs are available as an interleaving unit. However, if the interleaving unit is 6 RBs, all RBs should be used for R-PDCCH transmission, which is not preferable. Thus 2 or 4 RBs are appropriate as the interleaving unit. If 1-CCE R-PDCCHs are configured for RNs and the size of an R-CCE equals the size of a VRB, interleaving with an interleaving unit of 2 or 4 RBs may be referred to as 2-RB interleaving or 4-RB interleaving, or 2-RN interleaving or 4-RN interleaving.

If Type 2 DVRB RA is supported, 4-RB interleaving may lead to efficient resource allocation between an RN and a macro UE or between RNs (of different RA types). RA Types 0, 1 and 2 are designed such that they can be multiplexed in the same subframe, and if the size of DVRBs is a multiple of 4 RBs, resources are allocated in PRB pairs despite slot hopping. Therefore, a PRB pair in the same frequency area may be allocated to an RN. In addition, considering only CCE aggregation levels of 1, 2 and 4, the size of DVRBs is preferably a multiple of 4 RBs, instead of a multiple of 3 or 5 RBs. In a special case, a multiple of 2 RBs may be supported.

From the viewpoint of R-PDCCH PRB set signaling, signaling overhead can be reduced significantly by allocating one bit per RBG rather than signaling PRBs of the total band in a bitmap. An SS may be allocated in units of an RBG by setting an RBG size to 3 or 4 RBs. For instance, while a 100-bit bitmap is required for 100 RBs, a 25-bit bitmap suffices in case of RBG-based signaling, if 1 RBG=4 RBs. However, as the BW decreases, the RBG size also decreases. Accordingly, the number of R-PDCCH PRB candidates decreases in proportion to the RBG size. In this case, there is no problem with RBG=3 if 27<RB<63 and with RBG=4 if 64<RB<110. On the other hand, some problem may occur if 11<RB<26 (RBG=2) or RB≤10 (RBG=1). Then, it is preferred to form a bitmap having one bit per 3 RBs if 11<RB<26 and a bitmap having one bit per 2 RBs if RB≤10.

For implementation simplicity, a bitmap is formed preferably on an RBG basis. Obviously, the number of R-PDCCH PRB candidates depends on the number of actually used RBs (a system BW). For example, for 64 RBs, 16 REGs are defined, 16 PRBs are R-PDCCH PRB candidates, and thus a 16-bit bitmap is needed. For 110 RBs, 28 RBGs (27 RBGs=108 RBs and the remaining 2 RBs form 1 RBG) are formed and thus a 28-bit bitmap is required. For example, the bitmap with a fixed size of 28 bits may be transmitted by RRC signaling. In this manner, bitmaps of different sizes may be used even for the same RBG size (e.g. 1 RBG=4 RBs). The required size of a bitmap is given by Ceiling {number of RBs(number of system RBs or available RBs or total RBs)/RBG size}   [Equation 5]

In [Equation 5], Ceiling is a function of rounding up a value within { } to the nearest integer. For example, if 110/4=27.5, 27.5 is rounded up to 28. To simplify the design of RRC bitmap signaling, the number of RRC signaling bits is kept to K (e.g. 28) and if a system BW changes, some bitmap bits are reserved. Or a bitmap is designed based on a maximum system BW for the same RBG size and commonly applied to all BWs using the same RBG size. Table 9 lists RBG sizes and bitmap sizes according to system BWs.

TABLE 9

| RBG size | System bandwidth [RB] | Bitmap size [bit] | Bitmap size [bit] | Bitmap size [bit] | Bitmap size [bit] | Bitmap size [bit] | Bitmap size [bit] | Bitmap size [bit] |
|---|---|---|---|---|---|---|---|---|
| 1 | RB ≤ 10 | 10 | 28 | 10[16] | 10 | 13 | 32 | 16 |
| 2 | 11 ≤ RB ≤ 26 | 13 | 28 | 28[32] | 13 | 13 | 32 | 16 |
| 3 | 27 ≤ RB ≤ 63 | 21 | 28 | 28[32] | 28 | 28 | 32 | 32 |
| 4 | 64 ≤ RB ≤ 110 | 28 | 28 | 28[32] | 28 | 28 | 32 | 32 |

Blind Decoding

Given a system BW of 20 MHz, a BS may perform interleaving with interleaver sizes of 4, 8, 12, 16, 20, 24, 28, 32, 48 and 80. Considering that control information hardly occupies 80 RBs out of 100 RBs in real implementation, the interleaver size of 80 may be neglected.

It is possible to use only unit interleavers except for interleaving depths achieved through concatenated interleavers illustrated in Table 8. Concatenated interleavers are optional.

Figure 44:
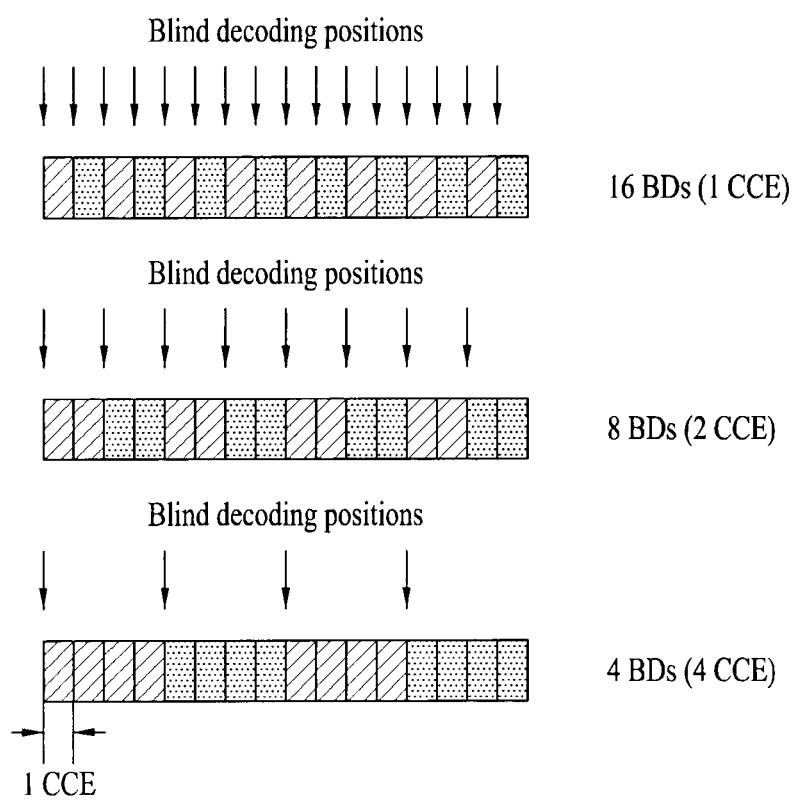
FIG. 44 illustrates an example of blind decoding positions and frequency areas for blind decoding, for interleaving depths of 4, 8, 12 and 16.

FIG. 44 illustrates exemplary positions and frequency areas of blind decoding, for interleaving depths of 4, 8, 12 and 16.

Referring to FIG. 44, only the interleaving depths of 4, 8, 12 and 16 may be used for the given system BW of 20 MHz. When needed, an interleaving depth of 2 may be added. In this case, when only CCE aggregation levels of 1, and 4 are supported, an RN may perform four blind decodings (at 4 positions) for the CCE aggregation level of 4, 8 blind decodings (at 8 positions) for the CCE aggregation level of 2, and 16 blind decodings (at 16 positions) for the CCE aggregation level of 1. Therefore, the total number of blind decodings is 28 (=4+8+16). If two types of DCI formats are supported, the number of blind decodings that the RN should perform is doubled to 56. This value is approximate to the number of blind decodings performed at a UE conforming the 3GPP Release-10 communication standard and thus may be considered reasonable.

Figure 45:
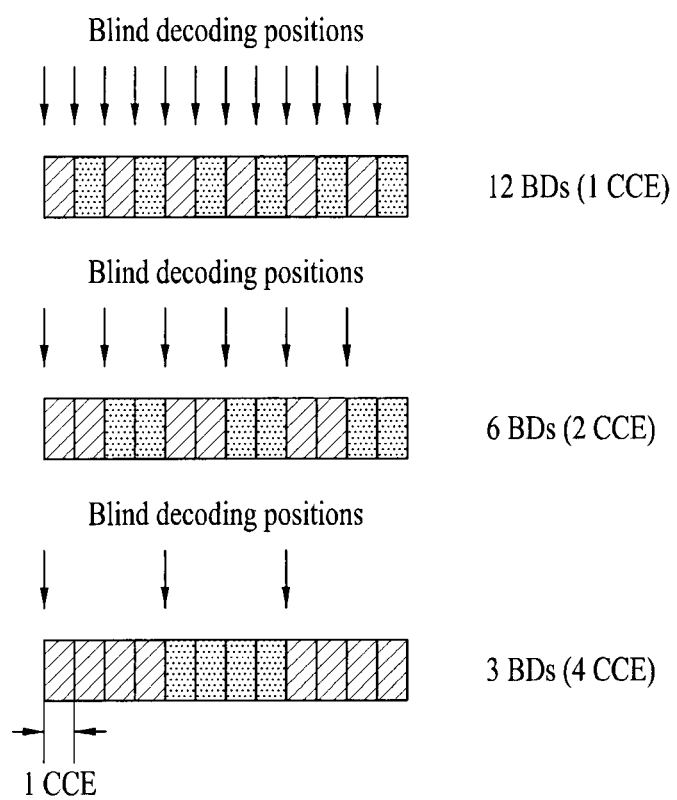
FIGS. 45 and 46 illustrate other examples of blind decoding positions and frequency areas for blind decoding, for interleaving depths of 4, 8, 12 and 16.

FIG. 45 illustrates another example of positions and frequency areas of blind decoding, for interleaving depths of 4, 8, 12 and 16.

The design of FIG. 45 may be preferable in terms of the blind decoding complexity of the 3GPP Release-8 communication standard. An RN may perform 3 blind decodings (at 3 positions) for the CCE aggregation level of 4, 6 blind decodings (at 6 positions) for the CCE aggregation level of 2, and 12 blind decodings (at 12 positions) for the CCE aggregation level of 1. If another DCI format is supported, the total number of blind decodings is 42, approximate to 44 blind decodings performed at a Release-8 UE.

Figure 46:
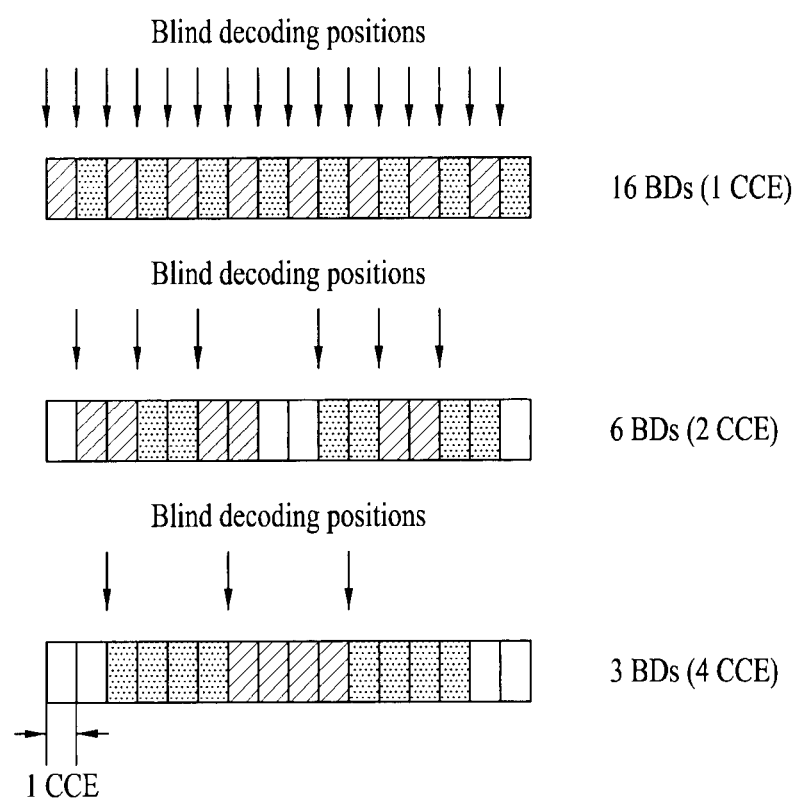

FIG. 46 illustrates a further example of positions and frequency areas of blind decoding, for interleaving depths of 4, 8, 12 and 16.

16 blind decodings may be maintained for the CCE aggregation level of 1 as in the illustrated case of FIG. 44, while the number of blind decodings may be reduced for the CCE aggregation level of 2 or 4. Referring to FIG. 46, for example, an RN may perform 6 blind decodings (at 6 positions) for the CCE aggregation level of 2 and 3 blind decodings (at 3 positions) for the CCE aggregation level of 4. Therefore, the total number of blind decodings is 25 (=16+6+3).

In addition, as different aggregation starting positions and different blind decoding position are set for different aggregation levels, overlapping between the SSs of RNs or error decoding at an unintended CCE aggregation level in the same RN can be reduced. In FIG. 46, position overlapping is avoided by setting an offset at least between the CCE aggregation levels of 2 and 4.

The configuration of FIG. 46 is characterized in that SSs may reside at different positions (that is, blind decoding may start at different points) for different aggregation levels. In addition, after an SS is configured for an RN or a UE, the SS may be changed in a specific or arbitrary pattern. In other words, a plurality of SS sets (e.g. VRB sets) are set and an SS may be modified within the SS sets. Especially, this modification or modified pattern is made based on an RN ID or a UE ID. Thus the RN or the UE may determine the modification or modified pattern using the RN ID or the UE ID.

The above-described methods do not consider uplink grant blind decoding. As a DL grant is logically or physically linked to a UL grant, successful blind decoding of the DL grant enables decoding of the UL grant implicitly tied to the DL grant, thereby reducing the number of blind decodings. That's why all blind decoding complexity has been considered regarding the DL grant blind decoding. Otherwise, the blind decoding complexity may be doubled.

Table 10 to Table 22 illustrate modifications of the interleaver set proposed in Table 8. They are mostly designed such that [the number of interleaving depths×the number of system BWs] is approximate to 18.

TABLE 10

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 4 | 4 | 4 | 4 | 4 | |
| | | 8 | 8 | 8 | 8 | 8 | |
| | | | 12 | 12 | 12 | 12 | |
| | | | 16 | 16 | 16 | 16 | |
| No. of different interleavers | 2 | 4 | 5 | 5 | 5 | 5 | 26 |

<Proposed Interleaver Set #2>
Referring to Table 10, 2, 4, 8, 12 and 16 are used as interleaving depths/sizes for each given system BW.

TABLE 11

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | 2 | 2 | 2 | |
| | 4 | 4 | 4 | 4 | 4 | 4 | |
| | | | 8 | 8 | 8 | 8 | |
| | | | 12 | 12 | 12 | 12 | |
| No. of Interleaver | 2 | 4 | 4 | 4 | 4 | 4 | 22 |

<Proposed Interleaver Set #3>
Referring to Table 11, 2, 4, 8, and 12 are used as interleaving depths/sizes for each given system BW.

TABLE 12

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | 2 | 2 | 2 | 2 | 2 | 2 | |
| | | 4 | 4 | 4 | 4 | 4 | |
| | | 8 | 8 | 8 | 8 | 8 | |
| | | | 12 | 12 | 12 | 12 | |
| No. of Interleaver | 1 | 3 | 4 | 4 | 4 | 4 | 20 |

<Proposed Interleaver Set #4>
Like Table 11, 2, 4, 8, and 12 are used as interleaving depths/sizes for each given system BW in Table 12.

TABLE 13

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | 2 | 2 | 2 | |
| | | | 4 | 4 | 4 | 4 | |
| | | | 8 | 8 | 8 | 8 | |
| | | | | 12 | 12 | 12 | |
| No. of Interleaver | 1 | 3 | 3 | 4 | 4 | 4 | 19 |

<Proposed Interleaver Set #5>
2, 4, 8, and 12 are also used as interleaving depths/sizes for each given system BW in Table 13.

TABLE 14

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | 2 | 2 | 2 | |
| | | | 4 | 4 | 4 | 4 | |
| | | | 8 | 8 | 8 | 8 | |
| | | | | 12 | 12 | 12 | |
| No. of Interleaver | 1 | 2 | 3 | 4 | 4 | 4 | 18 |

<Proposed Interleaver Set #6>
2, 4, 8, and 12 are also used as interleaving depths/sizes for each given system BW in Table 14.

TABLE 15

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | 2 | 2 | | |
| | | | 4 | 4 | 4 | 4 | |
| | | | 8 | 8 | 8 | 8 | |
| | | | | 12 | 12 | 12 | |
| | | | | | | 16 | |
| No. of Interleaver | 1 | 2 | 3 | 4 | 4 | 4 | 18 |

<Proposed Interleaver Set #7>
2, 4, 8, 12 and 16 are used as interleaving depths/sizes for each given system BW in Table 15.

TABLE 16

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | 2 | 2 | 2 | 2 | | | |
| | | 4 | 4 | 4 | 4 | 4 | |
| | | | 8 | 8 | 8 | 8 | |
| | | | | 12 | 12 | 12 | |
| | | | | | 16 | 16 | |
| No. of Interleaver | 1 | 2 | 3 | 4 | 4 | 4 | 18 |

<Proposed Interleaver Set #8>
2, 4, 8, 12 and 16 are used as interleaving depths/sizes for each given system BW in Table 16.

TABLE 17

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | 2 | 2 | | | | | |
| | | 4 | 4 | 4 | 4 | 4 | |
| | | | 8 | 8 | 8 | 8 | |
| | | | | 12 | 12 | 12 | |
| | | | | | | 16 | |
| No. of Interleaver | 1 | 2 | 2 | 3 | 3 | 4 | 15 |

<Proposed Interleaver Set #9>

TABLE 18

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | 2 | 2 | | | | | |
| | | 4 | 4 | 4 | 4 | 4 | |
| | | | 8 | 8 | 8 | 8 | |
| | | | | | | 16 | |
| No. of Interleaver | 1 | 2 | 2 | 2 | 2 | 3 | 12 |

<Proposed Interleaver Set #10>

TABLE 19

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | | | | |
| | | | 4 | 4 | 4 | 4 | 4 |
| | | | | 8 | 8 | 8 | 8 |
| No. of Interleaver | 1 | 2 | 2 | 2 | 2 | 2 | 11 |

<Proposed Interleaver Set #11>

TABLE 20

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | 2 | | | | |
| | | | 4 | 4 | 4 | 4 | 4 |
| | | | | 16 | 16 | 16 | 16 |
| No. of Interleaver | 1 | 2 | 2 | 2 | 2 | 2 | 11 |

<Proposed Interleaver Set #12>

TABLE 21

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | | 2 | | | | | |
| | | 4 | 4 | 4 | 4 | 4 | 4 |
| | | | | 8 | 12 | 16 | |
| No. of Interleaver | 2 | 1 | 1 | 2 | 2 | 2 | 10 |

<Proposed Interleaver Set #13>

TABLE 22

| System BW [Hz] | 1.4 | 3 | 5 | 10 | 15 | 20 | |
|---|---|---|---|---|---|---|---|
| No. of RBs in a given System BW | 6 | 15 | 25 | 50 | 75 | 100 | |
| | 2 | | | | | | |
| | 4 | 4 | 4 | 4 | 4 | 4 | |
| No. of Interleaver | 2 | 1 | 1 | 1 | 1 | 1 | 7 |

<Proposed Interleaver Set #14>

The above interleaver sets are applicable to UL grant blind decoding as well as DL grant blind decoding. If an uplink R-PDCCH SS is determined relying on DL grant blind decoding without UL grant blind decoding, the proposed interleaver sets are DL grant-dedicated. However, the proposed interleaver sets may also be used as UL grant-dedicated.

The above proposed interleaver sets are characterized in that an interleaver size of 2 is preferred to an interleaver size of 4 at a 1.4-MHz system BW. Accordingly, RBs only, both 2 RBs and 4 RBs, or 4 RBs only for consistency with other bands may be used as an interleaver size. As a 3-MHz system BW includes a total of 15 RBs, an interleaver size may be set to a multiple of 2 or 4 RBs. In terms of consistency, only a multiple of 4 RBs may be preferable. Especially, up to 8 or 12 RBs can be supported.

An interleaver may be designed to have an interleaver size of a multiple of 5 RBs, taking into account that the number of RBs is a multiple of 5 RBs (an odd number) in system BWs of 3, 5, 10, 15 and 20 MHz. However, since 4 RBs is advantageous in many aspects as stated before, a multiple of 4 RBs is preferable as an interleaver size. Since R-PDCCH PRBs occupy only a part of total RBs, such an option as interleaving across the total band RBs may not be employed. Due to the existence of 25 or more RBs in the system BW of 5 MHz or above, up to 8, 12 or 16 RBs as well as 4 RBs needs to be supported. Yet, a sufficient diversity gain can be achieved from 4-RB interleaving and thus interleaving on the basis of more than 4 RBs is not preferred.

It may further be contemplated that an R-PDCCH is interleaved using an interleaving depth determined according to a given system BW and mapped to PRBs. For example, if an R-PDCCH is interleaved in units of 4 RBs in a system having a 100-MHz system BW corresponding to 50 RBs, the interleaved R-PDCCH is mapped to 4 PRBs, one PRB per RBG. For the mapping, rate matching or even distribution may be used. Or bit reversal is also available. Through bit reversal, the interleaved four RBs may be mapped uniformly across the 50 RBs.

To simplify a CCE-level SS search, interleaving, and VRB-to-PRB mapping, a CCE size preferably equals to a PRB size and in addition, to a VRB size.

[MODE FOR INVENTION]

Various embodiments have been described in the best mode for carrying out the invention.

INDUSTRIAL APPLICABILITY

The method and apparatus for transmitting and receiving an R-PDCCH being a control channel for an RN according to the present invention are applicable to various wireless communication systems including a 3GPP LTE system, an LTE-A system, etc.

The embodiments of the present invention described hereinbelow are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present invention or included as a new claim by a subsequent amendment after the application is filed.

In the embodiments of the present invention, a description is made, centering on a data transmission and reception relationship among a BS, a relay, and a UE. In some cases, a specific operation described as performed by the BS may be performed by an upper node of the BS. Namely, it is apparent that, in a network comprised of a plurality of network nodes including a BS, various operations performed for communication with an MS may be performed by the BS, or network nodes other than the BS. The term 'BS' may be replaced with the term 'fixed station', 'Node B', 'enhanced Node B (eNode B or eNB)', 'access point', etc. The term 'UE' may be replaced with the term 'Mobile Station (MS)', 'Mobile Subscriber Station (MSS)', 'mobile terminal', etc.

The embodiments of the present invention may be achieved by various means, for example, hardware, firmware, software, or a combination thereof. In a hardware configuration, the methods according to the embodiments of the present invention may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the embodiments of the present invention may be implemented in the form of a module, a procedure, a function, etc. For example, software code may be stored in a memory unit and executed by a processor. The memory unit is located at the interior or exterior of the processor and may transmit and receive data to and from the processor via various known means.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

The invention claimed is:

1. A method for transmitting a Relay Physical Downlink Control Channel (R-PDCCH) by a base station (BS) in a wireless communication system, the method comprising:
transmitting resource region information indicating virtual resource blocks (VRBs) available for an R-PDCCH transmission to a relay node (RN) by a radio resource control (RRC) signal;
mapping the VRBs to physical resource blocks (PRBs) in a resource region using a localized VRB (LVRB) mapping method or distributed VRB (DVRB) mapping method; and
transmitting R-PDCCHs to the RN on at least one PRB of the PRBs,
wherein a first R-PDCCH including a downlink (DL) grant is transmitted to the RN on a first slot of a subframe;
wherein a second R-PDCCH including an uplink (UL) grant is transmitted to the RN on a second slot of the subframe, and
wherein when the first R-PDCCH including the downlink (DL) grant is transmitted to the RN on the first slot of a PRB pair in the subframe, a physical downlink shared channel (PDSCH) for the RN is transmitted to the RN the second slot of the PRB pair in the subframe.

2. The method according to claim 1, wherein the VRBs are mapped to the PRBs so that a VRB index is one-to-one mapped to a PRB index using the localized VRB (LVRB) mapping method or distributed VRB (DVRB) mapping method.

3. The method according to claim 1, wherein the R-PDCCH transmission is configured as a VRB unit.

4. The method according to claim 3, wherein the size of the VRB is 8 or 9 Resource Element Groups (REGs).

5. The method according to claim 2, wherein the VRBs are mapped to the PRBs by a frequency-first mapping manner or a time-first mapping manner.

6. The method according to claim 1, further comprising:
transmitting information indicating whether an interleaving mode is applied to the R-PDCCHs, to the RN through the RRC signal.

7. A Base Station (BS) for transmitting a Relay Physical Downlink Control Channel (R-PDCCH) in a wireless communication system, the BS comprising:
a transmitter; and
a processor configured to cause:
the transmitter to transmit resource region information indicating virtual resource blocks (VRBs) available for an R-PDCCH transmission to a relay node (RN) by a radio resource control (RRC) signal; and
wherein the processor is configured to map the VRBs to physical resource blocks (PRBs) in a resource region using a localized VRB (LVRB) mapping method or distributed VRB (DVRB) mapping method,
wherein the processor is further configured to cause:
the transmitter to transmit R-PDCCHs to the RN on at least one PRB of the PRBs,
the transmitter to transmit a first R-PDCCH including a downlink (DL) grant to the RN on a first slot of a subframe, and
the transmitter to transmit a second R-PDCCH including an uplink (UL) grant to the RN on a second slot of the subframe,
when the transmitter to transmit the first R-PDCCH including the downlink (DL) grant to the RN on the first slot of a PRB pair in the subframe, the transmitter to transmit a physical downlink shared channel (PDSCH) for the RN to the RN on the second slot of the PRB pair in the subframe.

8. The BS according to claim 7, wherein the processor is further configured to map VRBs are mapped to the PRBs so that a VRB index is one-to-one mapped to a PRB index using the localized VRB (LVRB) mapping method or distributed VRB (DVRB) mapping method.

9. The BS according to claim 8, wherein the processor is further configured to map the VRBs to the PRBs by a frequency-first mapping manner or a time-first mapping manner.

10. A method for receiving a Relay Physical Downlink Control Channel (R-PDCCH) at a relay node (RN) in a wireless communication system, the method comprising:
receiving resource region information indicating virtual resource blocks (VRBs) available for a R-PDCCH transmission from a base station (BS) by a radio resource control (RRC) signal;
monitoring the VRBs based on the resource region information; and
receiving R-PDCCHs from the BS on at least one PRB of PRBs, the VRBs are mapped to the PRBs in a resource region using a localized VRB (LVRB) mapping method or distributed VRB (DVRB) mapping method,
wherein a first R-PDCCH including a downlink (DL) grant is received from the BS on a first slot of a subframe; and
wherein a second R-PDCCH including an uplink (UL) grant is received from the BS on a second slot of the subframe, and
wherein when the first R-PDCCH including the downlink (DL) grant is received from the BS on the first slot of a PRB pair in the subframe, a physical downlink shared channel (PDSCH) for the RN is received from the BS on the second slot of the PRB pair in the subframe.

11. The method according to claim 10, wherein the VRBs are mapped to the PRBs so that a VRB index is one-to-one mapped to a PRB index using the localized VRB (LVRB) mapping method or distributed VRB (DVRB) mapping method.

12. The method according to claim 11, wherein the VRBs are mapped to PRBs by a frequency-first mapping manner or a time-first mapping manner in a PRB.

13. A relay node (RN) for receiving a Relay Physical Downlink Control Channel (R-PDCCH) in a wireless communication system, the RN comprising:
a receiver; and
a processor, wherein the processor is configured to cause:
the receiver to receive resource region information indicating virtual resource blocks (VRBs) available for a R-PDCCH transmission from a base station (BS) by a radio resource control (RRC) signal;
wherein the processor is configured to monitor the VRBs based on the resource region information;
wherein the processor is further configured to cause:
the receiver to receive R-PDCCHs from the BS on at least one PRB of PRBs, the VRBs are mapped to the PRBs in a resource region using a localized VRB (LVRB) mapping method or distributed VRB (DVRB) mapping method, the receiver to receive a first R-PDCCH including a downlink (DL) grant from the BS on a first slot of a subframe, and the receiver to receive a second R-PDCCH including an uplink (UL) grant from the BS on a second slot of the subframe, and when the receiver receives the first R-PDCCH including the downlink (DL) grant from the BS on the first slot of a PRB pair in the subframe, the receiver receives a physical downlink shared channel (PDSCH) for the RN from the BS on the second slot of the PRB pair in the subframe.

14. The method according to claim 10, further comprising:
receiving information indicating whether an interleaving mode is applied to the R-PDCCHs, from the BS through the RRC signal.

* * * * *